United States Patent
Wan et al.

(10) Patent No.: US 11,749,738 B2
(45) Date of Patent: Sep. 5, 2023

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Hsien-Wen Wan, Kaohsiung (TW); Yi-Ting Cheng, Kaohsiung (TW); Ming-Hwei Hong, Hsinchu County (TW); Juei-Nai Kwo, Hsinchu (TW); Bo-Yu Yang, New Taipei (TW); Yu-Jie Hong, New Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 10 days.

(21) Appl. No.: 17/666,347

(22) Filed: Feb. 7, 2022

(65) Prior Publication Data
US 2022/0157965 A1 May 19, 2022

Related U.S. Application Data

(63) Continuation of application No. 16/945,199, filed on Jul. 31, 2020, now Pat. No. 11,245,023.

(51) Int. Cl.
*H01L 29/51* (2006.01)
*H01L 29/786* (2006.01)
(Continued)

(52) U.S. Cl.
CPC ...... *H01L 29/513* (2013.01); *H01L 21/02532* (2013.01); *H01L 21/02603* (2013.01);
(Continued)

(58) Field of Classification Search
CPC . H01L 29/0673; H01L 29/0847; H01L 29/16; H01L 29/42392; H01L 29/4908;
(Continued)

(56) References Cited

U.S. PATENT DOCUMENTS 9,093,530 B2   7/2015  Huang et al.
9,171,929 B2  10/2015  Lee et al.
(Continued)

OTHER PUBLICATIONS

Mengnan Ke et al., "Understanding of Slow Traps Generation in Plasma Oxidation GeOx/Ge MOS Interfaces with ALD High-k Layers." IEEE, p. 296-299, 2017.
(Continued)

*Primary Examiner* — Tong-Ho Kim
(74) *Attorney, Agent, or Firm* — Maschoff Brennan

(57) ABSTRACT

A semiconductor device includes a substrate, a semiconductor fin, a silicon layer, a gate structure, gate spacers, and source/drain structures. The semiconductor fin is over the substrate. The silicon layer is over the semiconductor fin. The gate structure is over the silicon layer, in which the gate structure includes an interfacial layer over the silicon layer, a gate dielectric layer over the interfacial layer, and a gate electrode over the gate dielectric layer. The gate spacers are on opposite sidewalls of the gate structure and in contact with the interfacial layer of the gate structure, in which a bottom surface of the interfacial layer is higher than bottom surfaces of the gate spacers. The source/drain structures are on opposite sides of the gate structure.

20 Claims, 64 Drawing Sheets

(51) Int. Cl.
*H01L 21/02* (2006.01)
*H01L 21/28* (2006.01)
*H01L 29/06* (2006.01)
*H01L 29/08* (2006.01)
*H01L 29/16* (2006.01)
*H01L 29/423* (2006.01)
*H01L 29/49* (2006.01)
*H01L 29/66* (2006.01)
*H01L 29/78* (2006.01)

(52) U.S. Cl.
CPC .... *H01L 21/28255* (2013.01); *H01L 29/0673* (2013.01); *H01L 29/0847* (2013.01); *H01L 29/16* (2013.01); *H01L 29/42392* (2013.01); *H01L 29/4908* (2013.01); *H01L 29/66545* (2013.01); *H01L 29/66742* (2013.01); *H01L 29/66795* (2013.01); *H01L 29/7851* (2013.01); *H01L 29/78618* (2013.01); *H01L 29/78684* (2013.01); *H01L 29/78696* (2013.01)

(58) Field of Classification Search
CPC ......... H01L 29/66545; H01L 29/66742; H01L 29/66795; H01L 29/7851; H01L 29/78618; H01L 29/78684; H01L 29/78696; H01L 21/02532; H01L 21/02603; H01L 21/28255
USPC ........................................................ 257/154
See application file for complete search history.

(56) References Cited

U.S. PATENT DOCUMENTS

| | | | |
|---|---|---|---|
| 9,209,247 | B2 | 12/2015 | Colinge et al. |
| 9,214,555 | B2 | 12/2015 | Oxland et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 11,245,023 | B1* | 2/2022 | Wan .................. H01L 29/42392 |
| 2013/0119473 | A1 | 5/2013 | Kwon |
| 2016/0359043 | A1* | 12/2016 | Chen ................. H01L 29/66795 |
| 2016/0380056 | A1 | 12/2016 | Yeo |
| 2019/0035923 | A1* | 1/2019 | Sadana ............. H01L 29/78696 |

OTHER PUBLICATIONS

H.Arimura et al., "Performance and Electrostatic Improvement by High-Pressure Anneal on Si-Passivated Strained Ge pFinFET and Gate All around Devices with Superior NBTI reliability." 2017 Symposium on VLSI Technology Digest of Technical Papers, p. T196-T197. Apr. 24, 2017.

H.Arimura et al., "Si-Passivated Ge nMOS Gate Stack with Low DIT and Dipole-Induced Superior PBTI Reliability Using 3D-Compatible ALD Caps and High-Pressure Anneal." 2016 IEEE International Electron Devices Meeting (IEDM), p. 33.4.1~p. 33.4.4. Dec. 3, 2016.

\* cited by examiner

SEMICONDUCTOR DEVICE AND MANUFACTURING METHOD THEREOF

PRIORITY CLAIM AND CROSS-REFERENCE

This application is a Continuation Application of U.S. application Ser. No. 16/945,199, filed on Jul. 31, 2020, now U.S. Pat. No. 11,245,023, issued on Feb. 8, 2022, which is herein incorporated by reference.

BACKGROUND

The speed of metal-oxide-semiconductor (MOS) transistors are closely related to the drive currents of the MOS transistors, which are further closely related to the mobility of charges in the channels of the MOS transistors. For example, NMOS transistors have high drive currents when the electron mobility in their channel regions is high, while PMOS transistors have high drive currents when the hole mobility in their channel regions is high. Germanium, silicon germanium, and compound semiconductor materials (referred to as III-V compound semiconductors hereinafter) comprising group III and group V elements are thus good candidates for forming their high electron mobility and/or hole mobility.

Germanium, silicon germanium, germanium tin and III-V compound semiconductor regions are also promising materials for forming the channel regions of Fin Field-Effect transistors (FinFETs). Methods and structures for further improving the drive currents on the FinFETs are currently being studied.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
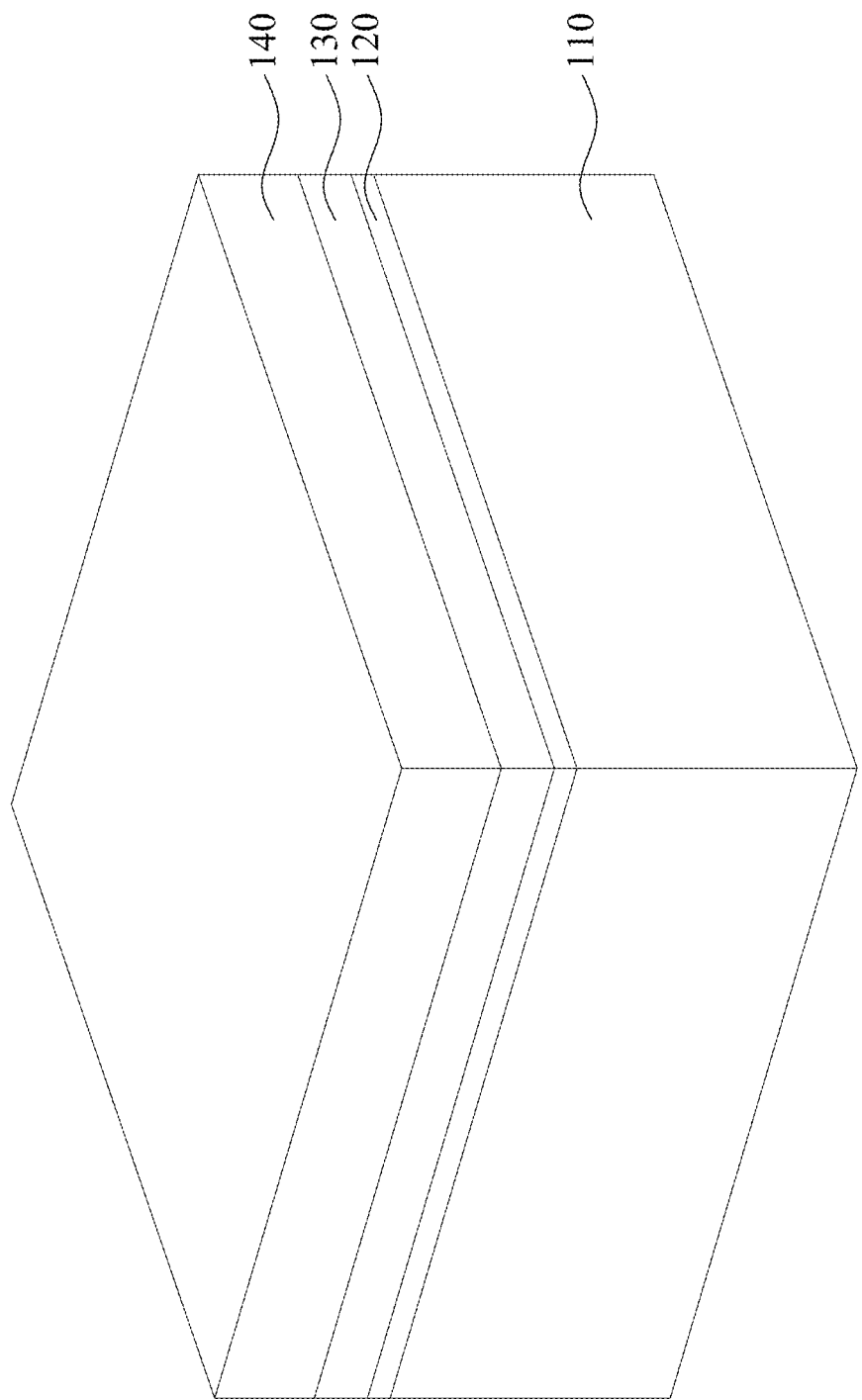
FIGS. 1-12C illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the present disclosure relate to semiconductor devices including a semiconductive protection layer between a semiconductive channel region and an interfacial layer of the semiconductor devices to improve the interfacial problem between the semiconductive channel region and the interfacial layer. Although some implementations are illustrated below with regards to FinFETs, it will be appreciated that this concept is not limited to FinFETs, but is also applicable to other types of devices such as MOSFETs, HGAA devices, and the like.

FIGS. 1-12C illustrate a method for manufacturing a semiconductor device at various stages in accordance with some embodiments of the present disclosure. In some embodiments, the semiconductor device shown in FIGS. 1-12C may be intermediate devices fabricated during processing of an integrated circuit (IC), or a portion thereof, that may include static random access memory (SRAM), logic circuits, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110 is provided. In some embodiments, the substrate 110 includes germanium (Ge), silicon germanium ($Si_{1-x}Ge_x$, where $0<x\leq1$), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials. In various embodiments, the substrate 110 may be a high-voltage-annealed Ge(001) substrate.

Next, a pad layer 120 is formed on the substrate 110. The pad layer 120 can prevent the substrate 110 from being damaged by subsequent etching process. The pad layer 120 can be formed by a deposition process, such as chemical vapor deposition (CVD) and/or atomic layer deposition (ALD). Variations of CVD processes include, but are not limited to, atmospheric pressure CVD (APCVD), low pressure CVD (LPCVD), plasma enhanced CVD (PECVD), metal-organic CVD (MOCVD) and combinations thereof, and such variations may also be employed. Alternatively, the pad layer 120 may be formed using a growth process, such as thermal oxidation or thermal nitridation. In some embodiments, the pad layer 120 is made of oxide, such as $SiO_2$, that is formed by CVD.

A mask layer 130 is then formed on the pad layer 120 to be used as an etching mask. In some embodiments, the mask layer 130 is made of SiN. However, other materials, such as SiON, silicon carbide, or combinations thereof, may also be used. The mask layer 130 may be formed by a process such as CVD, plasma enhanced chemical vapor deposition (PECVD), or LPCVD. Alternatively, the mask layer 130 may be first made of a silicon oxide and then converted to SiN by nitridation.

A dummy mask layer 140 is then formed on the mask layer 130. The dummy mask layer 140 may include, but are not limited to, amorphous carbon, fluorinated amorphous carbon, or the like. The dummy mask layer 140 may be formed by a process such as CVD, plasma enhanced chemical vapor deposition (PECVD), LPCVD, or physical vapor deposition (PVD).

Figure 2:
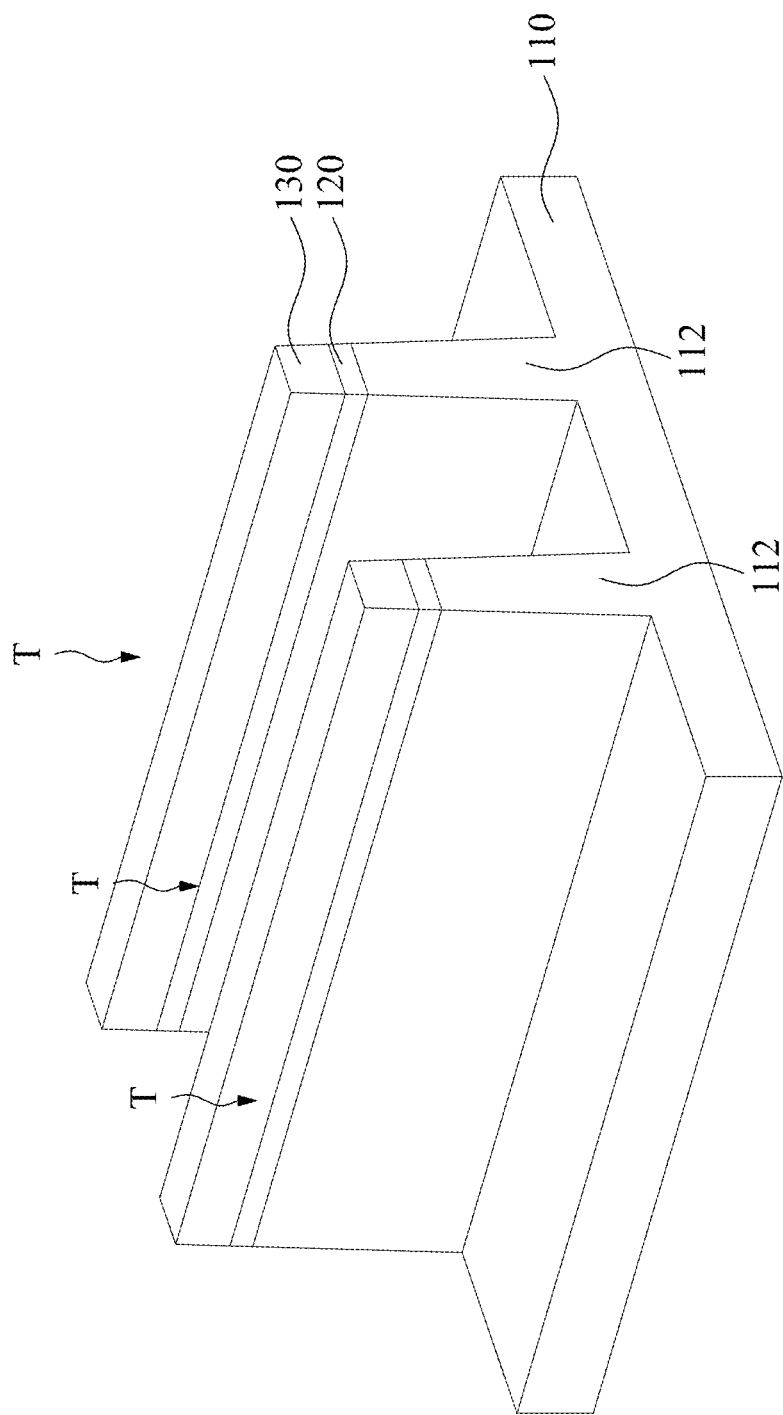

Reference is made to FIG. 2. A plurality of trenches T are formed in the substrate 110 by patterning the dummy mask layer 140 (see FIG. 1), the mask layer 130, the pad layer 120, and the substrate 110 using the dummy mask layer 140 as a mask. Adjacent two of the trenches T define a semiconductor fin 112 therebetween. The trenches T may be formed by using etching process, such as reactive ion etching (RIE). It is noted that although there are two semiconductor fins 112 in FIG. 2, the claimed scope of the present disclosure is not limited in this respect. In some other embodiments, a person having ordinary skill in the art can manufacture suitable number of the semiconductor fins 112 of the semiconductor device according to actual situations. After the formation of the trenches T and the semiconductor fins 112, the dummy mask layer 140 is removed.

Figure 3:
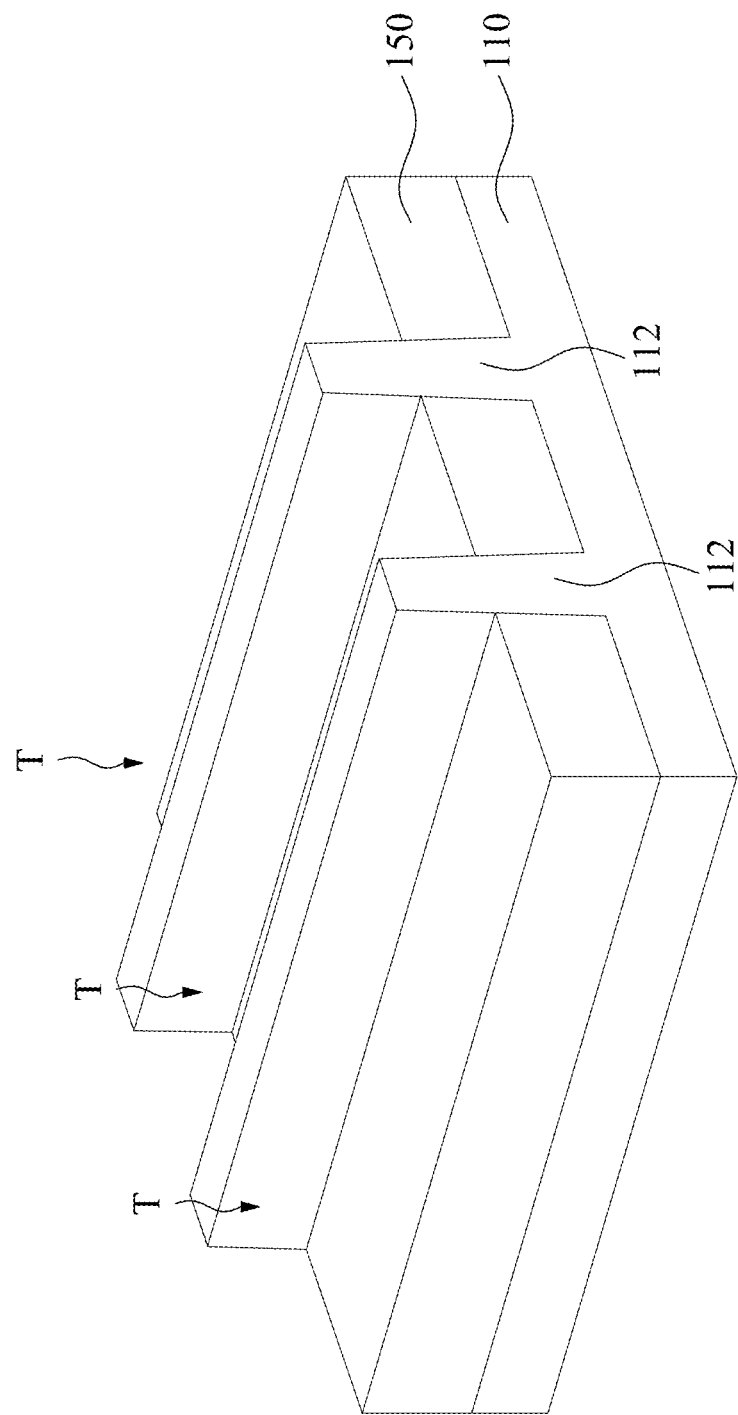

Reference is made to FIG. 3. Isolation structures 150, which may be shallow trench isolation (STI) regions, are formed in the trenches T. The formation may include filling the trenches T with a dielectric layer(s), for example, using flowable chemical vapor deposition (FCVD), and performing a chemical mechanical polish (CMP) to level the top surface of the dielectric material with the top surface of the pad layer 120 (see FIG. 2). The isolation structures 150 are then recessed, and the pad layer 120 is removed as well. The isolation structures 150 may be a dielectric material, such as silicon oxide, silicon nitride, silicon oxynitride, SiCN, $SiC_xO_yN_z$, or combinations thereof.

Figure 4:
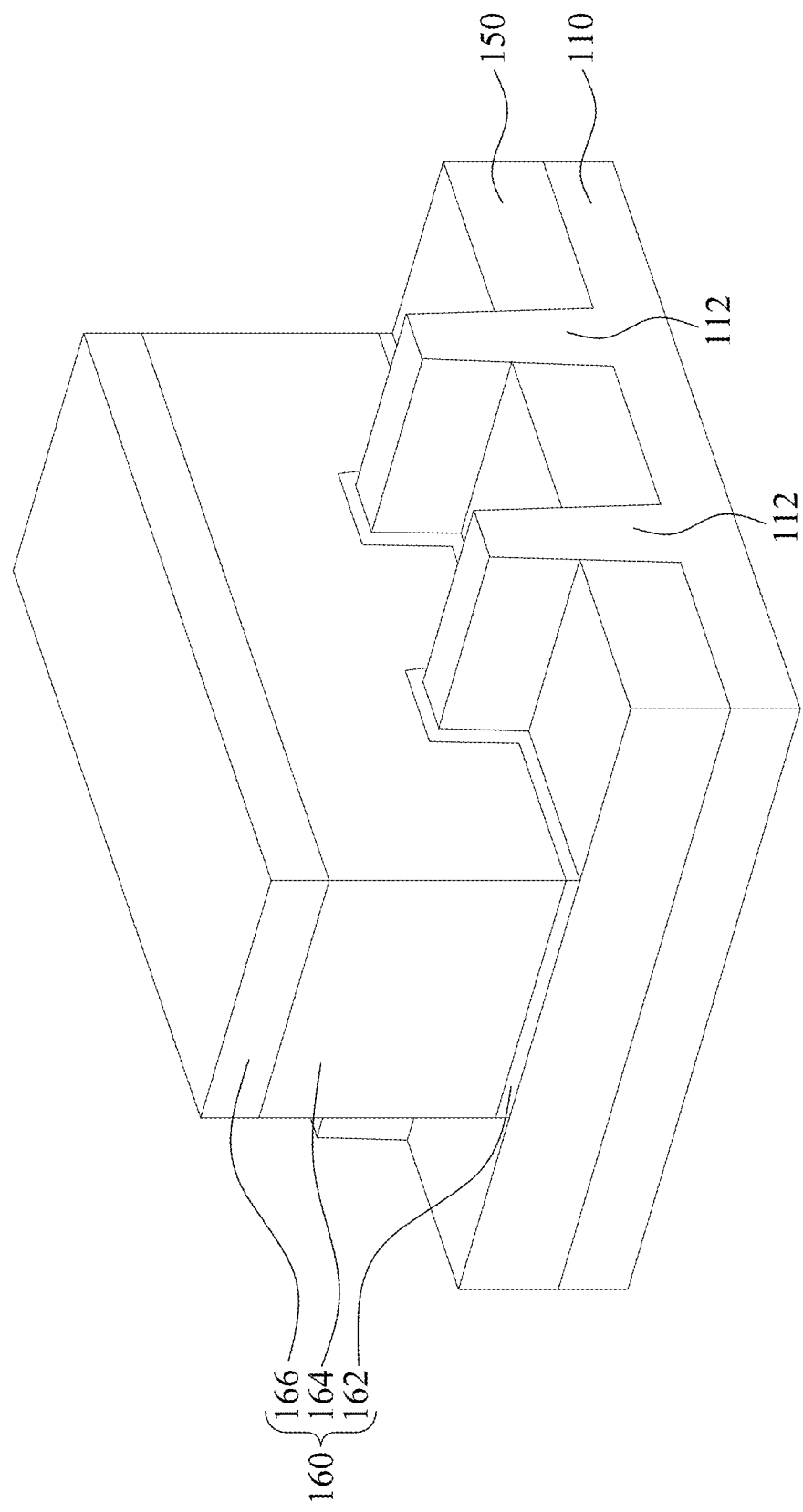

Reference is made to FIG. 4. At least one dummy gate structure 160 is formed above the semiconductor fins 112 and the isolation structures 150. The dummy gate structure 160 includes a dummy gate dielectric layer 162, a dummy gate layer 164, and a mask layer 166 formed over the dummy gate layer 164. Formation of the dummy gate structure 160 includes depositing in sequence a dielectric layer, a dummy gate layer, and a mask layer over the substrate 110, patterning the mask layer into the patterned mask layer 166 using suitable photolithography and etching techniques, followed by patterning the dummy gate layer using the mask layer 166 as masks to form the patterned dummy gate layer 164. Subsequently, the dielectric layer is patterned to form the dummy gate dielectric layer 162. As such, the dummy gate dielectric layer 162, the dummy gate layer 164, and the mask layer 166 are referred to as the dummy gate structure 160. In some embodiments, the dummy gate dielectric layer 162 may be made of silicon dioxide, silicon nitride, a high-κ dielectric material or other suitable material. The dummy gate layer 164 may be made of polycrystalline-silicon (poly-Si), poly-crystalline silicon-germanium (poly-SiGe), or other suitable materials. The mask layer 166 may be made of silicon dioxide or other suitable materials.

Figure 5:
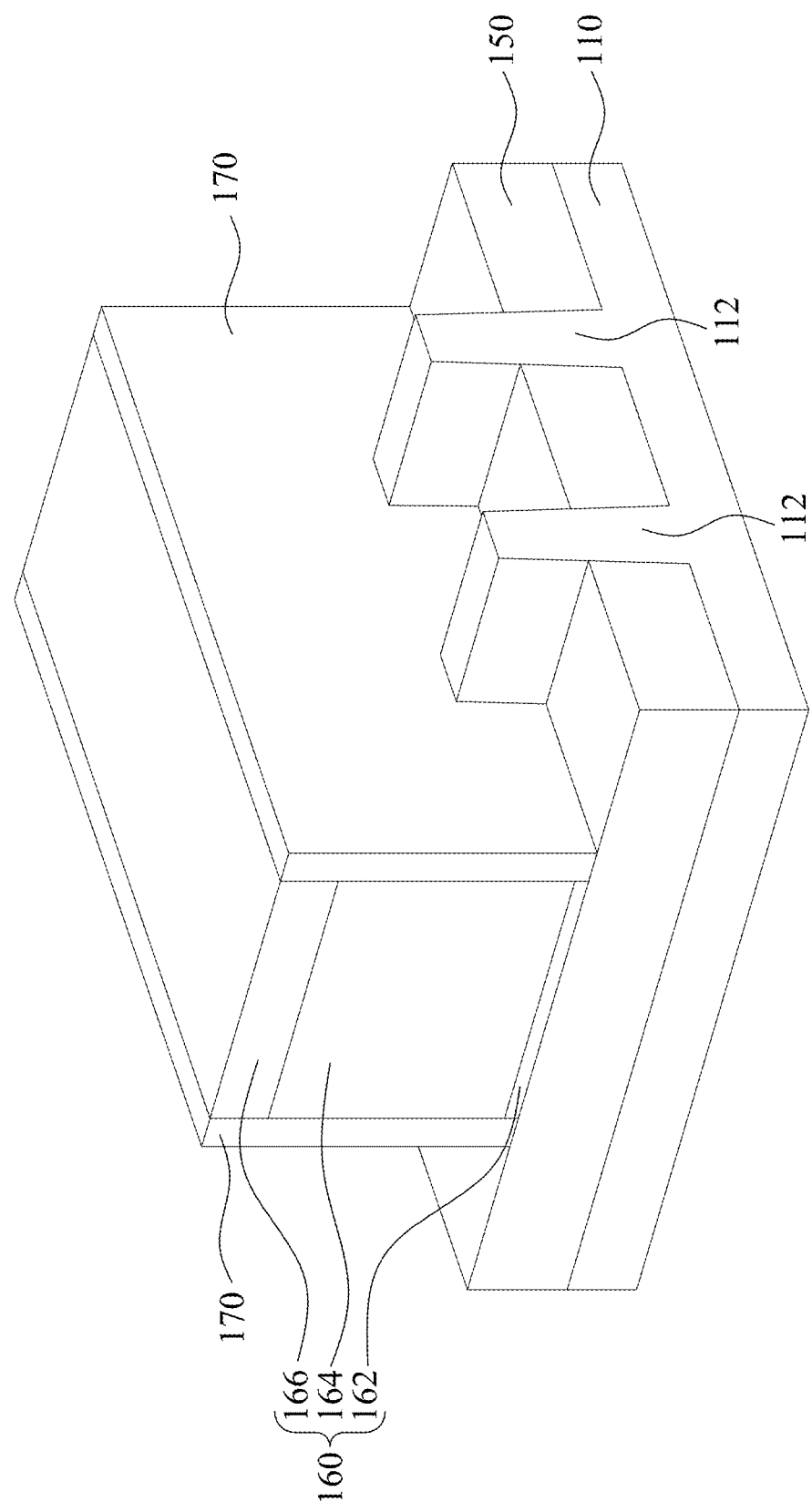

Reference is made to FIG. 5. Gate spacers 170 are respectively formed on sidewalls of the dummy gate structure 160. The gate spacers 170 may include a seal spacer and a main spacer (not shown). The gate spacers 170 include one or more dielectric materials, such as silicon oxide, silicon nitride, silicon oxynitride, SiCN, $SiC_xO_yN_z$, or combinations thereof. The seal spacers are formed on sidewalls of the dummy gate structure 160 and the main spacers are formed on the seal spacers. The gate spacers 170 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 170 may include blanket forming spacer layers, and then performing etching operations to remove the horizontal portions of the spacer layers. The remaining vertical portions of the gate spacer layers form the gate spacers 170.

Figure 6:
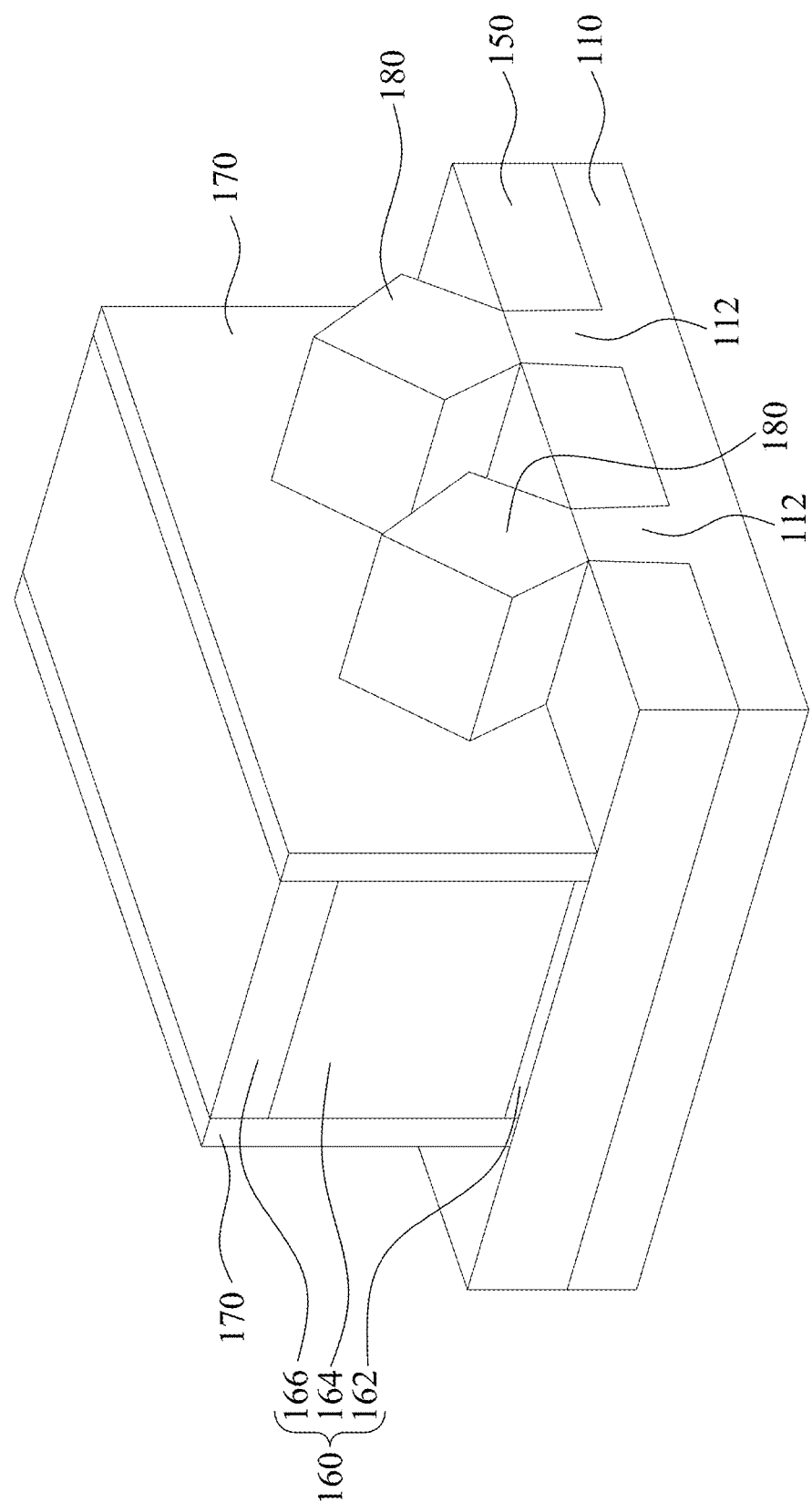

Reference is made to FIG. 6. A plurality of recesses is formed on opposite sides of the dummy gate structure 160 by etching the semiconductor fins 112. The dummy gate structure 160 and the gate spacers 170 act as etching masks in the formation of the recesses. The etching process includes a dry etching process, a wet etching process, or combinations thereof.

Semiconductor materials are then deposited in the recesses to form epitaxial structures 180 which are referred to as source/drain regions. The epitaxial structures 180 may alternatively be referred to as raised source and drain regions. The semiconductor materials include a single element semiconductor material, such as germanium (Ge) or silicon (Si), compound semiconductor materials, such as gallium arsenide (GaAs), silicon arsenide (SiAs), or aluminum gallium arsenide (AlGaAs), or a semiconductor alloy, such as silicon germanium (SiGe), silicon germanium boron (SiGeB), or gallium arsenide phosphide (GaAsP). The epitaxial structures 180 have suitable crystallographic orientations (e.g., a (100), (110), or (111) crystallographic orientation). In some embodiments, the epitaxial structures 180 include source/drain epitaxial structures. In some embodiments, where an N-type device is desired, the epitaxial structures 180 may include an epitaxially grown silicon phosphorus (SiP) or silicon carbon (SiC). In some embodiments, where a P-type device is desired, the epitaxial structures 180 may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof.

Figure 7:
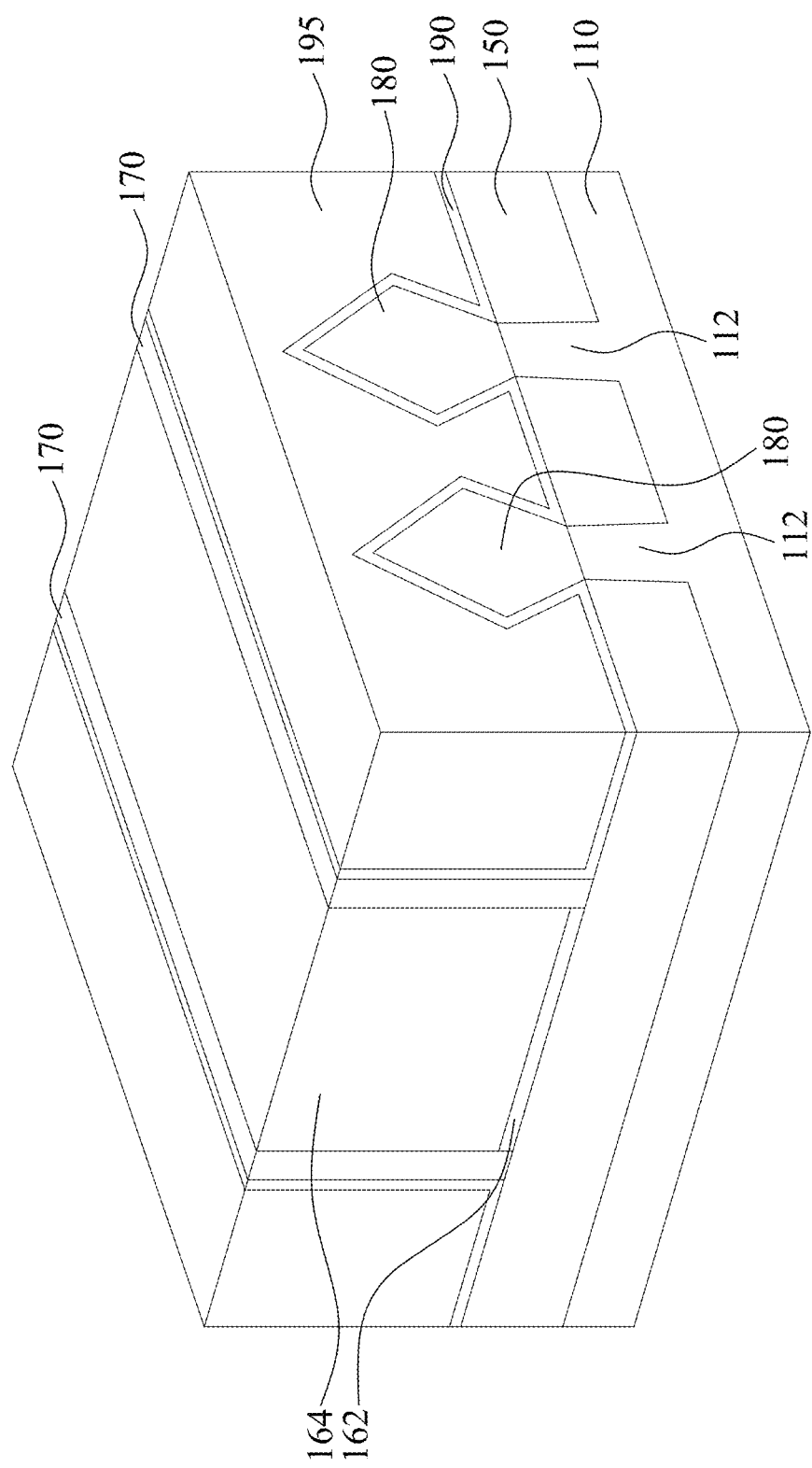

Reference is made to FIG. 7. A contact etch stop layer (CESL) 190 is conformally formed over the structure of FIG. 6. In some embodiments, the CESL 190 can be a stressed layer or layers. In some embodiments, the CESL 190 has a tensile stress and is formed of $Si_3N_4$. In some other embodiments, the CESL 190 includes materials such as oxynitrides. In yet some other embodiments, the CESL 190 may have a composite structure including a plurality of layers, such as a silicon nitride layer overlying a silicon oxide layer. The CESL 190 can be formed using plasma enhanced CVD (PECVD), however, other suitable methods, such as low-pressure CVD (LPCVD), atomic layer deposition (ALD), and the like, can also be used.

An interlayer dielectric (ILD) 195 is then formed on the CESL 190. The ILD 195 may be formed by chemical vapor deposition (CVD), high-density plasma CVD, spin-on, sputtering, or other suitable methods. In some embodiments, the ILD 195 includes silicon oxide. In some other embodiments, the ILD 195 may include silicon oxy-nitride, silicon nitride, compounds including Si, O, C and/or H (e.g., silicon oxide, SiCOH and SiOC), a low-K material, or organic materials (e.g., polymers). After the ILD 195 is formed, a planarization operation, such as CMP, is performed, so that the mask layer 166 (see FIG. 6) is removed and the dummy gate layer 164 is exposed.

Figure 8A:
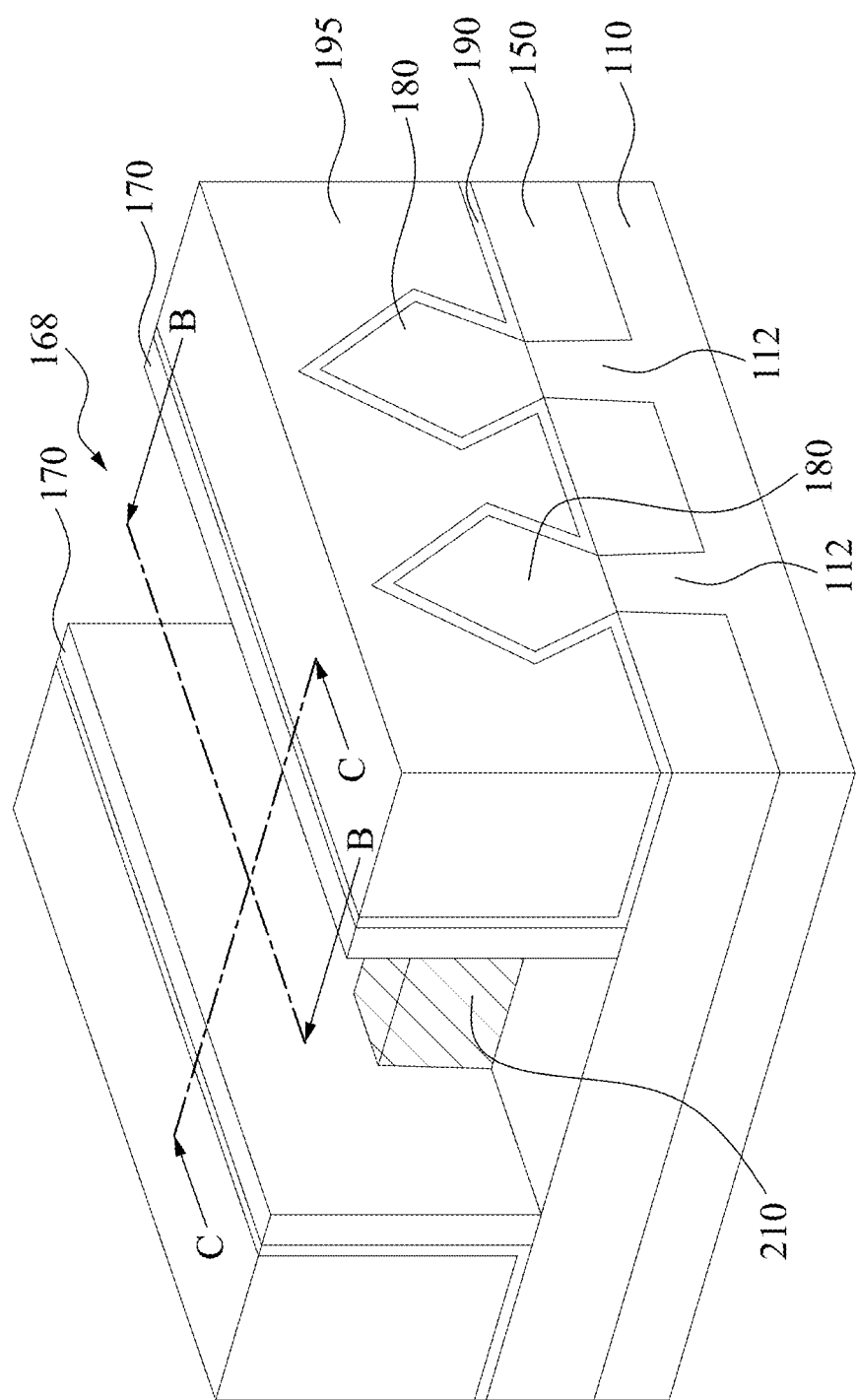
Figure 8B:
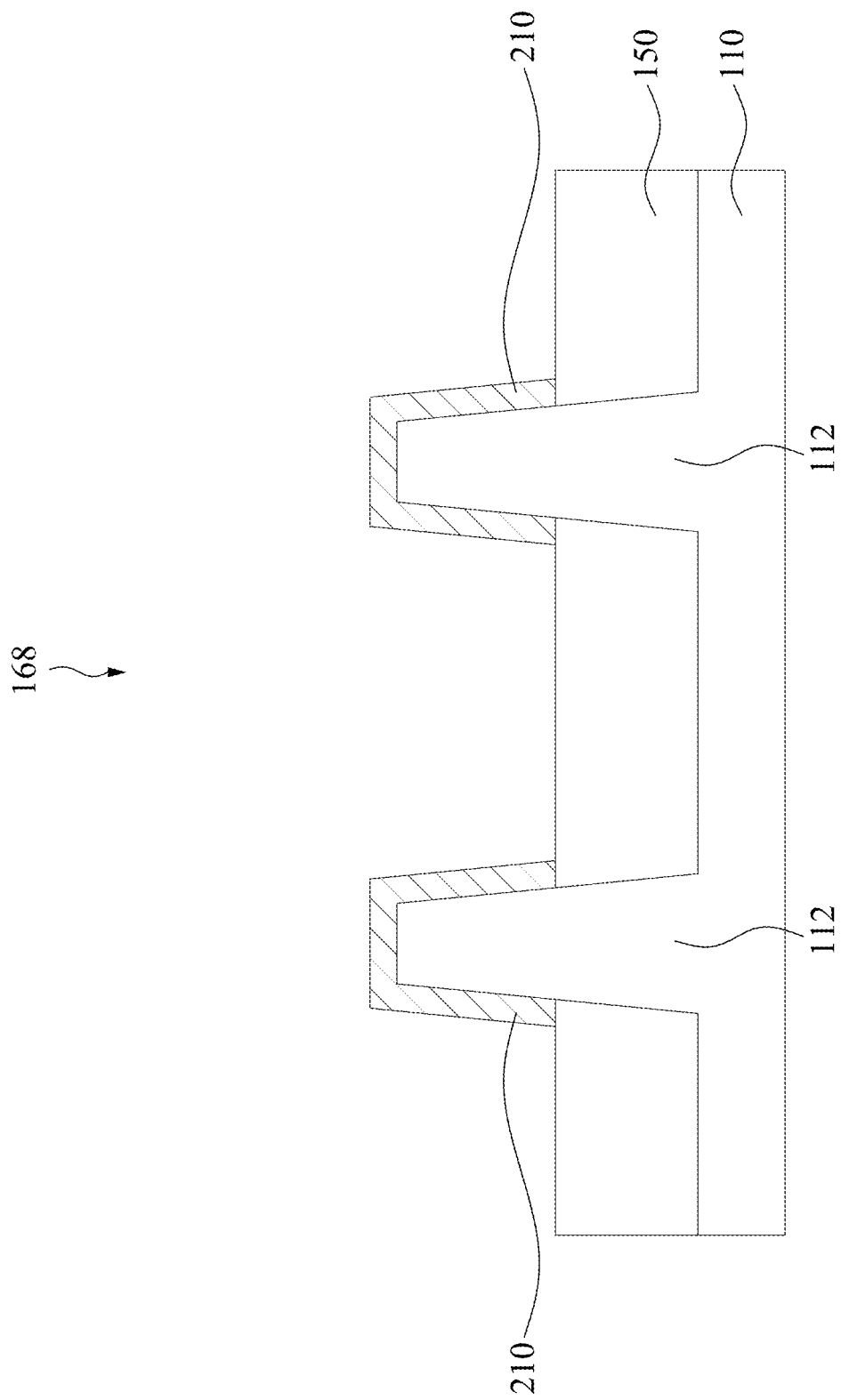
Figure 8C:
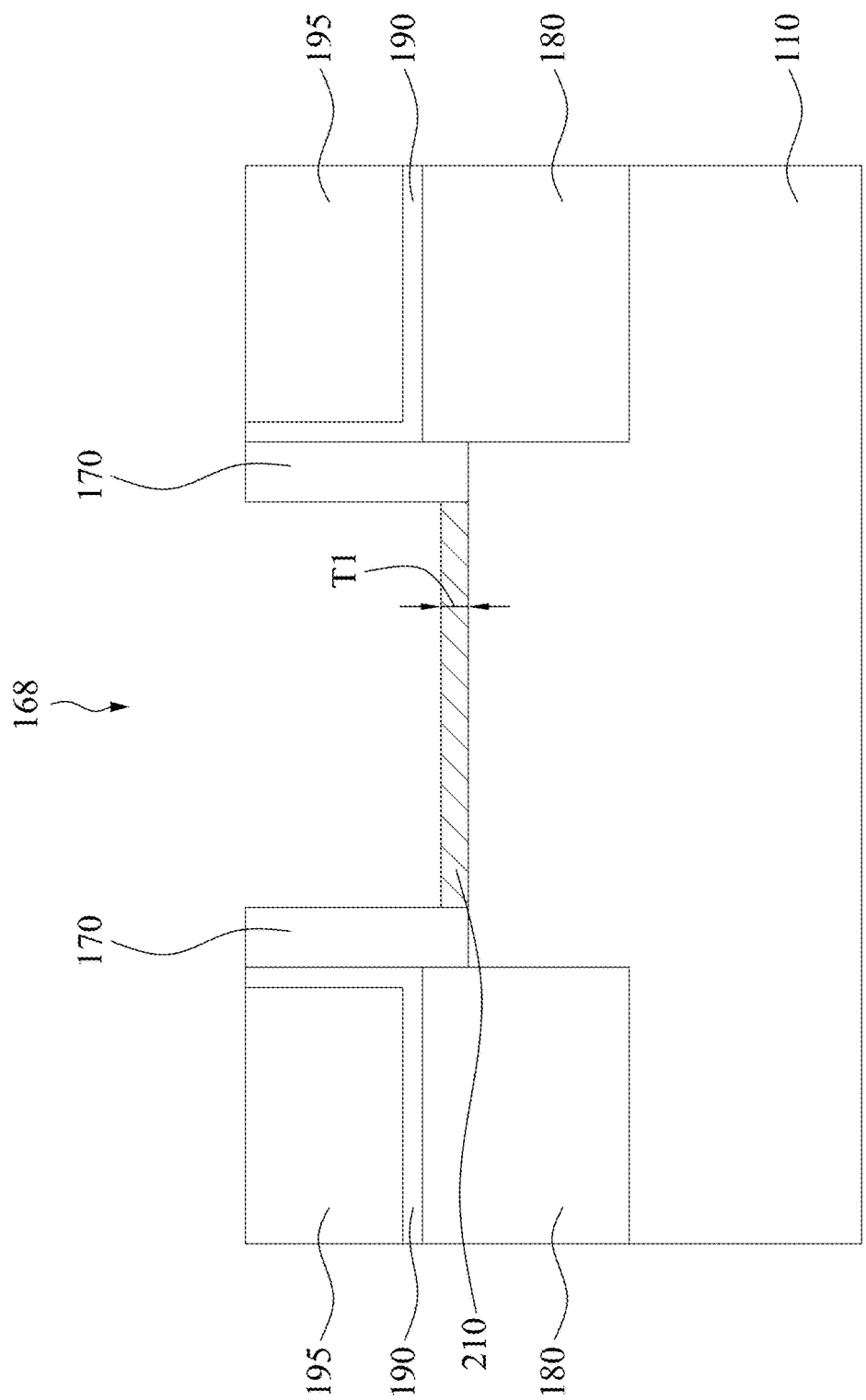

Reference is made to FIGS. 8A-8C, where FIG. 8B is a cross-sectional view taken along line B-B of FIG. 8A, and FIG. 8C is a cross-sectional view taken along line C-C of FIG. 8A. The dummy gate layer 164 and the dummy gate dielectric layer 162 (see FIG. 7) are then removed, thereby forming a gate trench 168 between the gate spacers 170 and exposing channel portions of the semiconductor fins 112 (referred to as a semiconductive channel region). The ILD 195 protects the epitaxial structures 180 during the removal of the dummy gate layer 164 and the dummy gate dielectric layer 162. The dummy gate layer 164 and the dummy gate dielectric layer 162 can be removed using plasma dry etching and/or wet etching. When the dummy gate layer 164 is polysilicon and the ILD 195 is silicon oxide, a wet etchant such as a TMAH solution can be used to selectively remove the dummy gate dielectric layer 162. The dummy gate layer 164 can be removed using plasma dry etching and/or wet etching. Subsequently, the dummy gate dielectric layer 162 is removed as well. As such, the channel portions of the semiconductor fins 112 are exposed.

A semiconductive protection layer (e.g., silicon-containing protection layer) 210 is formed above the channel portions of the semiconductor fin 112. In some embodiments, the semiconductive protection layer 210 is formed by a suitable process such as molecular beam epitaxy (MBE). MBE is a process in which a thin single crystal layer is deposited on a crystal substrate using atomic or molecular beams generated in a Knudsen cell contained in an ultra-high vacuum chamber. In some embodiments, the semiconductive protection layer 210 is formed at a temperature lower than about 300° C., e.g., in a range of about −196° C. to about 300° C., in a range of room temperature to about 300° C., or in a range of about 100° C. to about 200° C. The low temperature MBE process (e.g., lower than about 300° C.) suppresses the diffusion of germanium atoms in the channel portions of the semiconductor fins 112 toward the top surface of the semiconductive protection layer 210. As such, the germanium atomic percentage in the semiconductive protection layer 210 is relatively low. With the suppression of the germanium diffusion, $GeO_x$ is relatively low on the top surface of the semiconductive protection layer 210 in the subsequence process. Without or relative low amount of $GeO_x$ on the top surface of the semiconductive protection layer 210, the interface state density ($D_a$) is lower, such that electron mobility in the semiconductive protection layer 210 and in the channel portions of the semiconductor fins 112 can be improved. If the semiconductive protection layer 210 is formed at a temperature lower than about −196° C., the semiconductive protection layer 210 may be formed of amorphous silicon. In some embodiments, the MBE process processing at a temperature between about 100° C. to about 200° C. shows good suppression of the Ge diffusion.

The semiconductive protection layer 210 includes semiconductive materials such as silicon, e.g., monocrystalline silicon. In some embodiments, the semiconductive protection layer 210 may be a pure silicon layer. The semiconductive protection layer 210 may also be a substantially pure silicon layer, for example, with a germanium atomic percentage lower than about 10 percent due to the low temperature MBE process. For example, the germanium concentration decreases upwards in the semiconductive protection layer 210. Other methods to form the semiconductive protection layer 210 include chemical vapor deposition (CVD), atomic layer deposition (ALD), or other suitable processes. In some embodiments, the semiconductive protection layer 210 has a thickness T1.

During the formation of the semiconductive protection layer 210, the semiconductive protection layer 210 is substantially non-oxidized. That is, there is substantially no oxide layer formed above the semiconductive protection layer 210 during the formation of the semiconductive protection layer 210. Or, the semiconductive protection layer 210 is in direct contact with the following formed gate dielectric layer 220 (see FIGS. 9A-9C). With such configuration, the germanium in the semiconductive protection layer 210 (if germanium exists therein) would not be oxidized to form $GeO_x$, which may raise bias temperature instability (BTI) of the resulting semiconductor device.

Figure 9A:
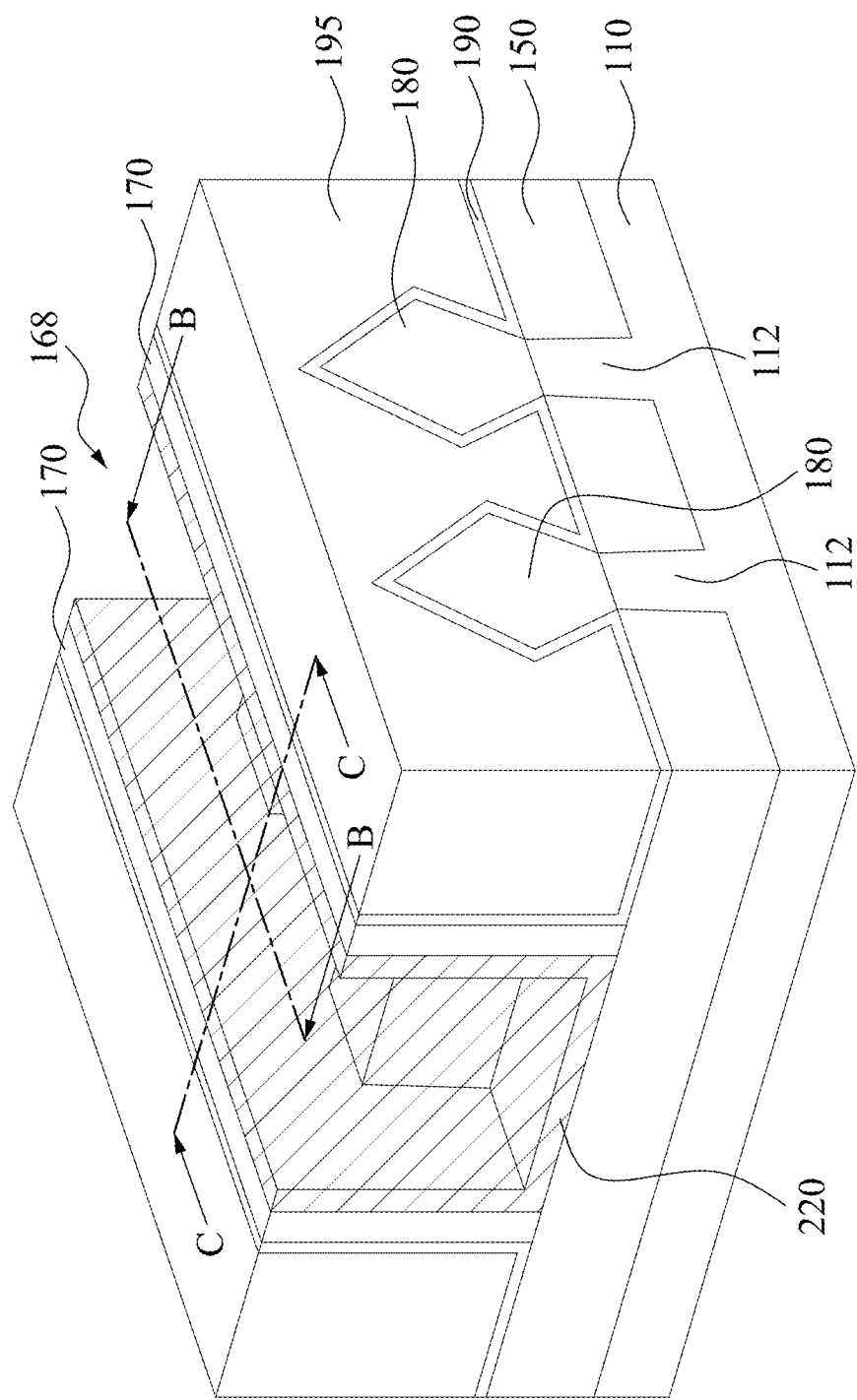
Figure 9B:
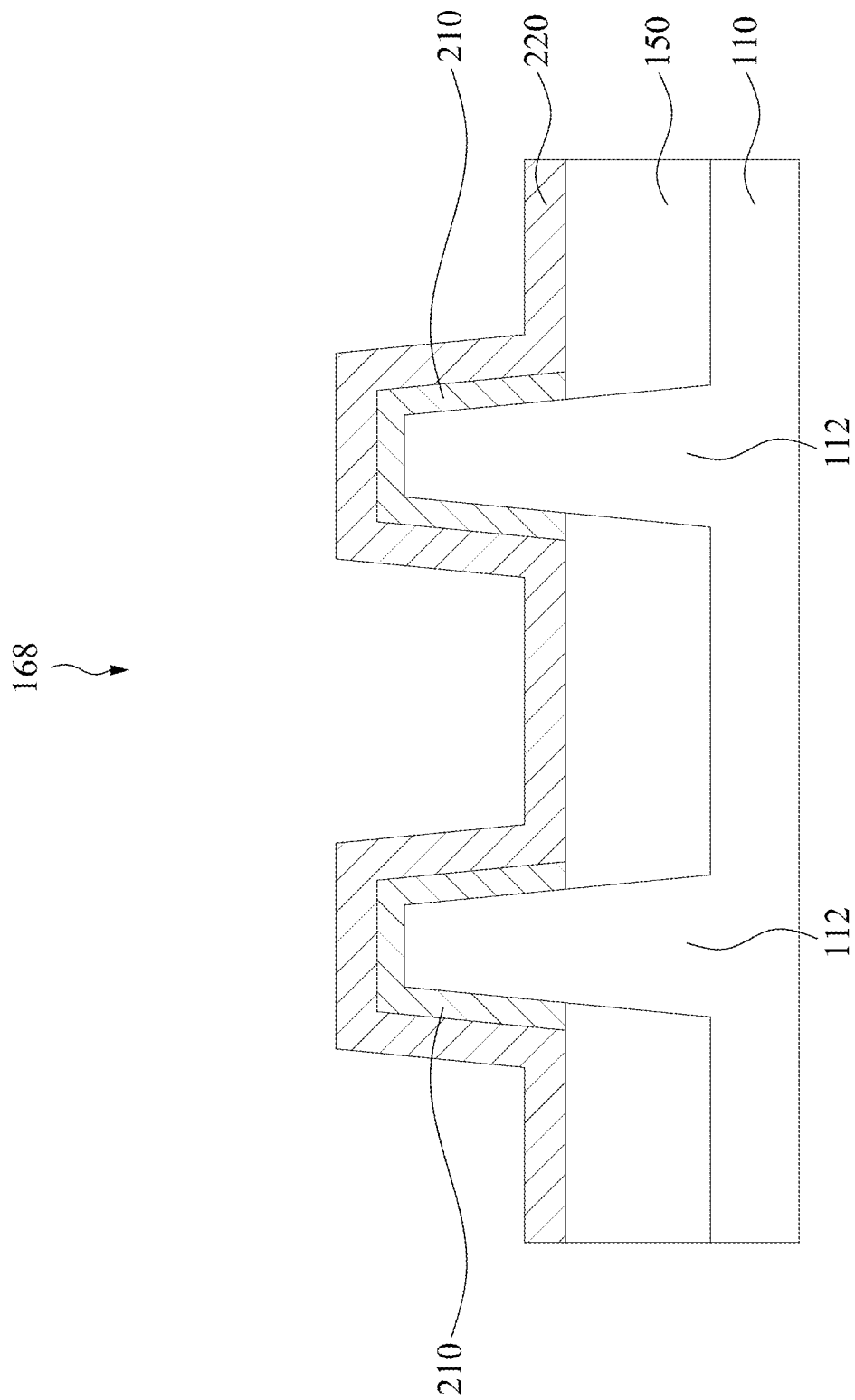
Figure 9C:
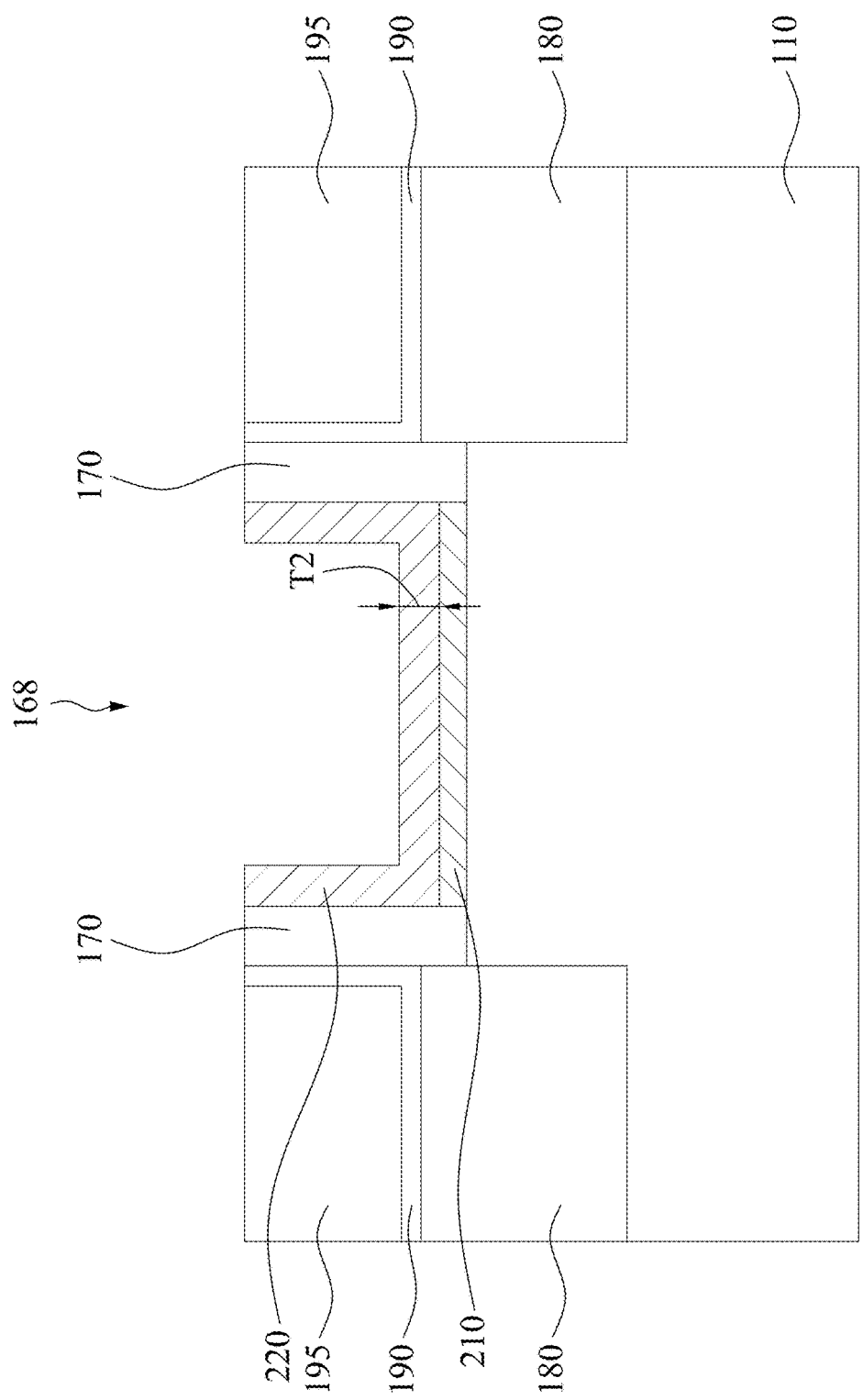

Reference is made to FIGS. 9A-9C, where FIG. 9B is a cross-sectional view taken along line B-B of FIG. 9A, and FIG. 9C is a cross-sectional view taken along line C-C of FIG. 9A. A gate dielectric layer 220 is conformally formed in the gate trench 168 and above the semiconductive protection layer 210. The gate dielectric layer 220 may be a high-κ dielectric layer having a dielectric constant (κ) higher than the dielectric constant of $SiO_2$, i.e. κ>3.9. The gate dielectric layer 220 may include $LaO_x$, $AlO_x$, $ZrO_x$, TiO, $HfO_x$, $TaO_x$, $GdO_x$, $YO_x$, $SrTiO_3$ (STO), $BaTiO_3$ (BTO), BaZrO, HfZrO, $ZrSiO_x$, HfLaO, $HfSiO_x$, HfSiON, $LaSiO_x$, $AlSiO_x$, $GdSiO_x$, $YSiO_x$, HfTaO, HfTiO, $(Ba,Sr)TiO_3$ (BST), $Al_2O_3$, $Si_3N_4$, oxynitrides (SiON), or other suitable materials. In some embodiments, the gate dielectric layer 220 is a single layer. In some other embodiments, the gate dielectric layer 220 includes multiple layers, e.g., a $HfO_2$ layer and an $Al_2O_3$ layer above the $HfO_2$ layer. The gate dielectric layer 220 is deposited by suitable techniques, such as ALD, CVD, PVD, thermal oxidation, combinations thereof, or other suitable techniques. In some embodiments, the gate dielectric layer 220 has a thickness T2 in a range of about 1 nm to about 2 nm when the gate dielectric layer 220 is a single layer. In some other embodiments, the gate dielectric layer 220 has a thickness T2 in a range of about 1 nm to about 10 nm when the gate dielectric layer 220 includes multiple layers.

After the deposition of the gate dielectric layer 220, a post-deposition annealing (PDA) process may be performed on the gate dielectric layer 220 and the semiconductive protection layer 210. The post-deposition annealing improves the interfacial and bulk properties of the gate dielectric layer 220. In some embodiments, the post-deposition annealing process is performed at a temperature in a range of about 200° C. to about 1000° C., e.g., about 600° C. In some embodiments, the post-deposition annealing process is carried out in air, or those gases with low reactivity such as $N_2$, He, Ar, or highly reactive gas such as $O_2$, $H_2$ or mixture of the gases aforementioned.

Figure 10A:
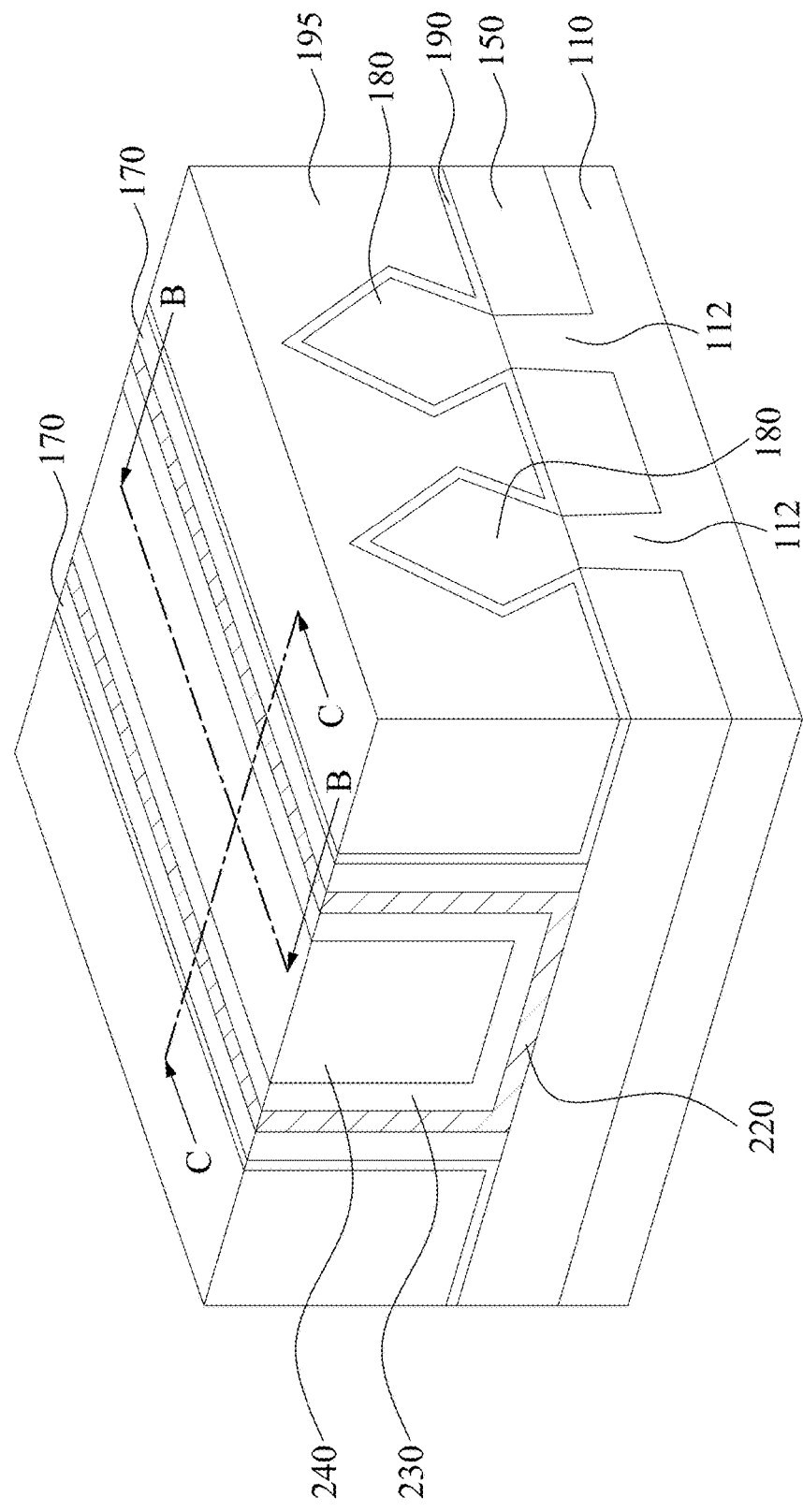
Figure 10B:
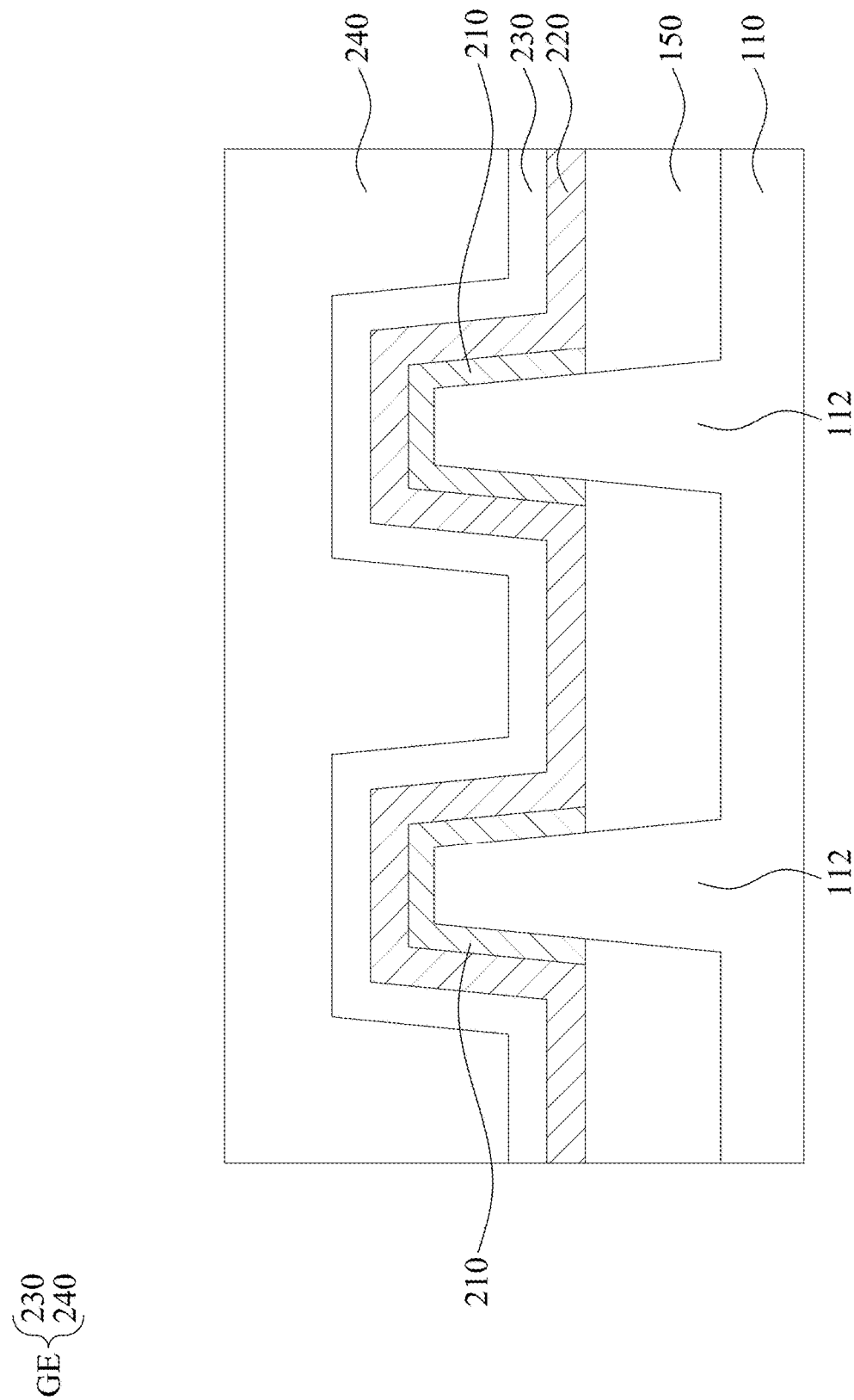
Figure 10C:
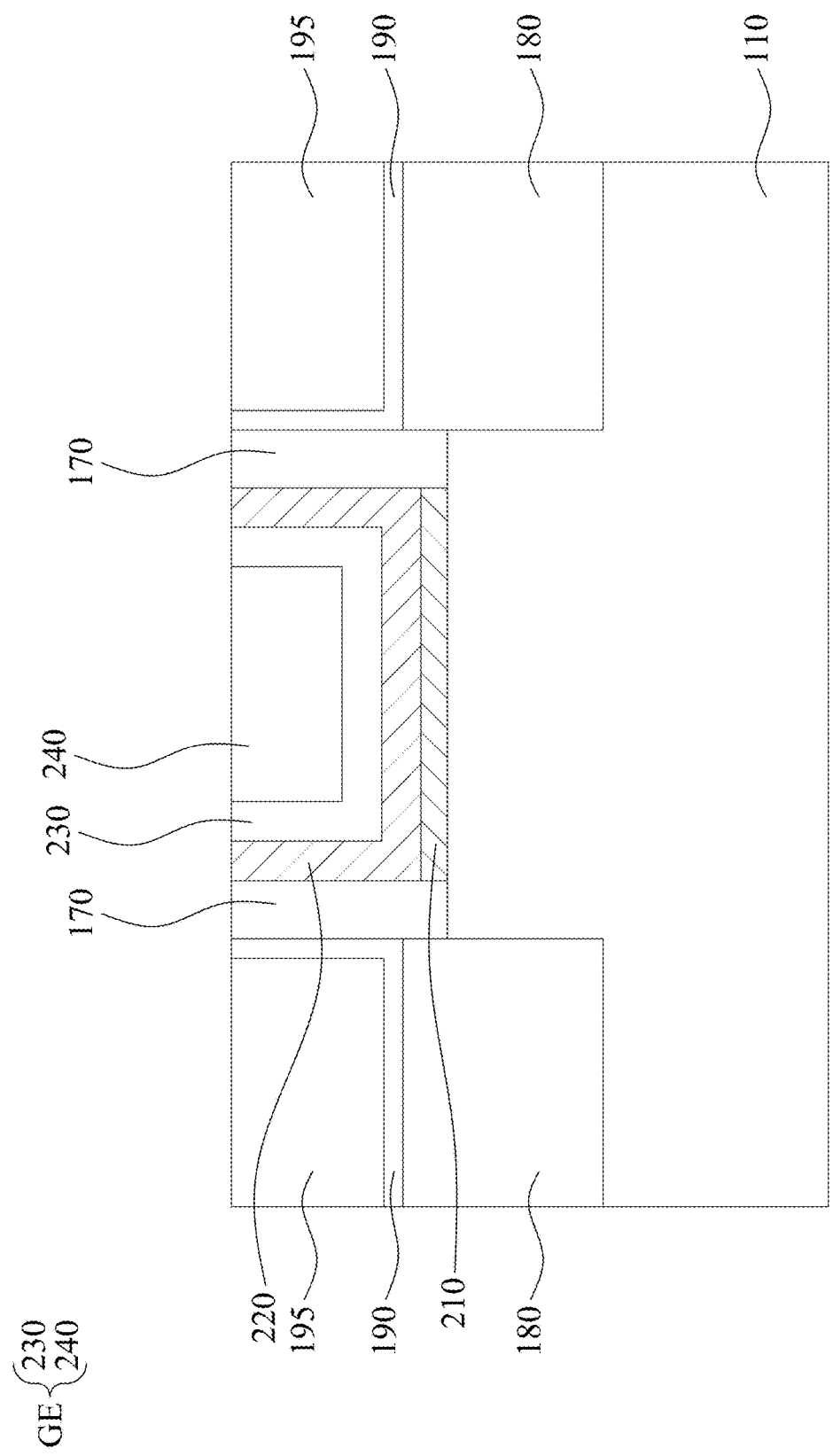

Reference is made to FIGS. 10A-10C, where FIG. 10B is a cross-sectional view taken along line B-B of FIG. 10A, and FIG. 10C is a cross-sectional view taken along line C-C of FIG. 10A. A gate electrode GE is formed above the gate dielectric layer 220 and fill the gate trench 168 (see FIGS. 9A-9C). In some embodiments, the gate electrode GE include at least one work function metal layer(s) 230, a fill layer 240, and/or other suitable layers that are desirable in a metal gate stack. The work function metal layer 230 may include n-type and/or p-type work function metal. Exemplary n-type work function metals include Ti, Ta, Ag, TiAl, TaAl, TaAlC, TiAlN, TaC, TiC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, other suitable p-type work function materials, or combinations thereof. The work function metal layer 230 may have multiple layers. The work function metal layer(s) 230 may be deposited by CVD, PVD, electroplating and/or other suitable process. In some embodiments, the fill layer 240 in the metal gate electrodes GE may include tungsten (W), Mo, Ru, or other suitable conductive materials. The fill layer 240 may be deposited by ALD, PVD, CVD, or other suitable process.

Figure 11A:
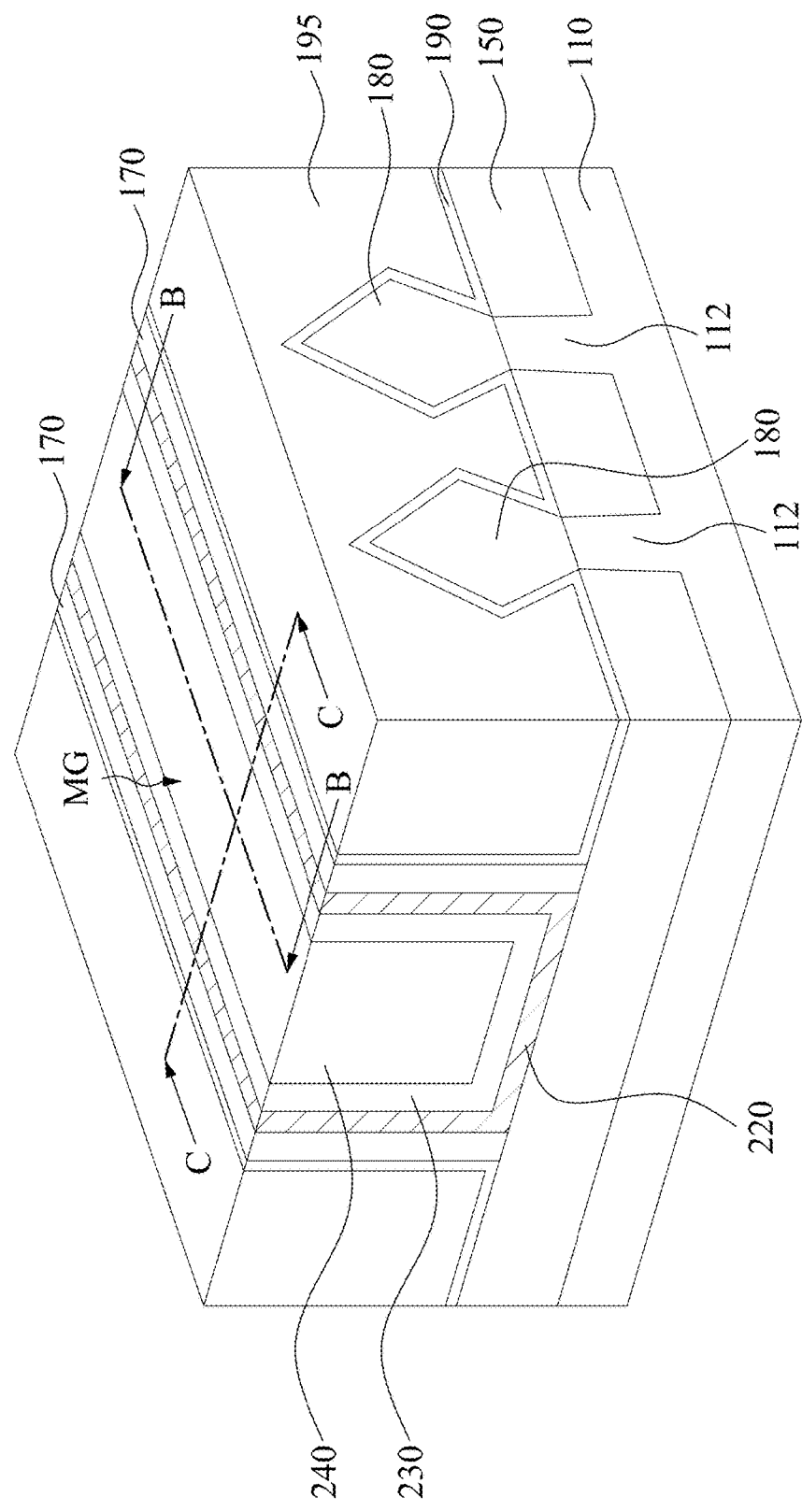
Figure 11B:
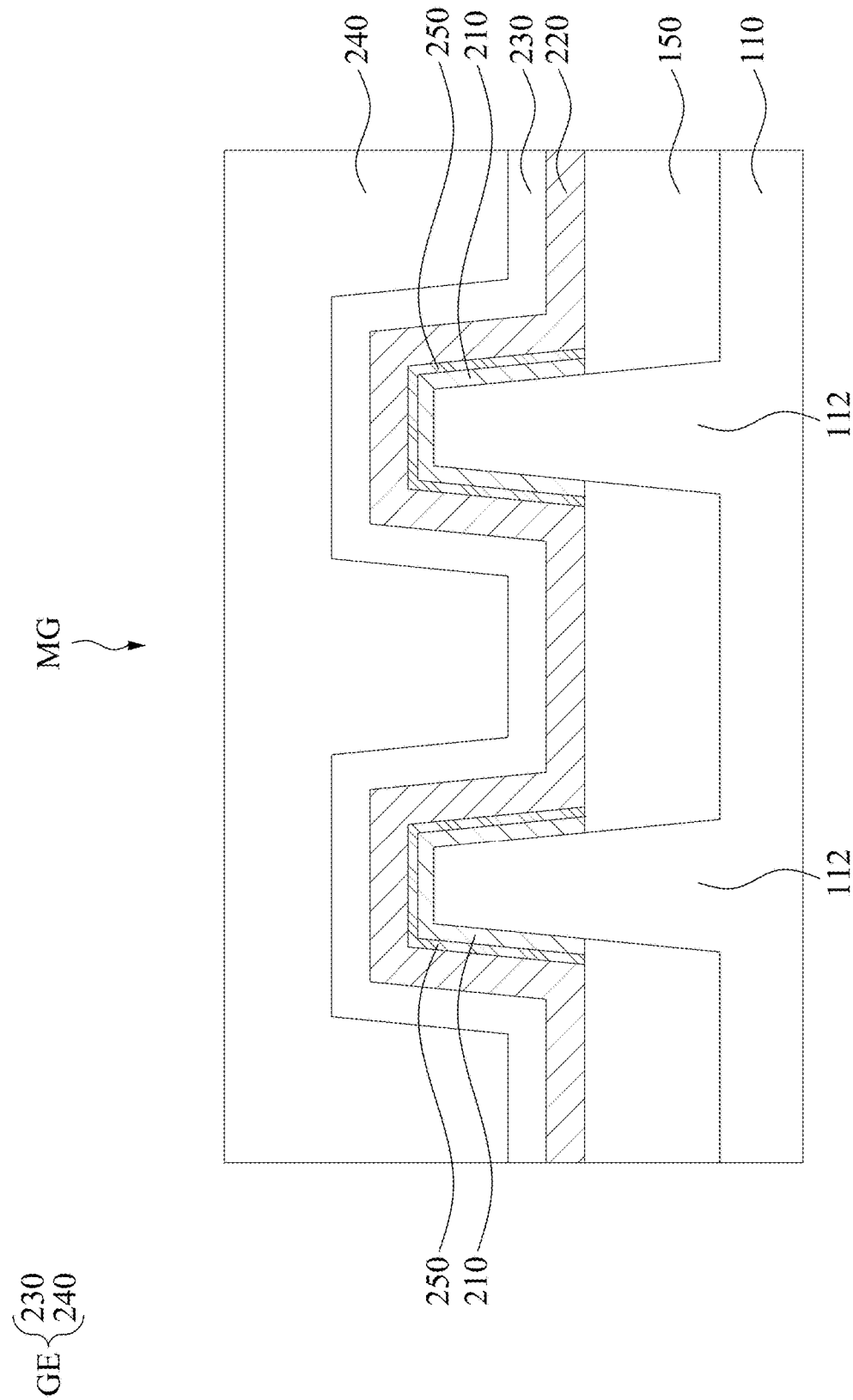
Figure 11C:
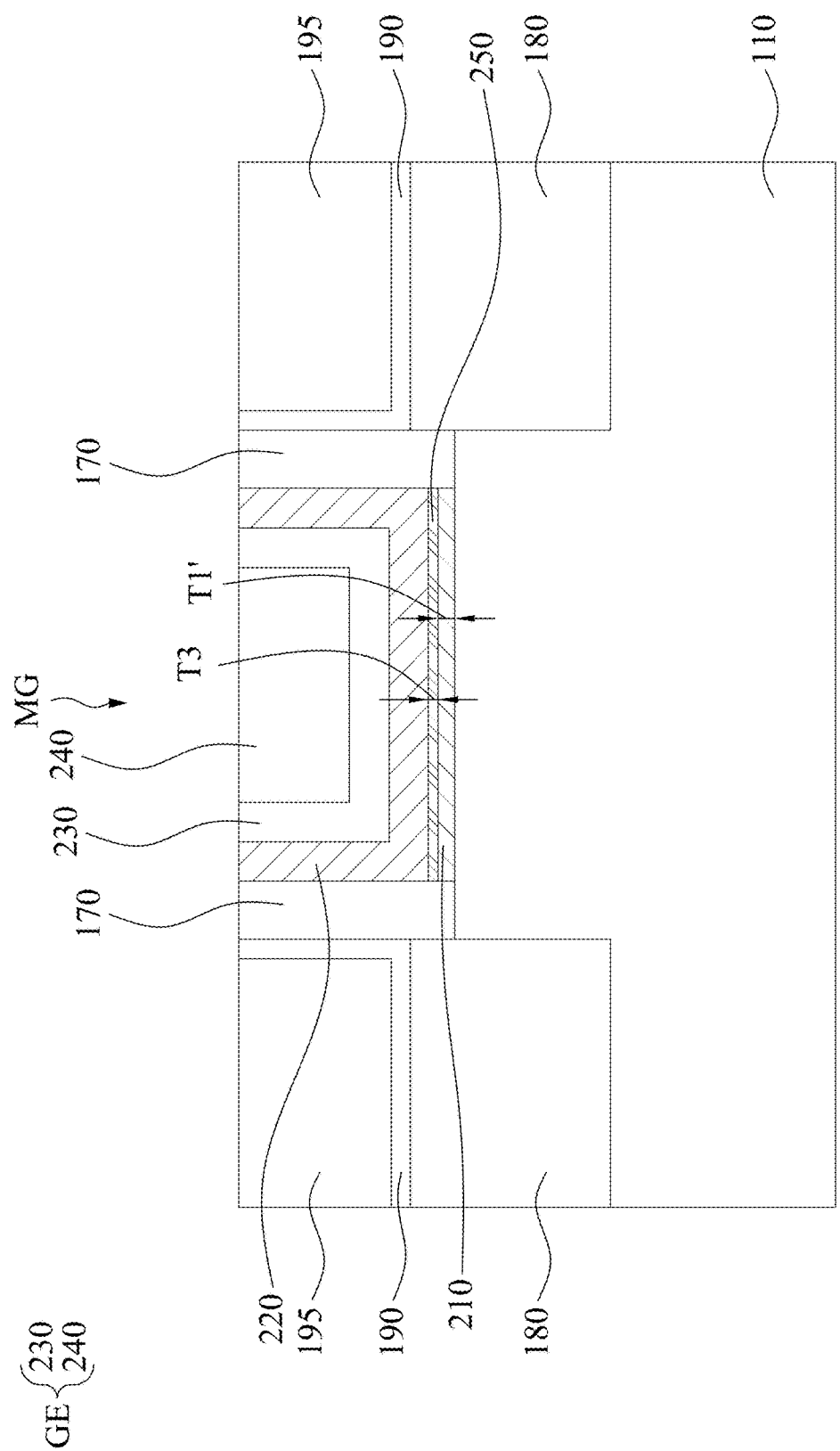

Reference is made to FIGS. 11A-11C, where FIG. 11B is a cross-sectional view taken along line B-B of FIG. 11A, and FIG. 11C is a cross-sectional view taken along line C-C of FIG. 11A. An interfacial layer 250 is formed between the semiconductive protection layer 210 and the gate dielectric layer 220. As such, the interfacial layer 250, the gate dielectric layer 220, and the gate electrode GE are together referred to as a gate structure MG. For example, a post-gate forming gas annealing (FGA) process is performed on the semiconductive protection layer 210, the gate dielectric layer 220, and the gate electrode GE. In some embodiments, the FGA process is performed at a temperature in a range of about 200° C. to about 500° C., e.g., about 400° C. In some embodiments, the FGA process is carried out processing gases of a mixture of hydrogen ($H_2$) and an inert gas such as $N_2$, He, and/or Ar. The $H_2$ concentration of the processing gases can be about 0.1% to 100%. For example, the processing gases include about 15% $H_2$ gas and about 85% $N_2$ gas. In some embodiments, the interfacial layer 250 has a thickness T3 in a range of about 1 angstrom to about 20 angstroms, which could provide low interfacial traps but suitable equivalent oxide thickness (EOT) in the range of thickness.

The interfacial layer 250 is formed by oxidizing a portion of the semiconductive protection layer 210 near the gate dielectric layer 220. As such, the interfacial layer 250 and the semiconductive protection layer 210 include the same chemical element(s), e.g., silicon in this case. That is, the interfacial layer 250 includes $SiO_x$. In some embodiments, rare or some germanium may diffuse to the top surface of the semiconductive protection layer 210 (i.e., the interface between the semiconductive protection layer 210 and the gate dielectric layer 220), such that the interfacial layer 250 may further include a small amount of $GeO_x$. Further, the oxygen atoms in the interfacial layer 250 may be diffused from the gate dielectric layer 220, such that an oxygen atomic concentration of the gate dielectric layer 220 decreases in a direction from the gate electrode GE toward the interfacial layer 250. After the formation of the interfacial layer 250, the thickness T1 (see FIG. 8C) of the semiconductive protection layer 210 is decreased to be the thickness T1'. In some embodiments, the thickness T1' of the semiconductive protection layer 210 is greater than the thickness T3 of the interfacial layer 250. In some embodiments, a ratio of T3/T1' is in a range of about 0.1 to about 10.

Figure 12A:
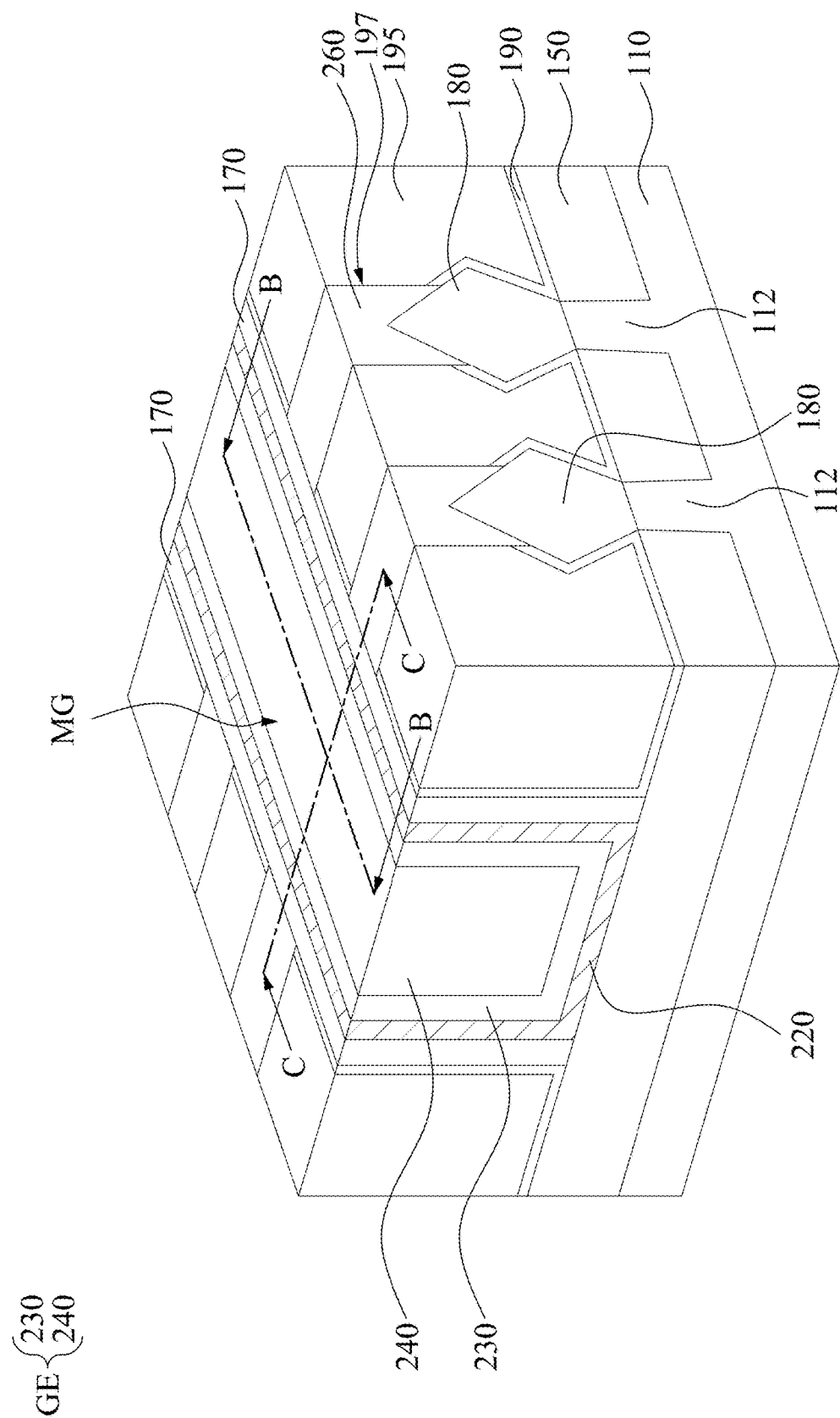
Figure 12B:
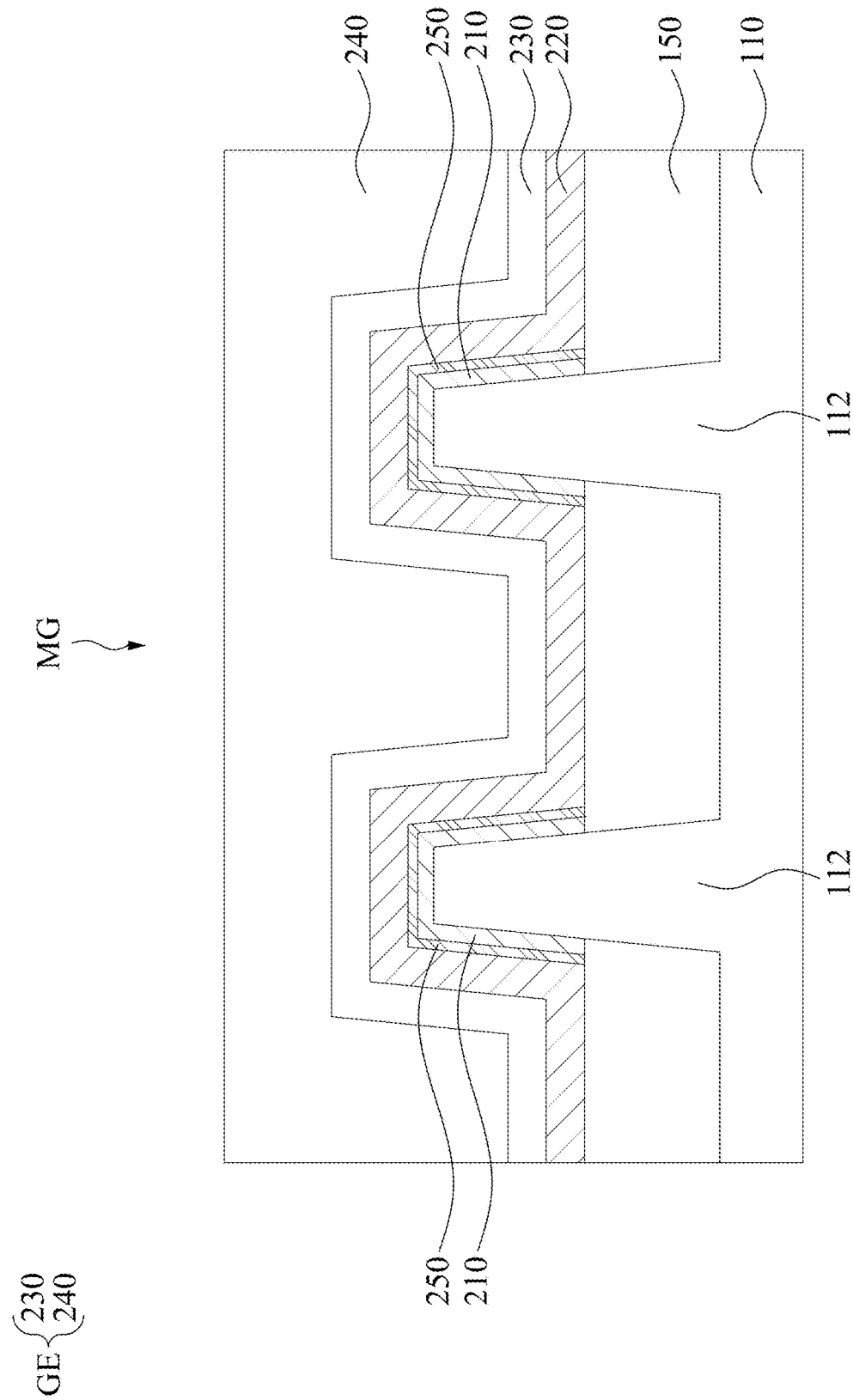
Figure 12C:
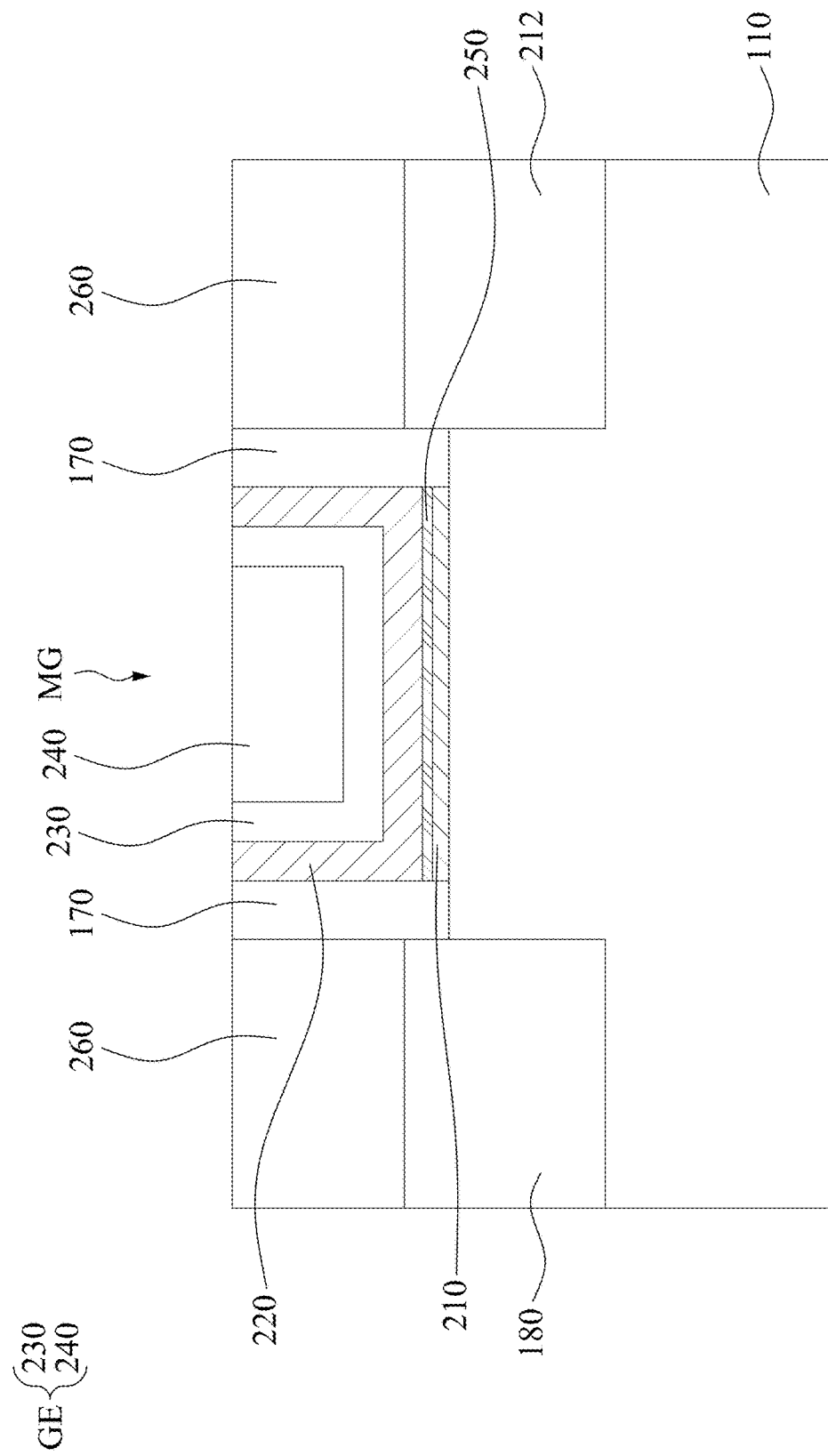

Reference is made to FIGS. 12A-12C, where FIG. 12B is a cross-sectional view taken along line B-B of FIG. 12A, and FIG. 12C is a cross-sectional view taken along line C-C of FIG. 12A. The ILD 195 is patterned to form trenches 197 on opposite sides of the gate structure MG, and then the CESL 190 is patterned to expose the epitaxial structures 180. In some embodiments, multiple etching processes are performed to pattern the ILD 195 and the CESL 190. The etching processes include dry etching process, wet etching process, or combinations thereof.

Contacts 260 are formed in the trenches 197. As such, the contacts 260 are respectively in contact with the epitaxial structures 180. In some embodiments, the contacts 260 may be made of metal, such as W, Co, Ru, Al, Cu, or other suitable materials. After the deposition of the contacts 260, a planarization process, such as a chemical mechanical planarization (CMP) process, may be then performed. As such, top surfaces of the contacts 260 and the top surface of the ILD 195 are substantially coplanar. In some embodiments, metal alloy layers (such as silicide) may be formed between the contacts 260 and the epitaxial structures 180. Further, barrier layers may be formed in the trenches 197 before the formation of the contacts 260. The barrier layers may be made of TiN, TaN, or combinations thereof.

In FIGS. 12A-12C, the semiconductor fin 112 includes germanium. The semiconductive protection layer 210 is in direct contact with the channel portion of the semiconductor fin 112 (referred to as a semiconductive channel region). In some embodiments, the semiconductive protection layer 210 is a pure silicon layer or a substantially pure silicon layer. As shown in FIG. 12B, the semiconductive protection layers 210 are respectively above the semiconductor fins 112 and separated from each other. In FIG. 12C, the sidewalls of the semiconductive protection layer 210 is in direct contact with gate spacers 170 and thus is spaced apart from the epitaxial structures 180. That is, the semiconductive protection layer 210 and the gate spacers 170 are both in direct contact with the top surface of the semiconductor fin 112. Or, a bottom surface of the gate spacer 170 is lower than a top surface of the semiconductive protection layer 210. Further, the semiconductive protection layer 210 extends from an inner sidewall of one of the gate spacers 170 to an inner sidewall of another one of the gate spacers 170. In some embodiments, the semiconductive protection layer 210 has a thickness T1' (see FIG. 11C) in a range of about 1.3125 angstroms to about 26.265 angstroms. That is, the semiconductive protection layer 210 includes one to about 20 monolayers of silicon layers. If thickness T1' of the semiconductive protection layer 210 is greater than about 26.265 angstroms (or greater than about 20 monolayers of silicon layers), the relaxation would occur, and misfit dislocation would result in defect formation in the semiconductive protection layer 210.

The interfacial layer 250 is on and in direct contact with the semiconductive protection layer 210 and the gate dielectric layer 220. Since the interfacial layer 250 is formed by oxidizing a portion of the semiconductive protection layer 210, the interfacial layer 250 and the semiconductive protection layer 210 include the same chemical element(s) (e.g., silicon and/or germanium in this case), and the semiconductive protection layer 210 and the interfacial layer 250 have substantially the same width (as shown in FIG. 12C). The bottom surface of the interfacial layer 250 is higher than the bottom surface of the gate spacer 170. The sidewalls of the interfacial layer 250 are in direct contact with the gate spacers 170. In some embodiments, the thickness T3 (see FIG. 11C) of the interfacial layer 250 is in a range of about 1 angstrom to about 20 angstroms.

The oxygen in the interfacial layer 250 may be diffused from the gate dielectric layer 220. As such, an oxygen concentration of the gate dielectric layer 220 decreases in a direction from the work function metal layer 230 toward the interfacial layer 250. By contrast, a portion of the gate dielectric layer 220 directly above the isolation structure 150 (see FIG. 12B) has a substantially uniform oxygen concentration.

With such configuration, the semiconductor device has good device reliability. For example, since the semiconductive protection layer is formed at low temperature (e.g., lower than about 300° C.), germanium atoms in the semiconductor fins are not easy to diffuse to the top surface of the semiconductive protection layer. As such, the top surface of the semiconductive protection layer is smooth, and the semiconductive protection layer has excellent interface quality and reliability. Further, since the germanium atoms are not easy to diffuse to the top surface of the semiconductive protection layer, the interfacial layer includes no or rare $GeO_x$, and the bias temperature instability (BTI) of the semiconductor device is improved.

FIGS. 13-24C illustrate a method for manufacturing a semiconductor device at various stages in accordance with some embodiments of the present disclosure. In some embodiments, the semiconductor device shown in FIGS. 13-24C may be intermediate devices fabricated during processing of an integrated circuit (IC), or a portion thereof, that may include static random access memory (SRAM), logic circuits, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 13:
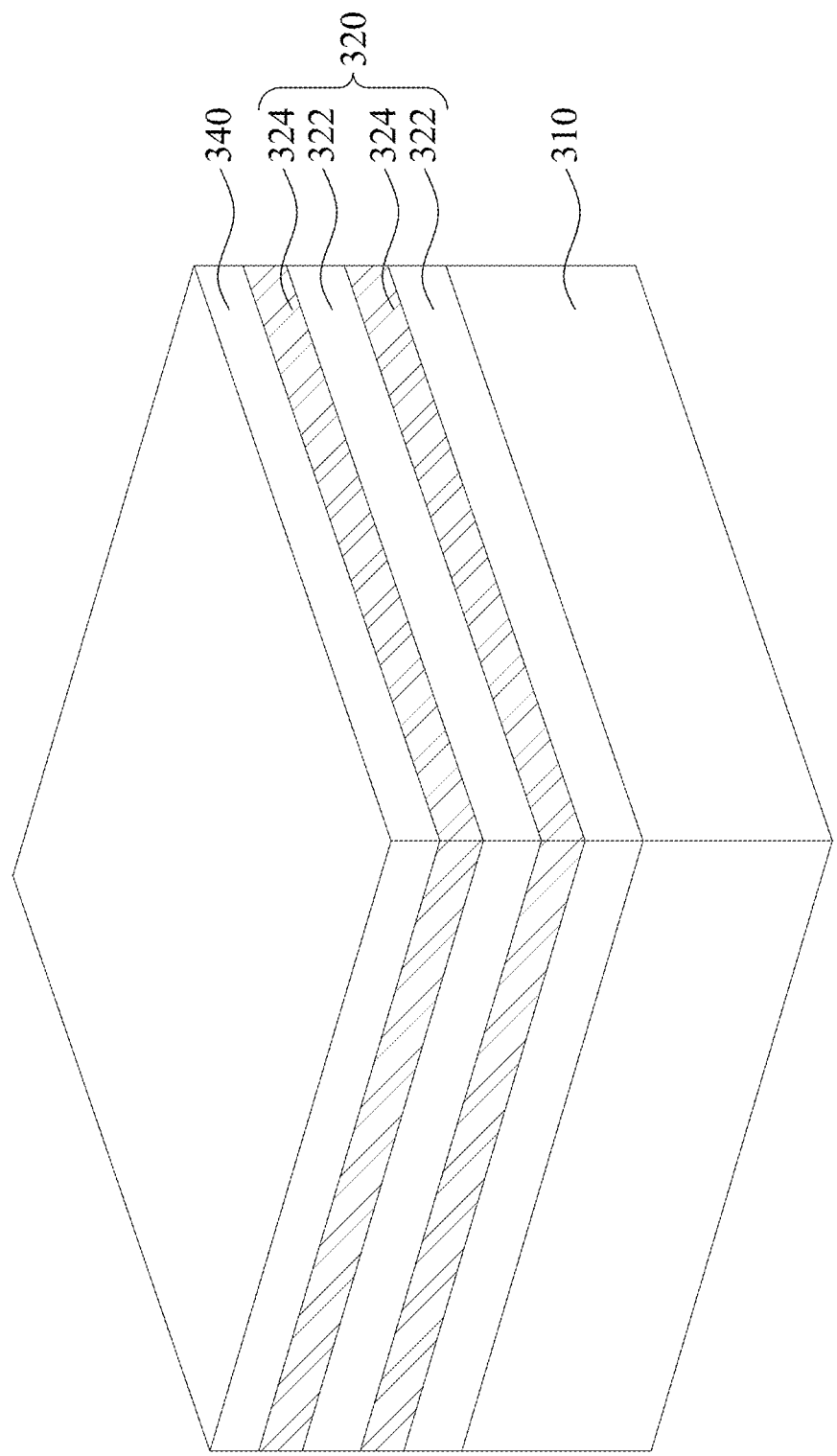
FIGS. 13-24C illustrate a method for manufacturing a semiconductor device at various stages in accordance with some embodiments of the present disclosure.

Reference is made to FIG. 13. A substrate 310 is provided. In some embodiments, the substrate 310 includes germanium (Ge), silicon germanium ($Si_{1-x}Ge_x$, where 0<x≤1), gallium arsenide (GaAs) or other appropriate semiconductor materials. In some embodiments, the substrate 310 may include a semiconductor-on-insulator (SOI) structure such as a buried dielectric layer. Also alternatively, the substrate 310 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 310 may include any of a variety of substrate structures and materials. In various embodiments, the substrate 310 may be an ultra-high-voltage-annealed Ge(001) substrate.

Figure 14:
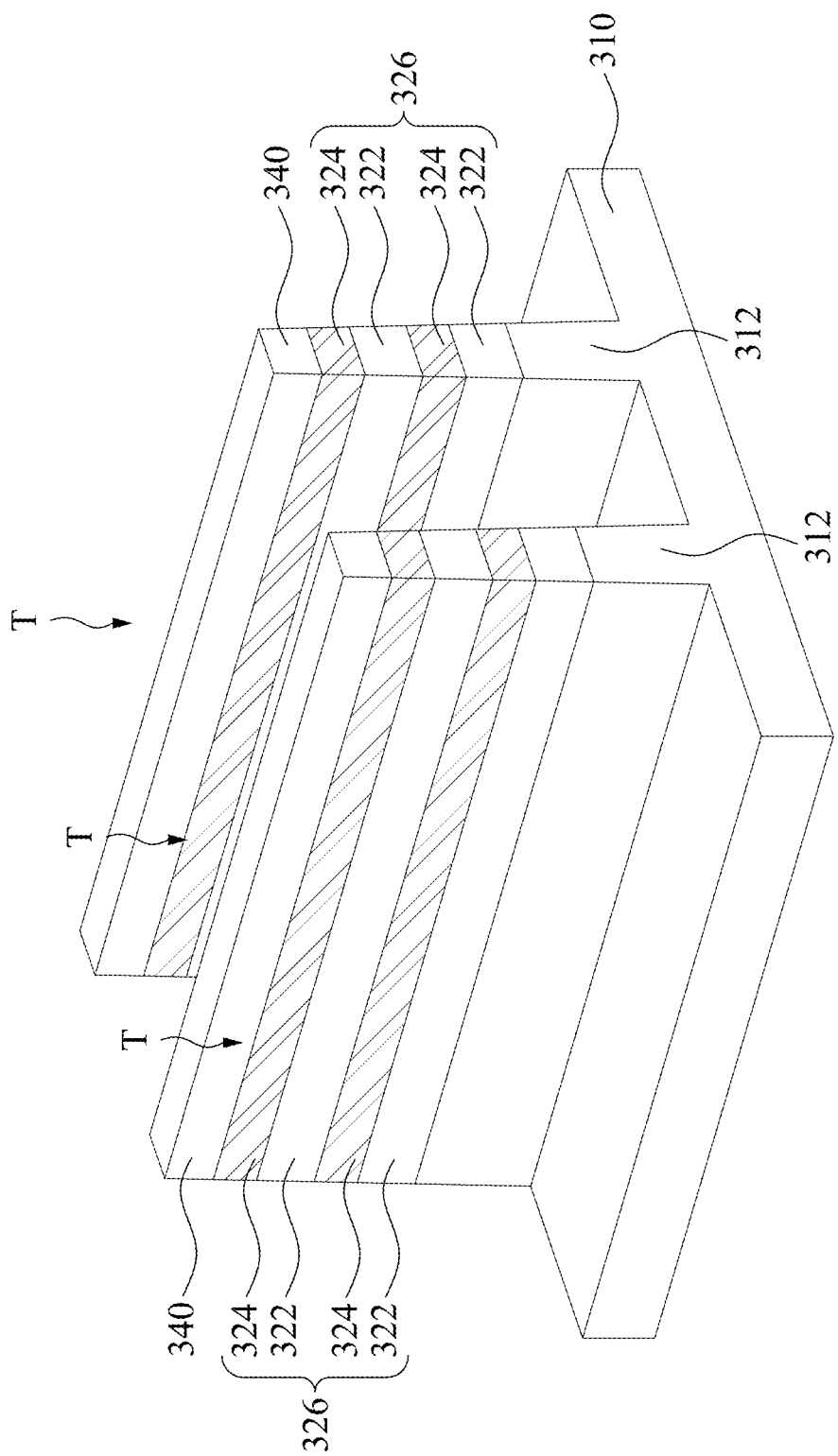

A stacked structure 320 is formed on the substrate 310 through epitaxy, such that the stacked structure 320 forms crystalline layers. The stacked structure 320 includes first semiconductor layers 322 and second semiconductor layers 324 stacked alternately. The first semiconductor layers 322 and the second semiconductor layers 324 are made of materials having different lattice constants, and may include one or more layers of Si, Ge, SiGe, GeSn, GaAs, InAs, InSb, GaP, GaSb, InAlAs, InGaAs, GaSbP, GaAsSb or InP. In some embodiments, the first semiconductor layers 322 and the second semiconductor layers 324 are made of Si, a Si compound, SiGe, Ge or a Ge compound. In FIG. 14, two layers of the first semiconductor layers 322 and two layers of the second semiconductor layers 324 are disposed. However, the numbers of the layers are not limited to one, and may be one or 3-10 layers of each of the first and second semiconductor layers are formed. By adjusting the numbers of the stacked layers, a driving current of the GAA FET device can be adjusted.

In some embodiments, the first semiconductor layers 322 are SiGe layers having a germanium atomic percentage greater than zero. In some embodiments, the second semiconductor layers 324 are SiGe layers having a germanium atomic percentage greater than zero. In some embodiments, the germanium atomic percentage of the second semiconductor layers 324 is higher than the germanium atomic percentage of the first semiconductor layers 322.

Next, a mask layer 340 is formed on the stacked structure 320. The manufacturing processes and/or materials of the mask layer 340 are similar to or the same as the mask layer 130 shown in FIG. 2. Therefore, a description in this regard will not be repeated hereinafter.

Reference is made to FIG. 14. The stacked structure 320 (see FIG. 13) is patterned into fin structures 326 and trenches T. The fin structures 326 may serve as active regions (e.g., channels and source/drain features) of transistors. The number of the fin structures 326 is not limited to, and may be as small as one and three or more. In some embodiments, one or more dummy fin structures are formed on both sides of the fin structures 326 to improve pattern fidelity in the patterning operations.

The trenches T extend into the substrate 310, and have lengthwise directions substantially parallel to each other. The trenches T form base portions 312 in the substrate 310, where the base portions 312 protrude from the substrate 310, and the fin structures 326 are respectively formed above the base portions 312 of the substrate 310.

Figure 15:
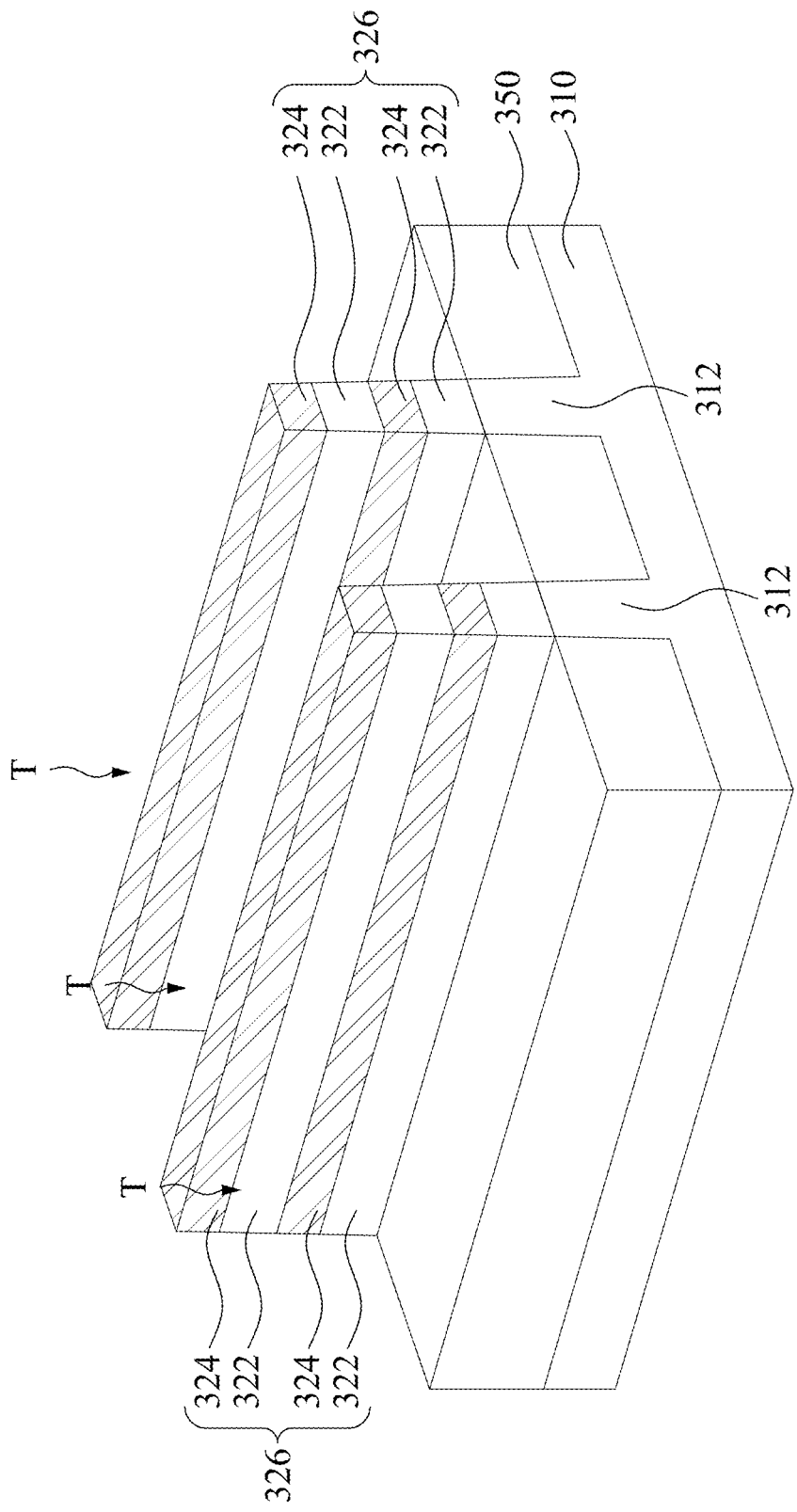

Reference is made to FIG. 15. Isolation structures 350, which may be shallow trench isolation (STI) regions, are formed in the trenches T. The formation may include filling the trenches T with a dielectric layer(s), for example, using flowable chemical vapor deposition (FCVD), and performing a chemical mechanical polish (CMP) to level the top surface of the dielectric material with the top surface of the topmost second semiconductor layer 324. The isolation structures 350 are then recessed. The top surface of the resulting isolation structures 350 may be leveled with the bottom surface of the first semiconductor layer 322, or may be lower than the bottom surface of the first semiconductor layer 322. The isolation structures 350 may be a dielectric material, such as silicon oxide, silicon nitride, silicon oxynitride, SiCN, $SiC_xO_yN_z$, or combinations thereof.

Figure 16:
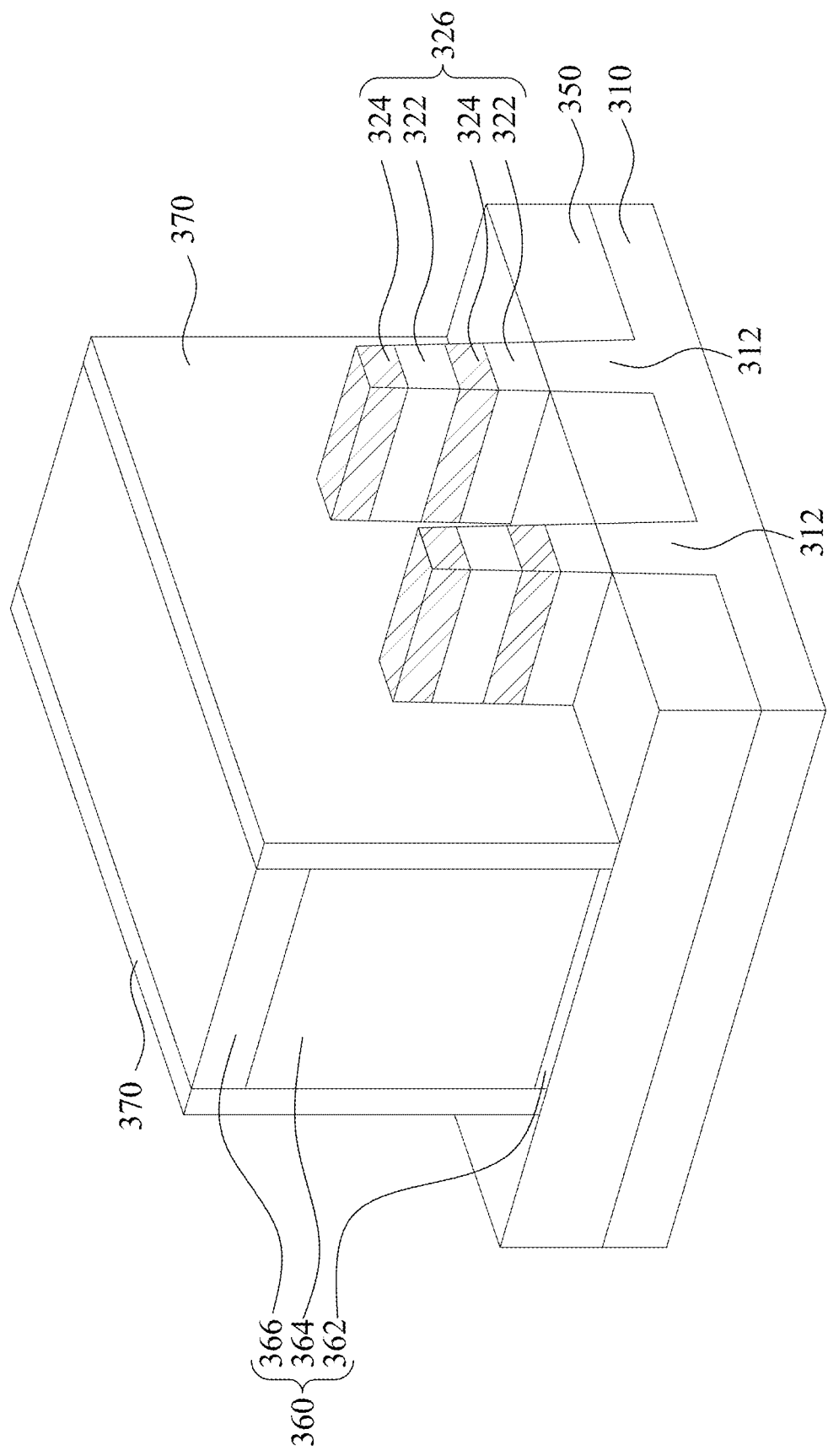

Reference is made to FIG. 16. At least one dummy gate structure 360 is formed above the fin structures 326 and the isolation structures 350. The dummy gate structure 360 includes a dummy gate dielectric layer 362, a dummy gate layer 364, and a mask layer 366 formed over the dummy gate layer 364. Subsequently, gate spacers 370 are respectively formed on sidewalls of the dummy gate structure 360. The manufacturing processes and/or materials of the dummy gate structure 360 and the gate spacers 370 are similar to or the same as the dummy gate structure 160 and the gate spacers 170 shown in FIGS. 4 and 5, respectively. Therefore, a description in this regard will not be repeated hereinafter.

Figure 17:
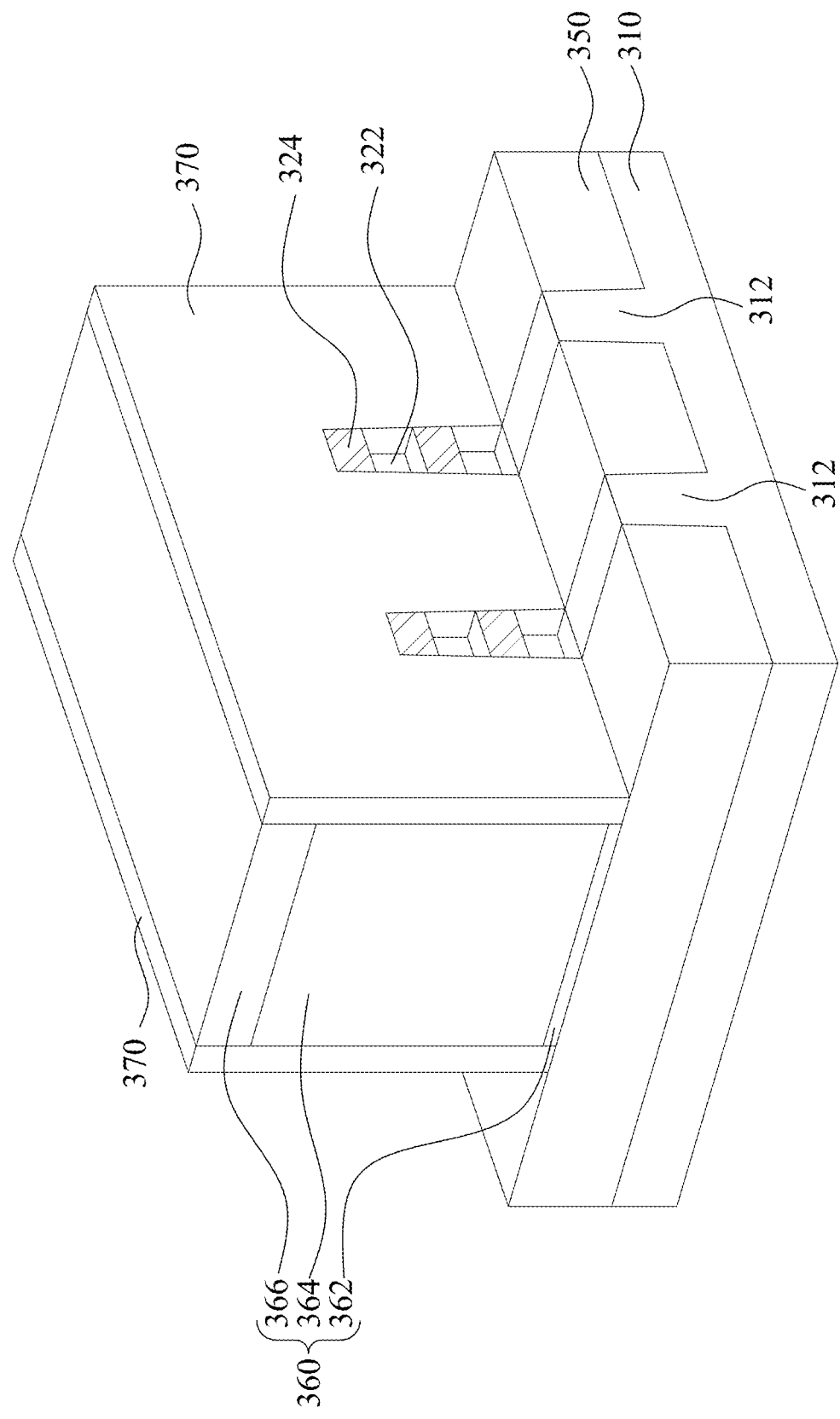

Reference is made to FIG. 17. The exposed portions of the fin structures 326 are removed by using a strained source/drain (SSD) etching process. The SSD etching process may be performed in a variety of ways. In some embodiments, the SSD etching process may be performed by a dry chemical etch with a plasma source and a reaction gas. In some other embodiments, the SSD etching process may be performed by a wet chemical etch. In yet some other embodiments, the SSD etch step may be performed by a combination of a dry chemical etch and a wet chemical etch.

Subsequently, the first semiconductor layers 322 are horizontally recessed (etched) so that the second semiconductor layers 324 laterally extend past opposite end surfaces of the first semiconductor layers 322. In some embodiments, end surfaces of the first semiconductor layers 322 may be substantially vertically aligned with the side surfaces of the gate spacer 370.

Figure 18:
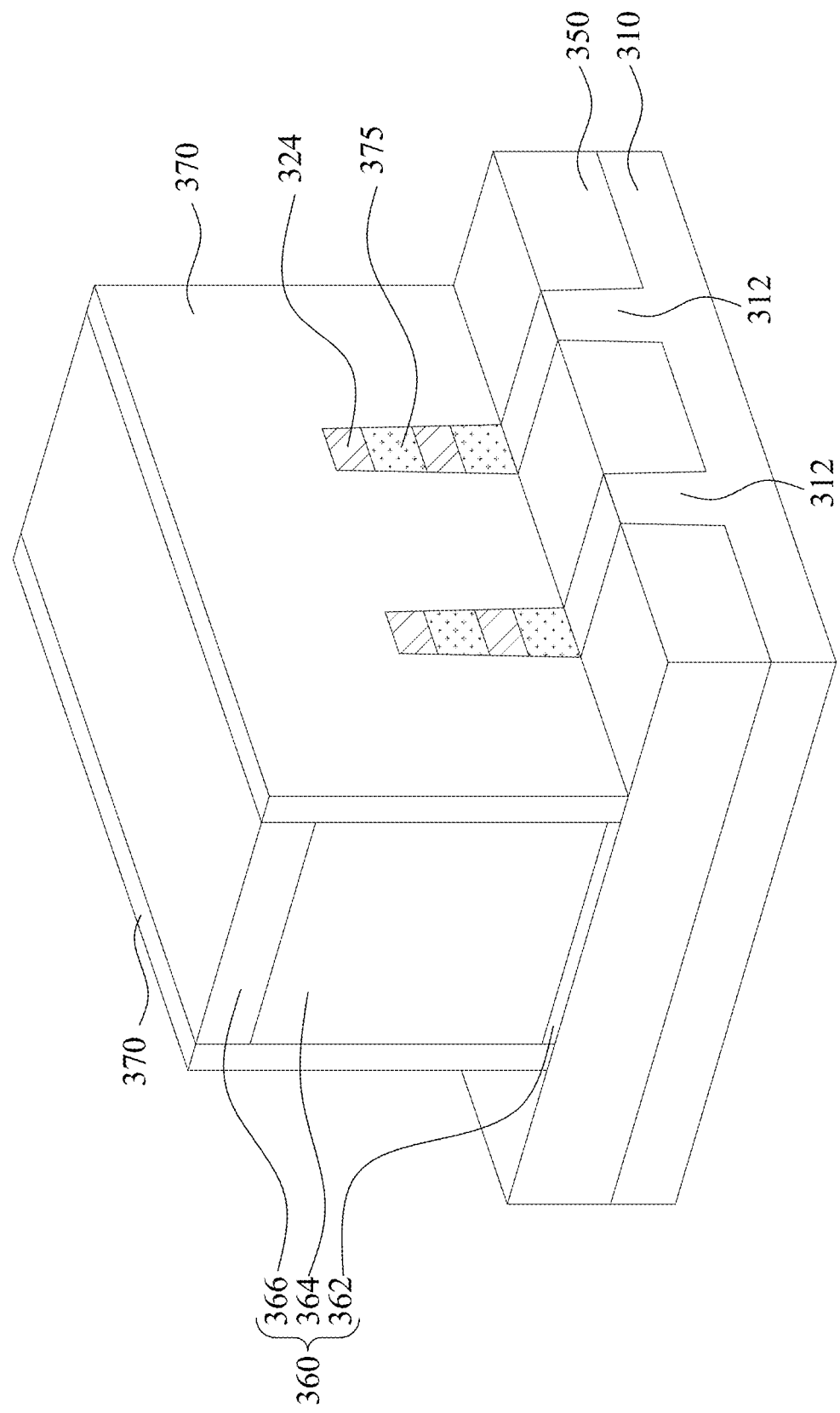

Reference is made to FIG. 18. After the first semiconductor layers 322 (see FIG. 17) are horizontally recessed, inner spacers 375 are formed on the recessed surfaces of the first semiconductor layers 322, as shown in FIG. 18. Formation of the inner spacer 375 includes depositing an inner spacer material layer (e.g., silicon nitride), followed by etching back the inner spacer material layer by an anisotropic etching process, to remove the inner spacer material layer from the substrate 310. In some embodiments, the inner spacers 375 include insulating material such as silicon nitride or the like.

Figure 19:
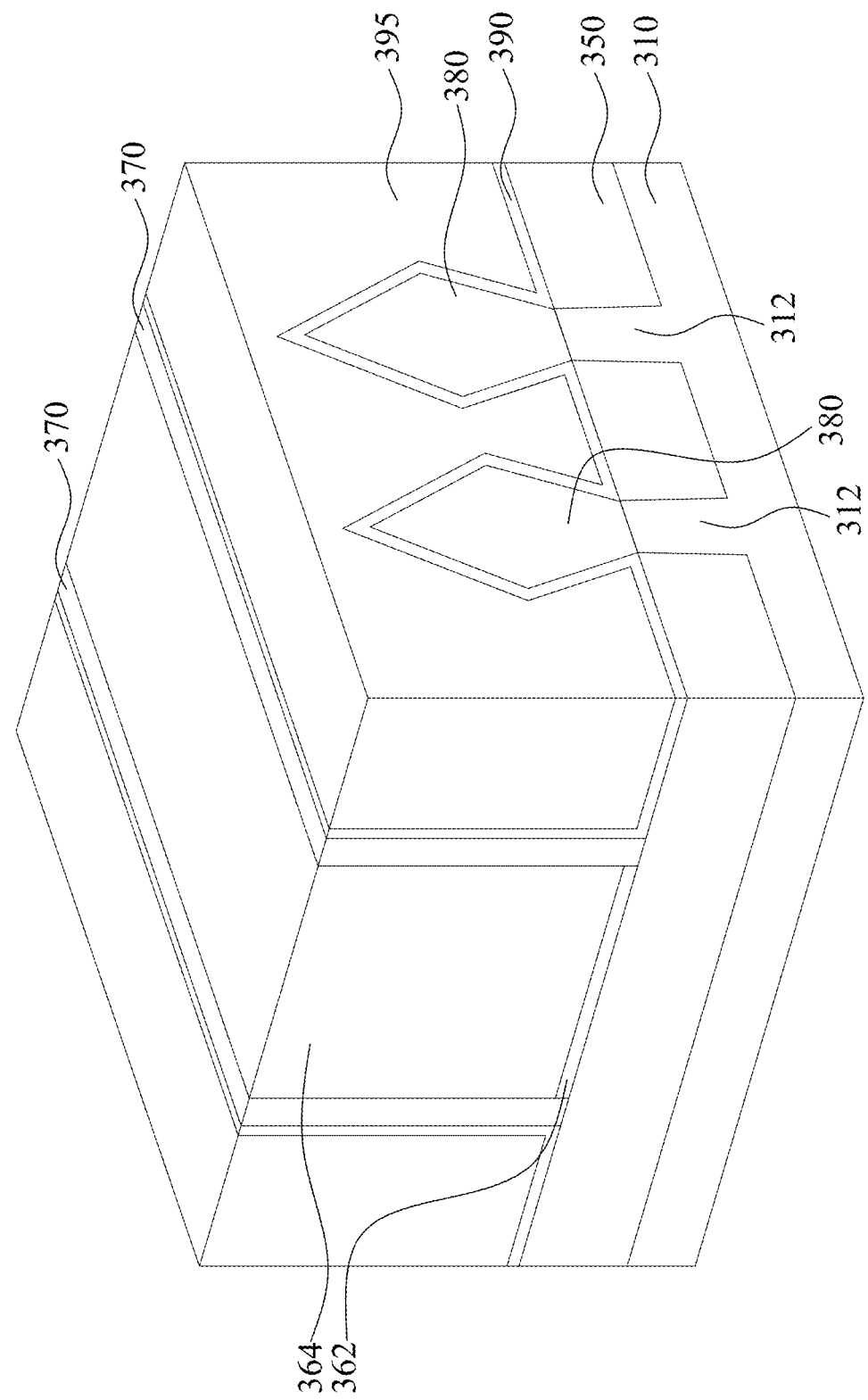

Reference is made to FIG. 19. Epitaxial structures 380, which are referred to as source/drain regions, are epitaxially grown from the exposed base portions 312. The manufacturing processes and/or materials of the epitaxial structures 380 are similar to or the same as the epitaxial structures 180 shown in FIG. 6, and, therefore, a description in this regard will not be repeated hereinafter.

A contact etch stop layer (CESL) 390 is conformally formed over the epitaxial structures 380, and an interlayer dielectric (ILD) 395 is then formed on the CESL 390. After a CMP process, the mask layer 366 (see FIG. 18) is removed, and the dummy gate layer 364 is exposed. The manufacturing processes and/or materials of the CESL 390 and the ILD 395 are similar to or the same as the CESL 190 and the ILD 195 shown in FIG. 7, and, therefore, a description in this regard will not be repeated hereinafter.

Figure 20A:
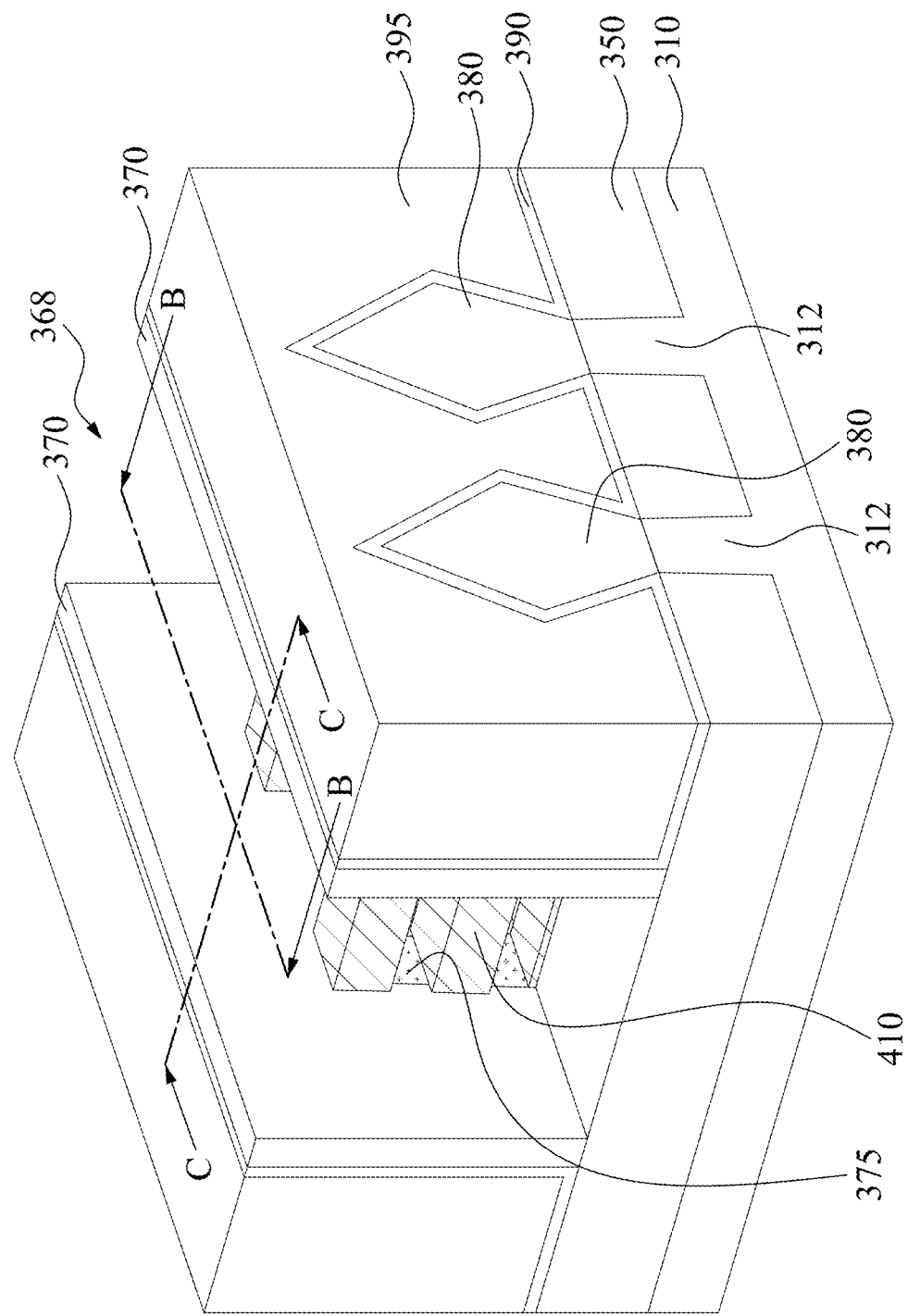
Figure 20B:
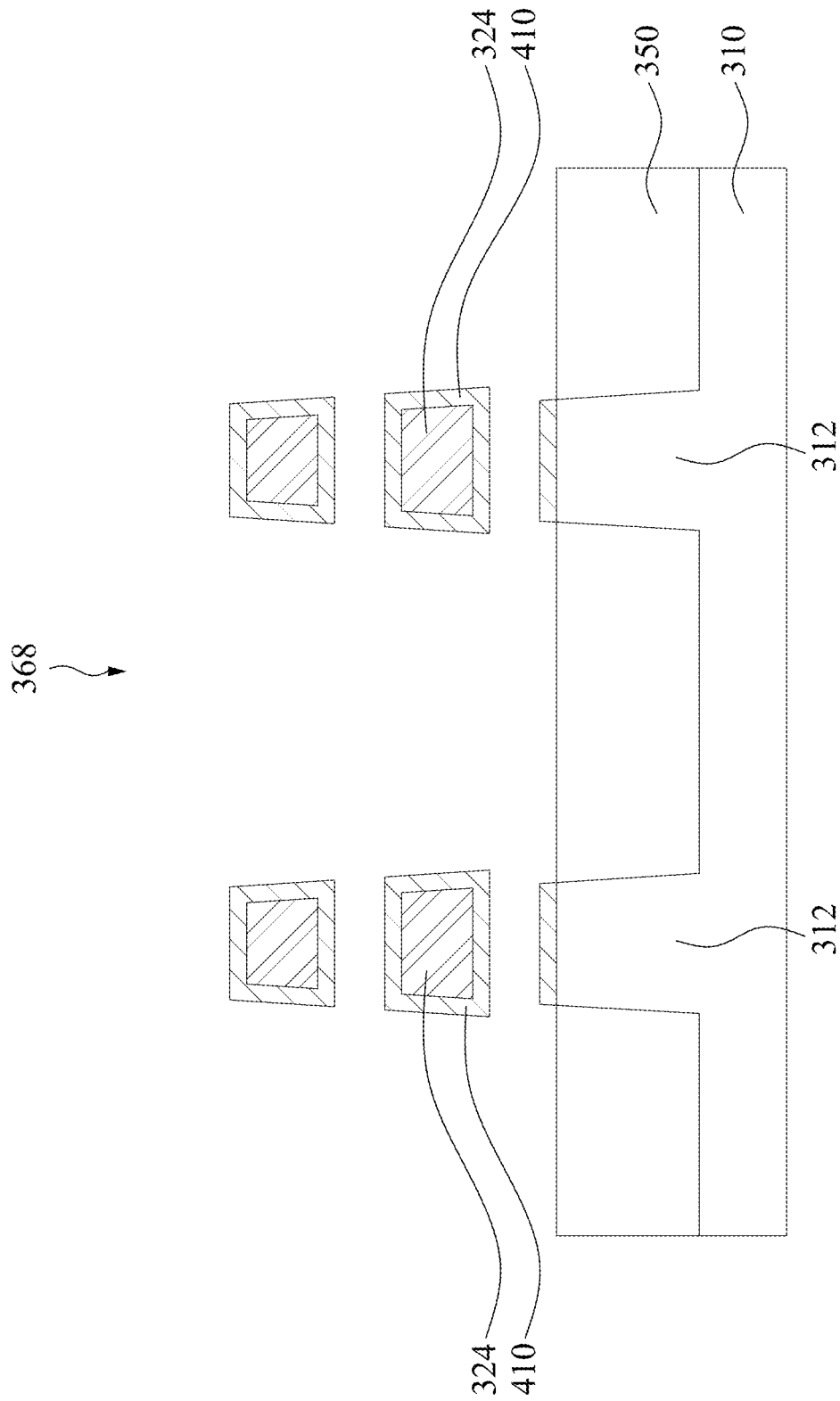
Figure 20C:
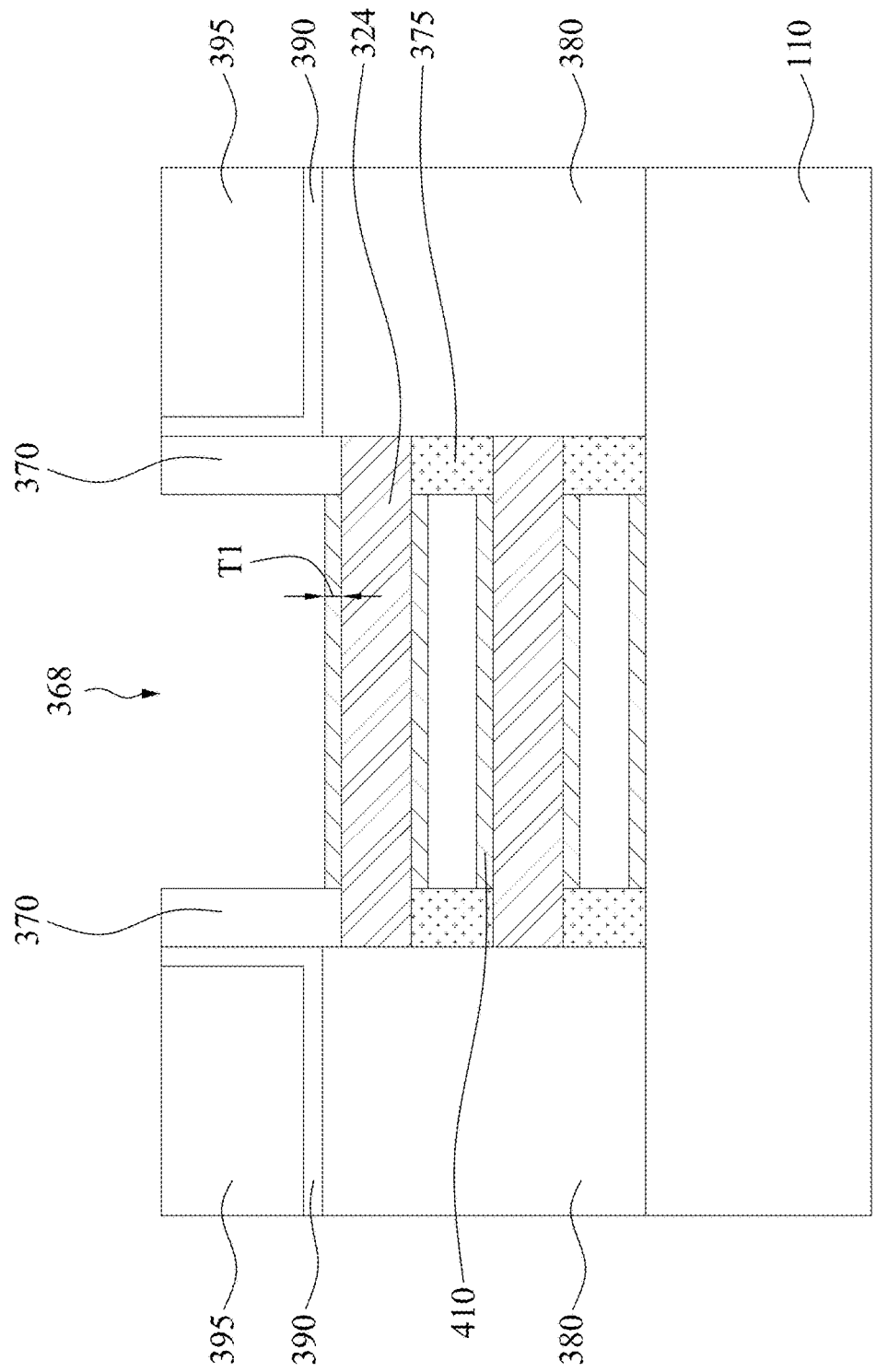

Reference is made to FIGS. 20A-20C, where FIG. 20B is a cross-sectional view taken along line B-B of FIG. 20A, and FIG. 20C is a cross-sectional view taken along line C-C of FIG. 20A. The dummy gate layer 364 and the dummy gate dielectric layer 362 (see FIG. 19) are then removed. Further, the first semiconductor layers 322 (see FIG. 17) are also removed, thereby forming a gate trench 368 between the gate spacers 370 (or between the inner spacers 375) and exposing the second semiconductor layers 324. The ILD 395 protects the epitaxial structures 380 during the removal of the dummy gate layer 364, the dummy gate dielectric layer 362, and the first semiconductor layers 322. The dummy gate layer 364, the dummy gate dielectric layer 362, and the first semiconductor layers 322 can be removed using plasma dry etching and/or wet etching.

Semiconductive protection layers (e.g., silicon-containing protection layer) 410 are formed to surround the second semiconductor layers 324 and above the base portions 312 of the substrate 310. In some embodiments, the semiconductive protection layers 410 are formed by a suitable process such as molecular beam epitaxy (MBE). In some embodiments, the semiconductive protection layers 410 are formed at a temperature lower than about 300° C., e.g., in a range of about −196° C. to about 300° C. or in a range of room temperature to about 300° C. The low temperature MBE process (e.g., lower than about 300° C.) suppresses the diffusion of germanium atoms in the second semiconductor layers 324 or the base portions 312 toward outer surfaces of the semiconductive protection layers 410. As such, the germanium atomic percentage in the semiconductive protection layer 410 is relatively low. With the suppression of the germanium diffusion, the outer surface of the semiconductive protection layer 410 is smooth, such that electron mobility in the semiconductive protection layer 410 and in the second semiconductor layers 324 can be improved. If the semiconductive protection layer 410 is formed at a temperature lower than about −196° C., the semiconductive protection layer 410 may be formed of amorphous silicon.

The semiconductive protection layer 410 includes semiconductive materials such as silicon. In some embodiments, the semiconductive protection layer 410 may be a pure silicon layer. The semiconductive protection layer 410 may also be a substantially pure silicon layer, for example, with a germanium atomic percentage lower than about 10 percent due to the low temperature MBE process. For example, the germanium concentration decreases in a direction from the outer surface toward the inner surface of the semiconductive protection layer 410. Other methods to form the semiconductive protection layers 410 include chemical vapor deposition (CVD), atomic layer deposition (ALD), or other suitable processes. In some embodiments, the semiconductive protection layer 410 has a thickness T1.

During the formation of the semiconductive protection layer 410, the semiconductive protection layer 410 is substantially non-oxidized. That is, there is substantially no oxide layer formed above the semiconductive protection layer 410 during the formation of the semiconductive protection layer 410. Or, the semiconductive protection layer 410 is in direct contact with the following formed gate dielectric layer 420 (see FIGS. 21A-21C). With such configuration, the germanium in the semiconductive protection layer 410 (if germanium exists therein) would not be oxidized to form $GeO_x$, which may raise bias temperature instability (BTI) of the resulting semiconductor device.

Figure 21A:
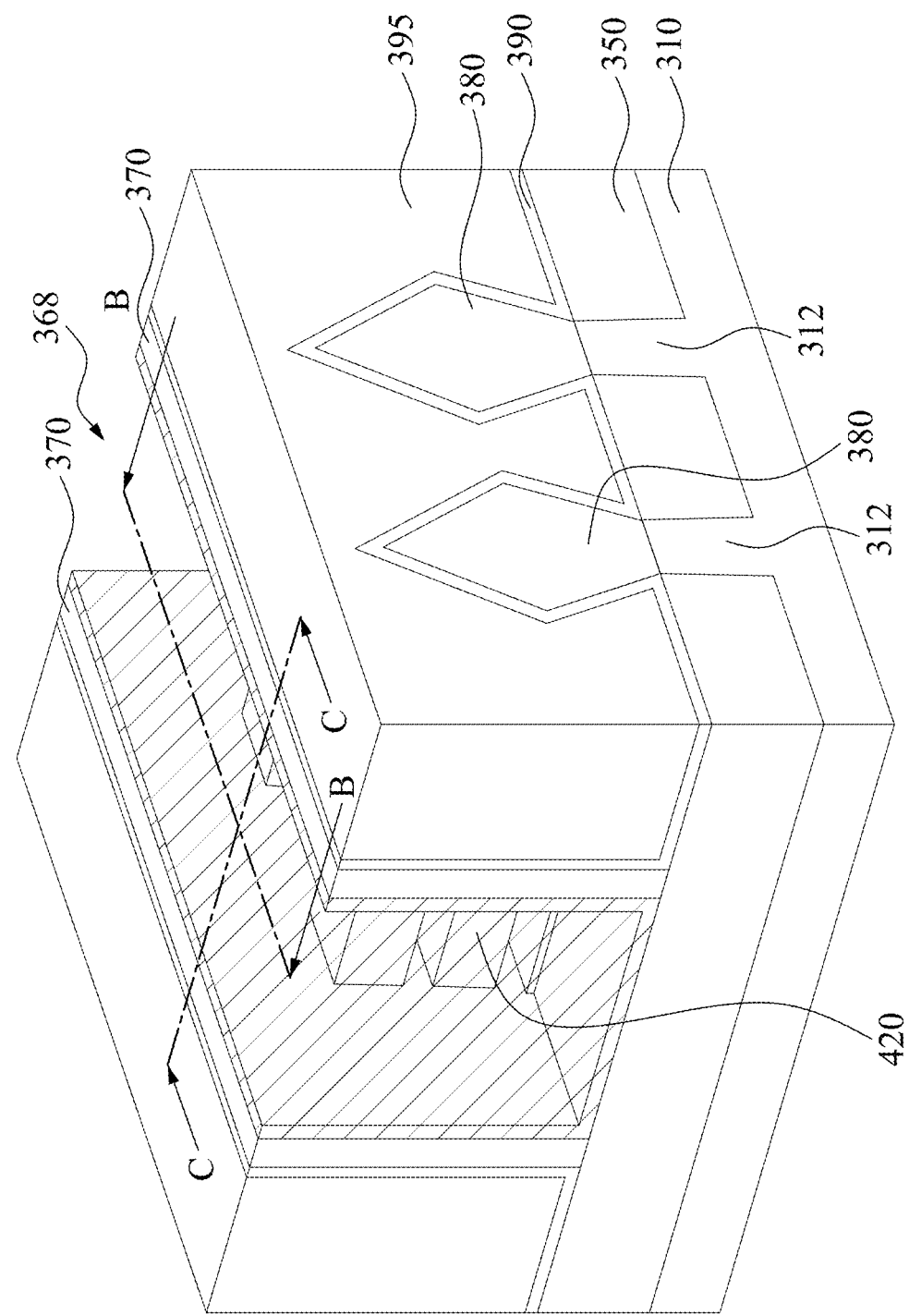
Figure 21B:
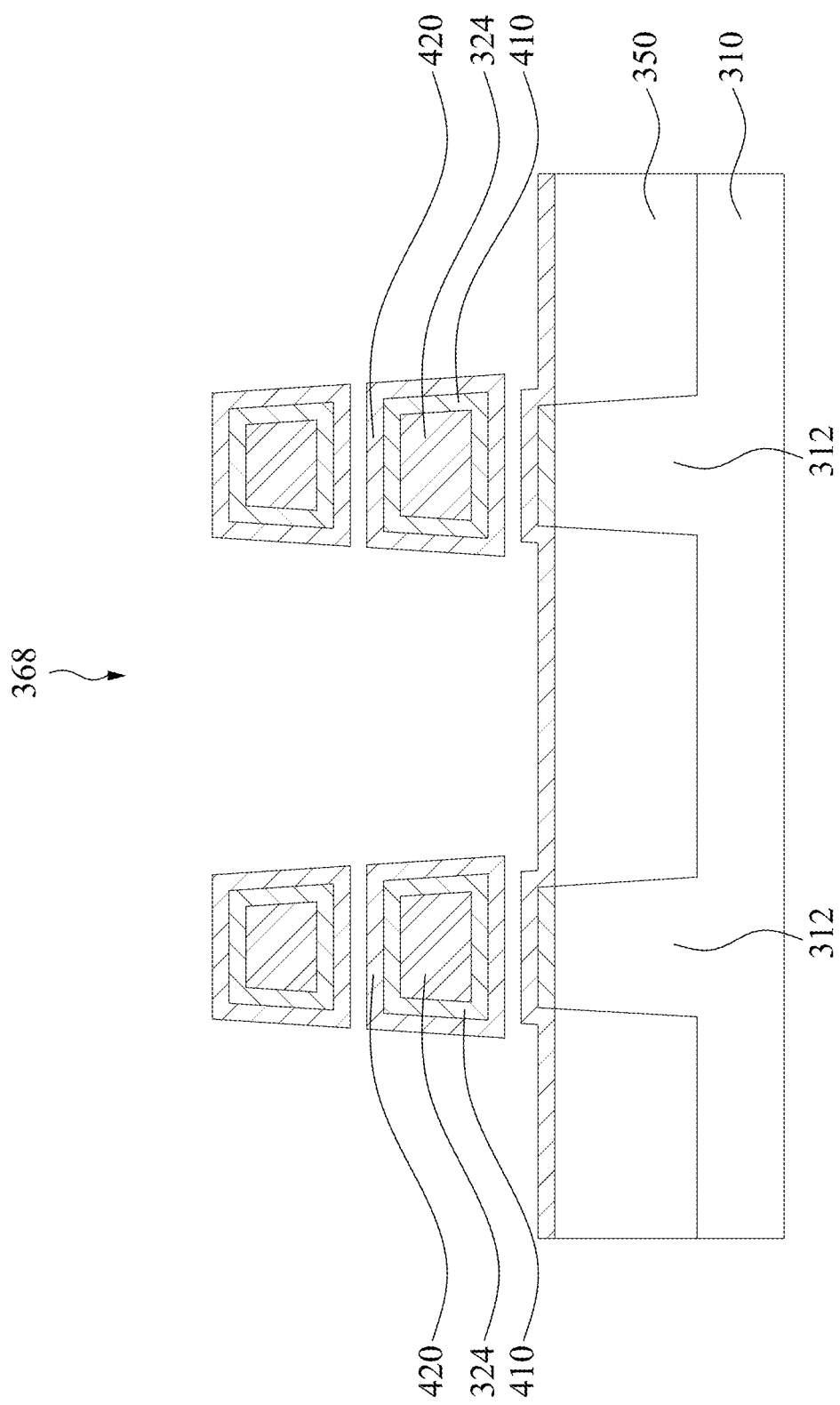
Figure 21C:
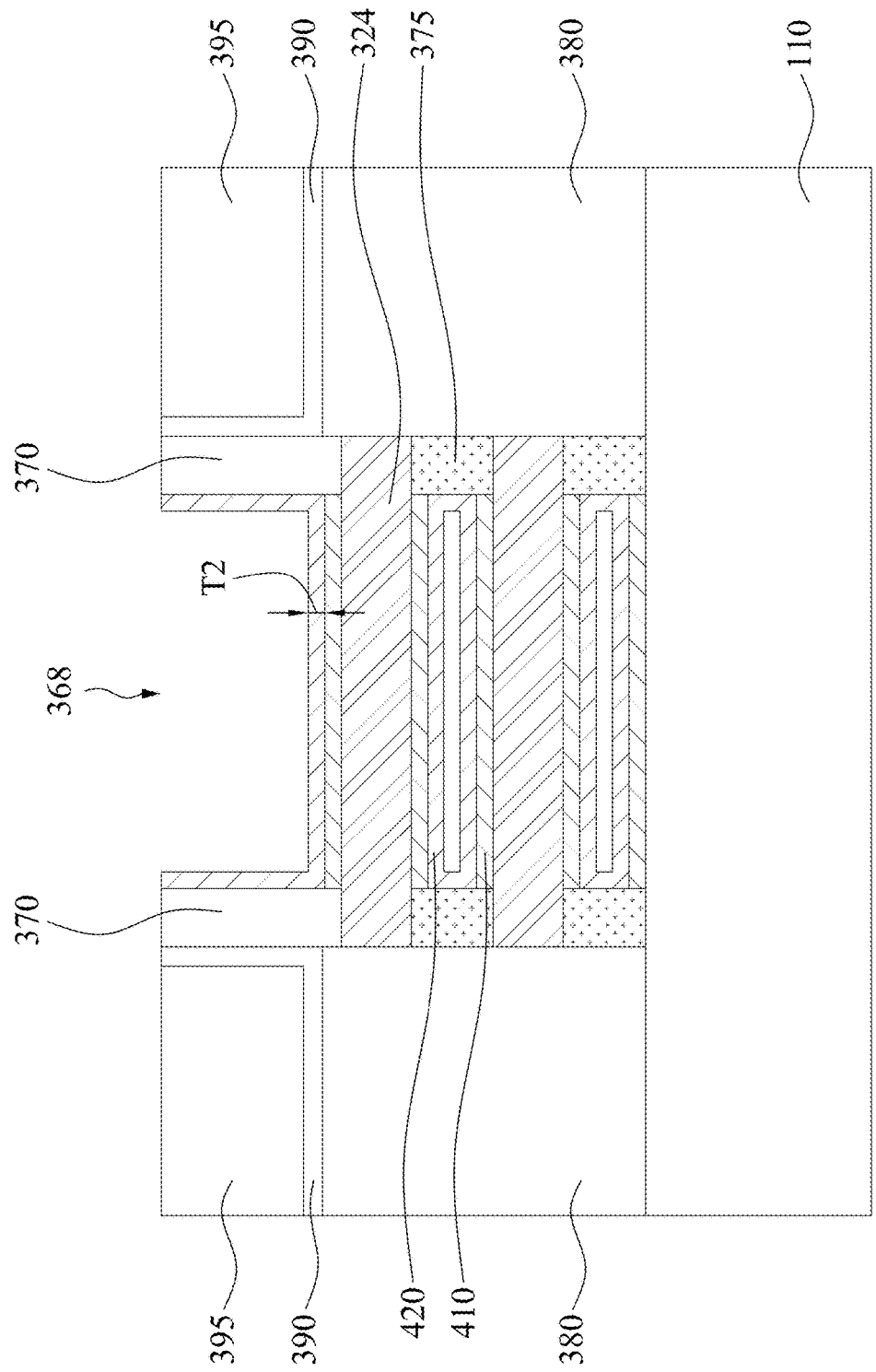

Reference is made to FIGS. 21A-21C, where FIG. 21B is a cross-sectional view taken along line B-B of FIG. 21A, and FIG. 21C is a cross-sectional view taken along line C-C of FIG. 21A. A gate dielectric layer 420 is conformally formed in the gate trench 368 and surrounds the semiconductive protection layer 410. The gate dielectric layer 420 may be a high-κ dielectric layer having a dielectric constant (κ) higher than the dielectric constant of $SiO_2$, i.e. κ>3.9. The gate dielectric layer 420 may include $LaO_x$, $AlO_x$, $ZrO_x$, TiO, $HfO_x$, $TaO_x$, $GdO_x$, $YO_x$, $SrTiO_3$ (STO), $BaTiO_3$ (BTO), BaZrO, HfZrO, $ZrSiO_x$, HfLaO, $HfSiO_x$, HfSiON, $LaSiO_x$, $AlSiO_x$, $GdSiO_x$, $YSiO_x$, HfTaO, HfTiO, $(Ba,Sr)TiO_3$ (BST), $Al_2O_3$, $Si_3N_4$, oxynitrides (SiON), or other suitable materials. In some embodiments, the gate dielectric layer 420 is a single layer. In some other embodiments, the gate dielectric layer 420 includes multiple layers, e.g., a $HfO_2$ layer and an $Al_2O_3$ layer above the $HfO_2$ layer. The gate dielectric layer 420 is deposited by suitable techniques, such as ALD, CVD, PVD, thermal oxidation, combinations thereof, or other suitable techniques. In some embodiments, the gate dielectric layer 420 has a thickness T2 in a range of about 1 nm to about 2 nm when the gate dielectric layer 420 is a single layer. In some other embodiments, the gate dielectric layer 420 has a thickness T2 in a range of about 1 nm to about 10 nm when the gate dielectric layer 220 includes multiple layers.

After the deposition of the gate dielectric layer 420, a post-deposition annealing (PDA) process may be performed on the gate dielectric layer 420 and the semiconductive protection layer 410. The post-deposition annealing improves the interfacial and bulk properties of the gate dielectric layer 420. In some embodiments, the post-deposition annealing process is performed at a temperature in a range of about 200° C. to about 1000° C., e.g., about 600° C. In some embodiments, the post-deposition annealing process is carried out in air, or those gases with low reactivity such as $N_2$, He, Ar, or highly reactive gas such as $O_2$, $H_2$ or mixture of the gases aforementioned.

Figure 22A:
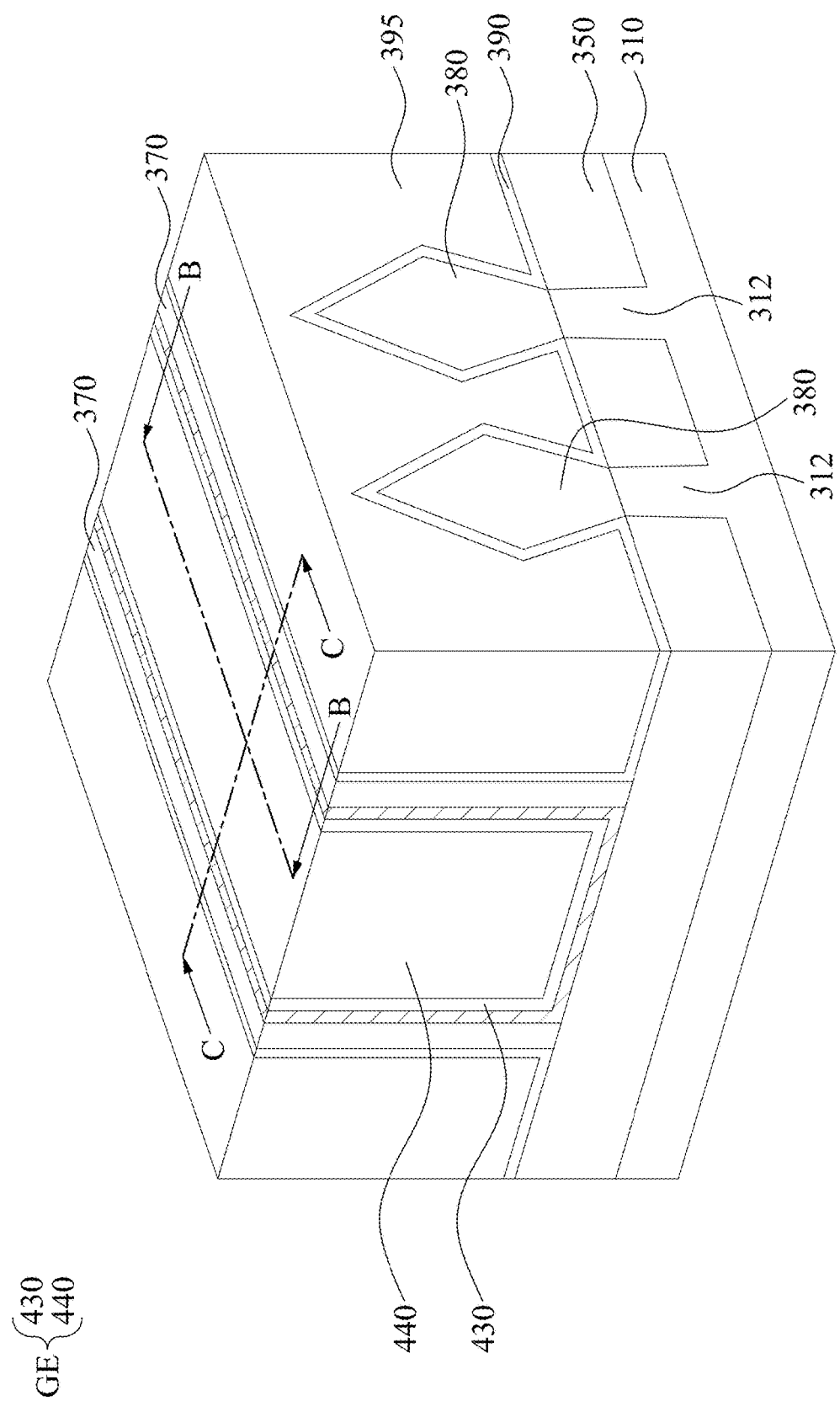
Figure 22B:
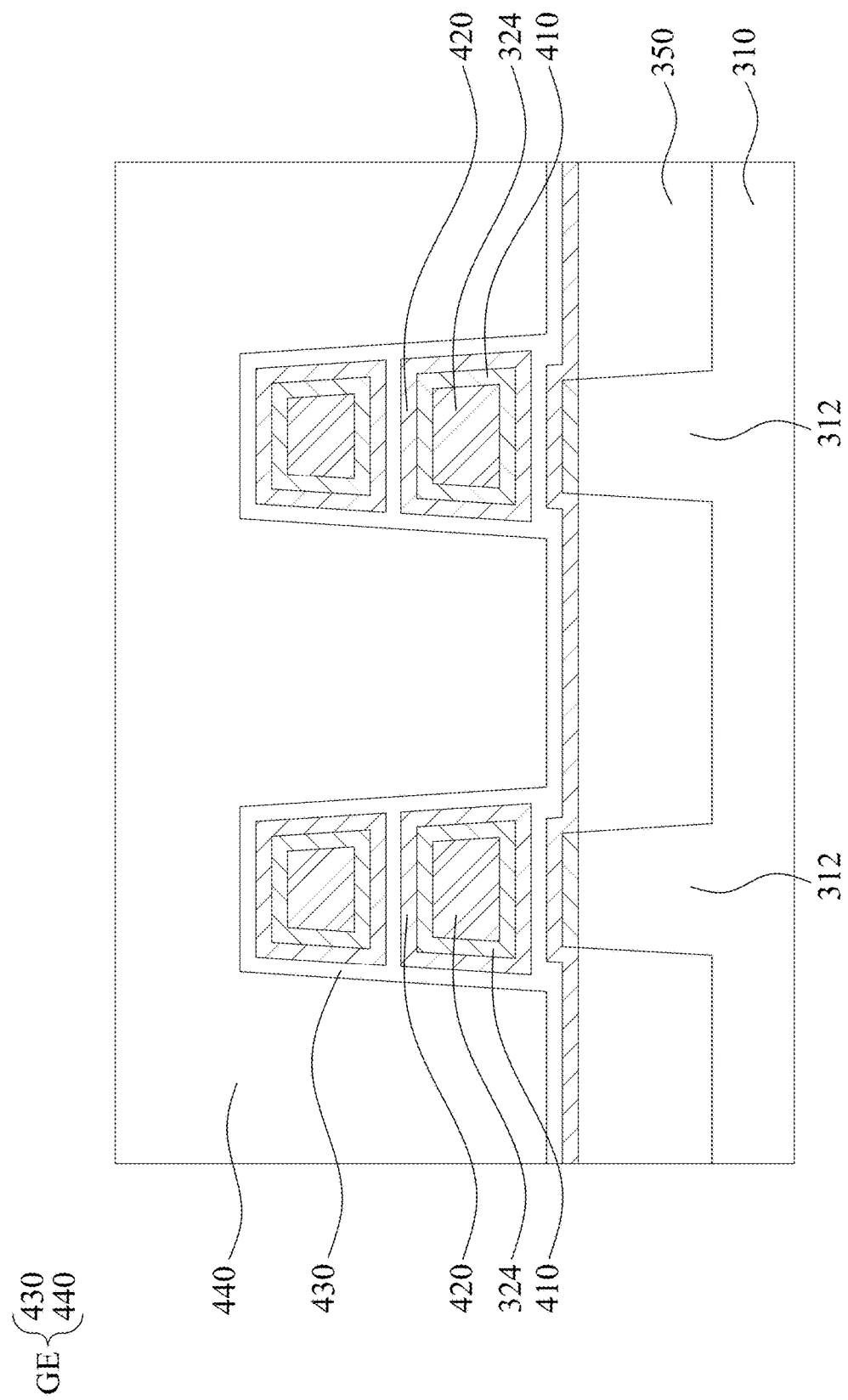
Figure 22C:
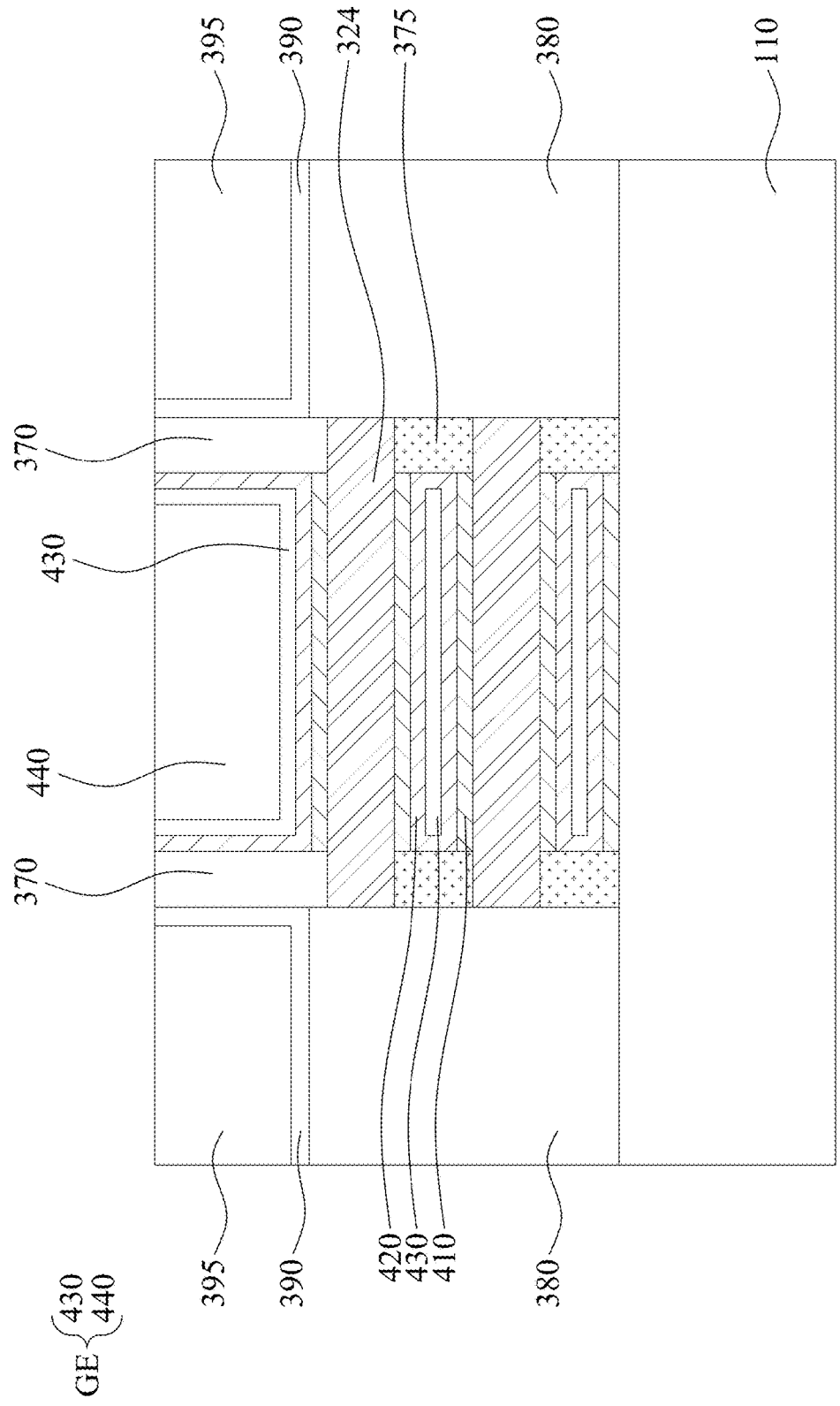

Reference is made to FIGS. 22A-22C, where FIG. 22B is a cross-sectional view taken along line B-B of FIG. 22A, and FIG. 22C is a cross-sectional view taken along line C-C of FIG. 22A. A gate electrode GE is formed above the gate dielectric layer 420 and fill the gate trench 368 (see FIGS. 21A-21C). In some embodiments, the gate electrode GE include at least one work function metal layer(s) 430, a fill layer 440, and/or other suitable layers that are desirable in a metal gate stack. The work function metal layer 430 may include n-type and/or p-type work function metal. Exemplary n-type work function metals include Ti, Ta, Ag, TiAl, TaAl, TaAlC, TiAlN, TaC, TiC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, other suitable p-type work function materials, or combinations thereof. The work function metal layer 430 may have multiple layers. The work function metal layer(s) 430 may be deposited by CVD, PVD, electroplating and/or other suitable process. In some embodiments, the fill layer 440 in the metal gate electrodes GE may include tungsten (W), Mo, Ru, or other suitable conductive materials. The fill layer 440 may be deposited by ALD, PVD, CVD, or other suitable process.

Figure 23A:
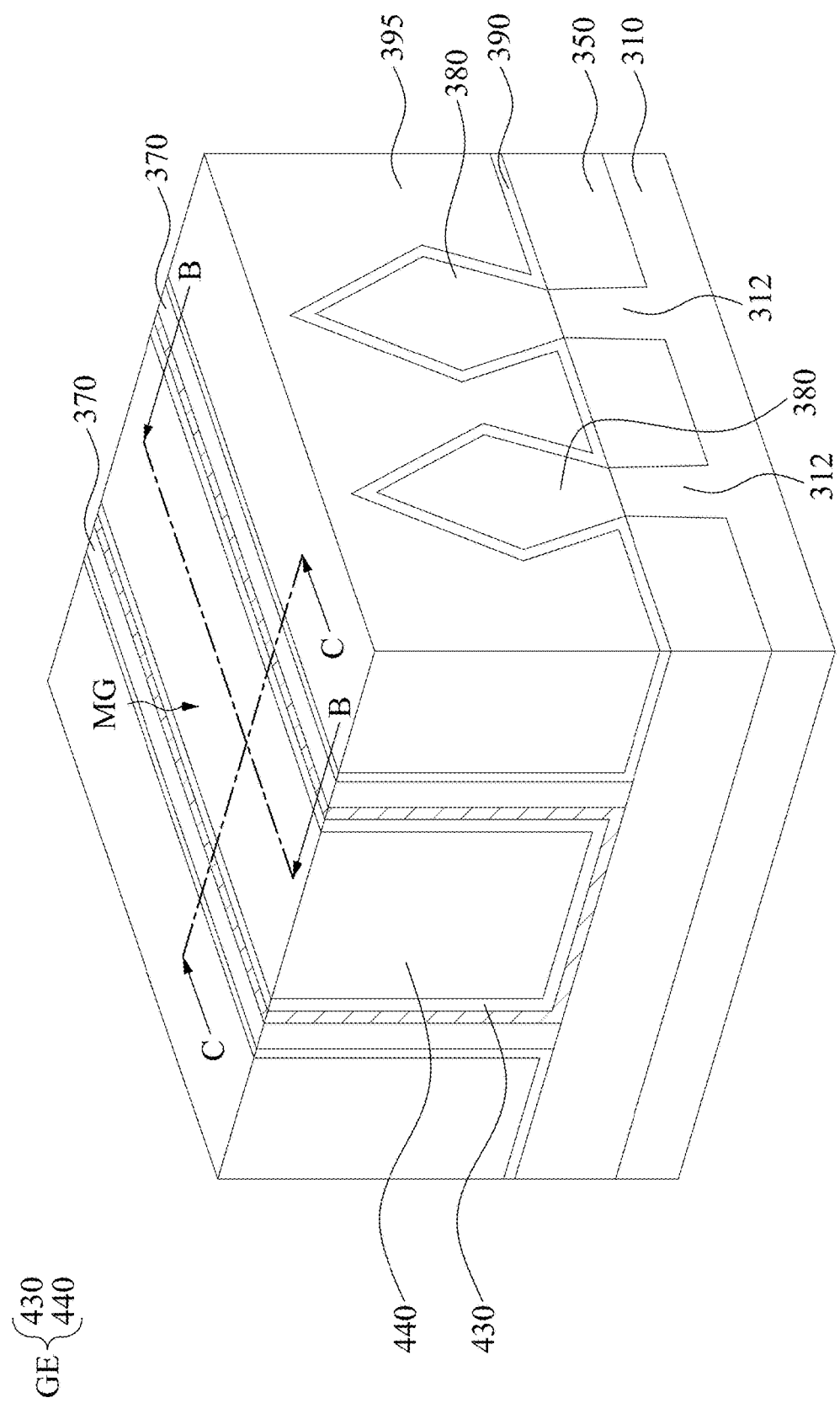
Figure 23B:
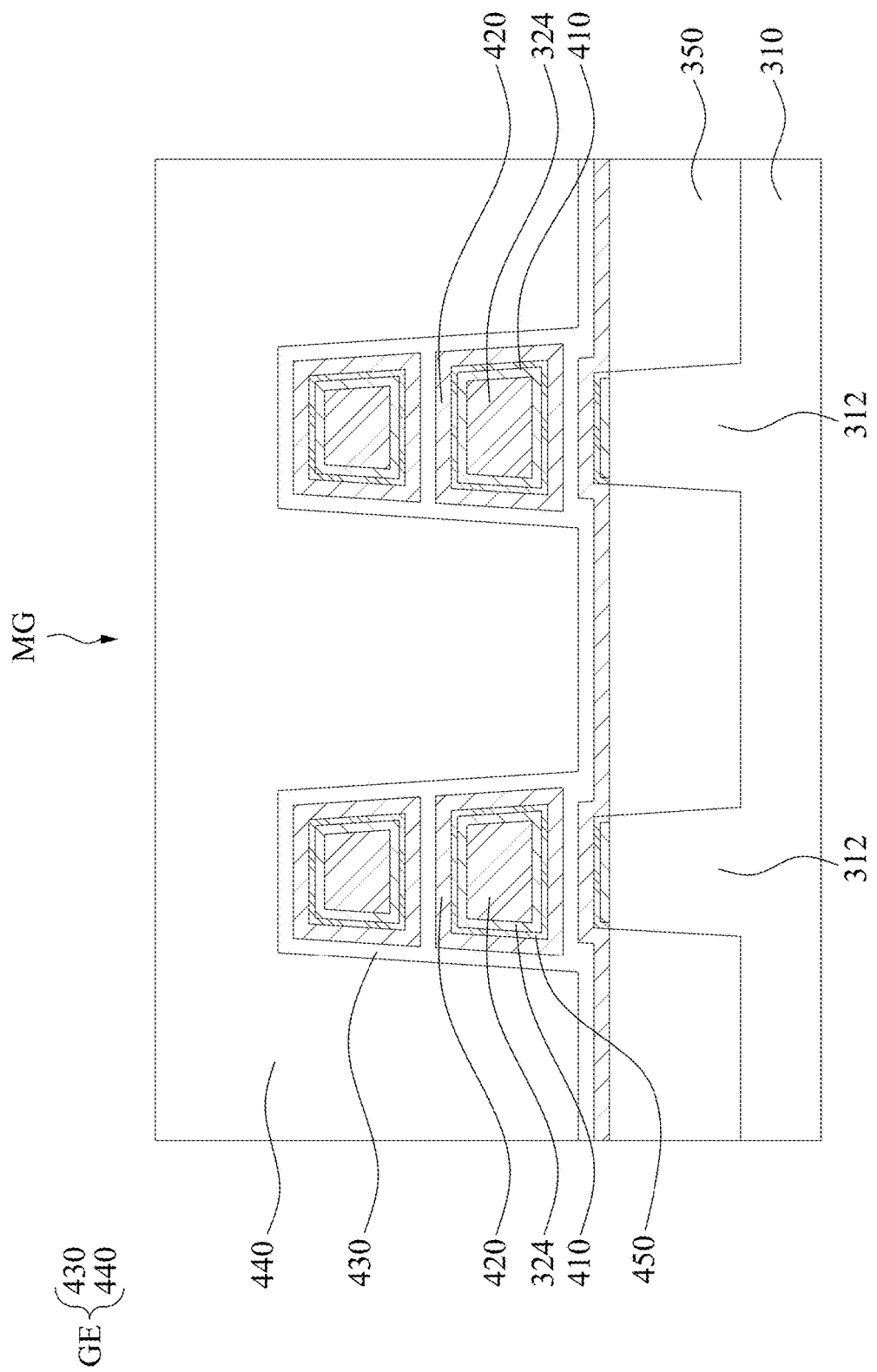
Figure 23C:
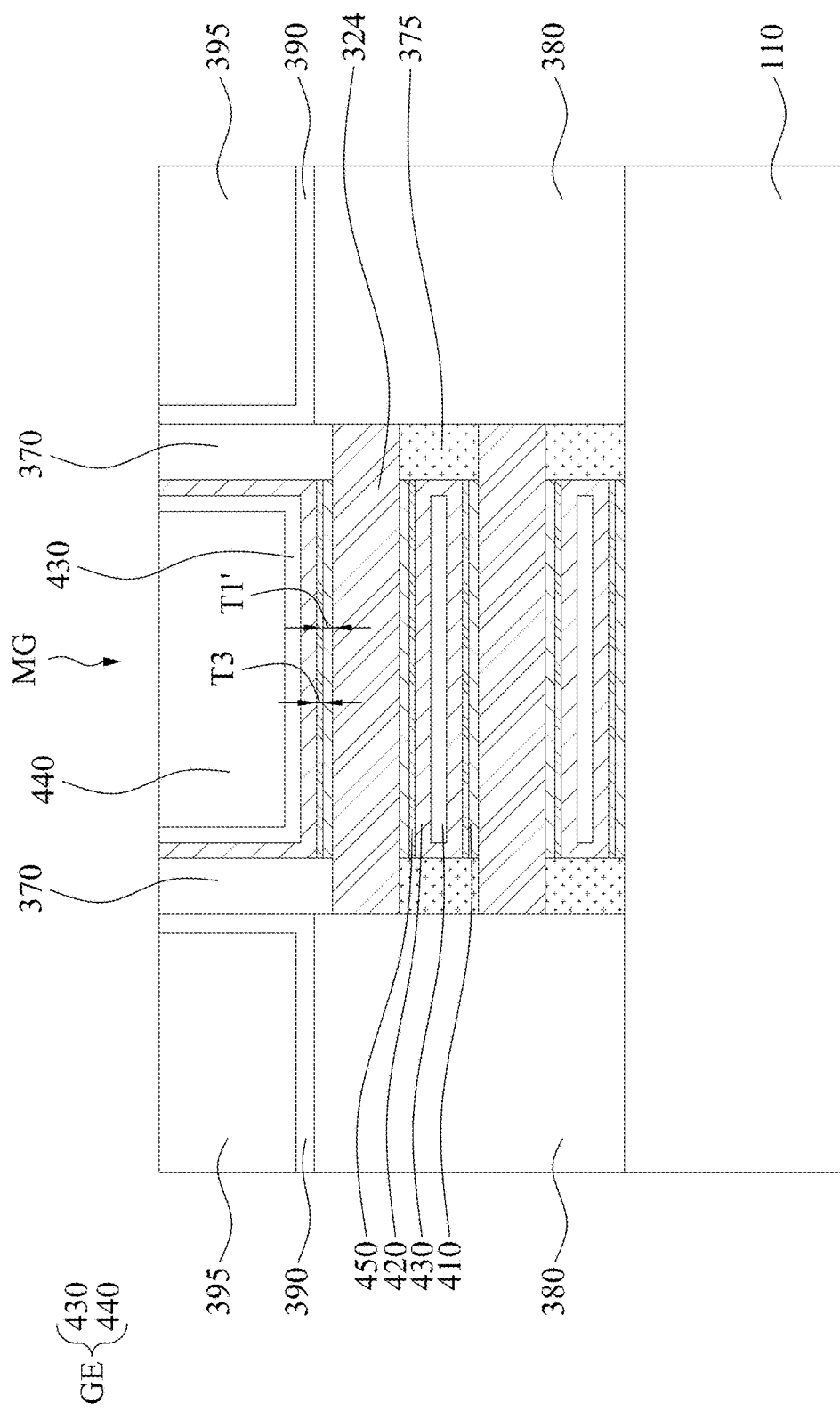

Reference is made to FIGS. 23A-23C, where FIG. 23B is a cross-sectional view taken along line B-B of FIG. 23A, and FIG. 23C is a cross-sectional view taken along line C-C of FIG. 23A. An interfacial layer 450 is formed between the semiconductive protection layer 410 and the gate dielectric layer 420. As such, the interfacial layer 450, the gate dielectric layer 420, and the gate electrode GE are together referred to as a gate structure MG. For example, a post-gate forming gas annealing (FGA) process is performed on the semiconductive protection layer 410, the gate dielectric layer 420, and the gate electrode GE. In some embodiments, the FGA process is performed at a temperature in a range of about 200° C. to about 500° C., e.g., about 400° C. In some embodiments, the FGA process is carried out processing gases of a mixture of hydrogen ($H_2$) and an inert gas such as $N_2$, He, and/or Ar. The $H_2$ concentration of the processing gases can be about 0.1% to 100%. For example, the processing gases include about 15% $H_2$ gas and about 85% $N_2$ gas. In some embodiments, the interfacial layer 450 has a thickness T3 in a range of about 1 angstrom to about 20 angstroms, which could provide low interfacial traps but suitable EOT in the range of thickness.

The interfacial layer 450 is formed by oxidizing a portion of the semiconductive protection layer 410 near the gate dielectric layer 420. As such, the interfacial layer 450 and the semiconductive protection layer 410 include the same chemical element(s), e.g., silicon in this case. That is, the interfacial layer 450 includes $SiO_x$. In some embodiments, rare or some germanium may diffuse to the top surface of the semiconductive protection layer 410 (i.e., the interface between the semiconductive protection layer 410 and the gate dielectric layer 420), such that the interfacial layer 450 may further include a small amount of $GeO_x$. Further, the oxygen atoms in the interfacial layer 450 may be diffused from the gate dielectric layer 420, such that an oxygen atomic concentration of the gate dielectric layer 420 decreases in a direction from the gate electrode GE toward the interfacial layer 450. After the formation of the interfacial layer 450, the thickness T1 (see FIG. 20C) of the semiconductive protection layer 410 is decreased to be the thickness T1'. In some embodiments, the thickness T1' of the semiconductive protection layer 410 is greater than the thickness T3 of the interfacial layer 450.

Figure 24A:
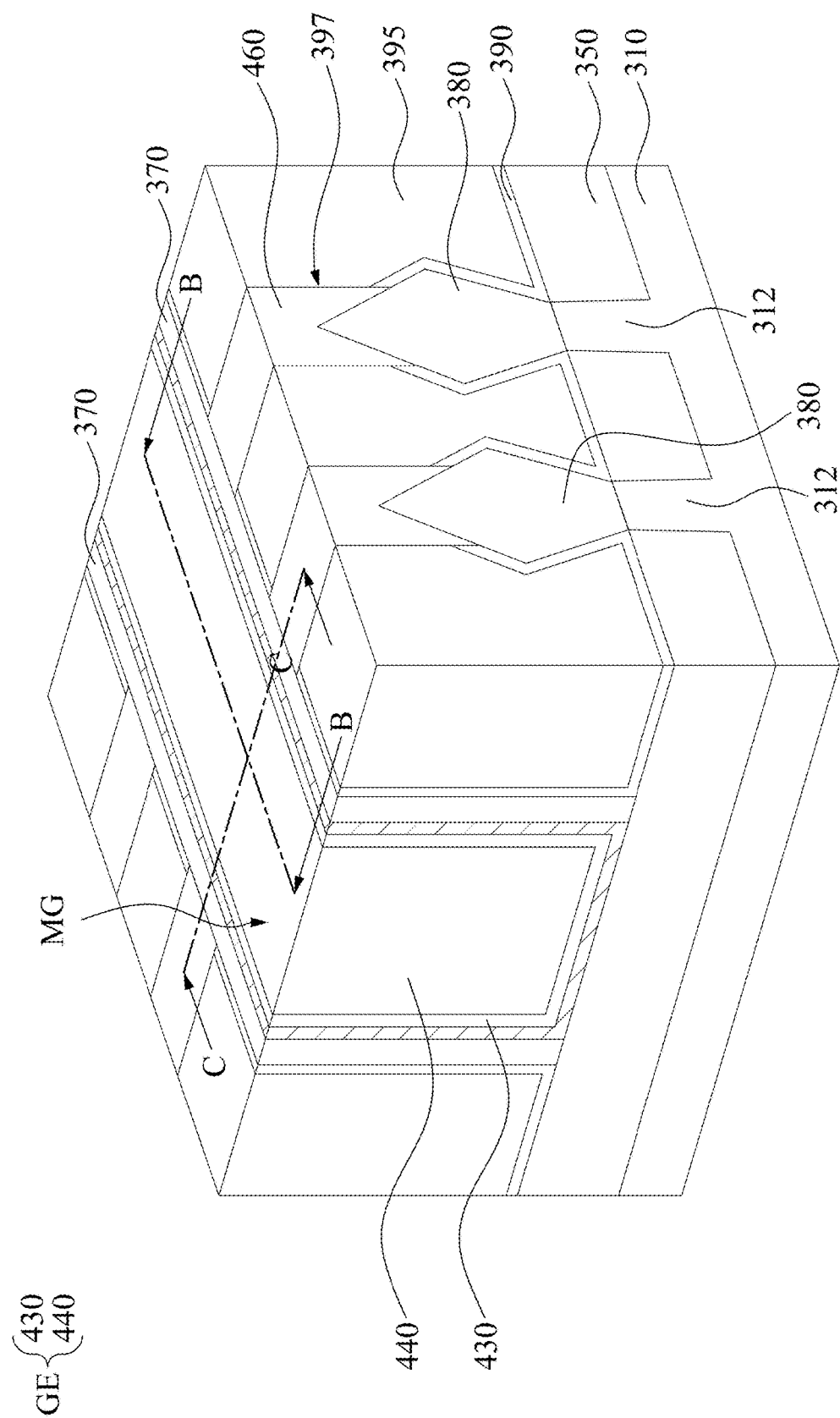
Figure 24B:
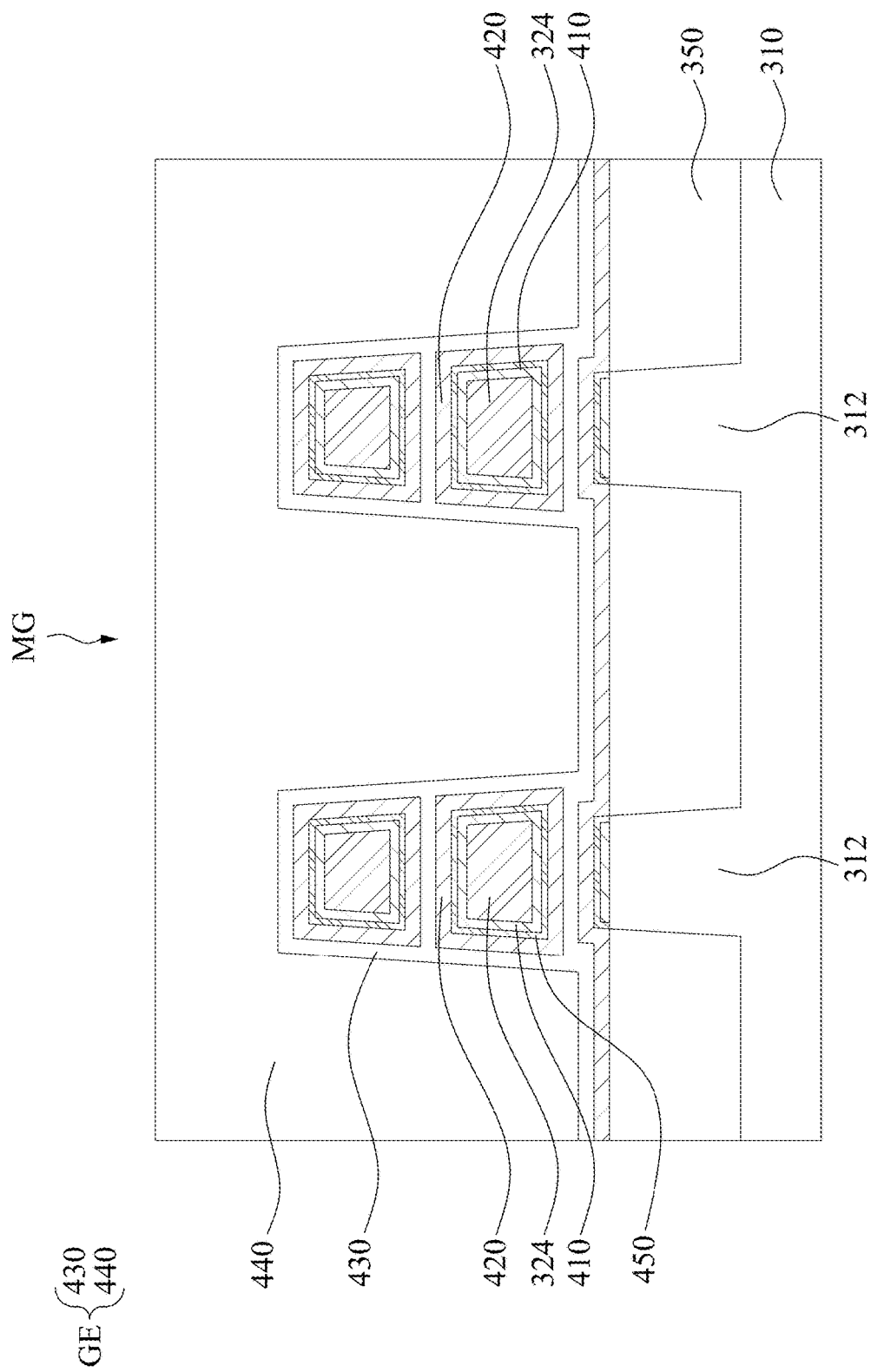
Figure 24C:
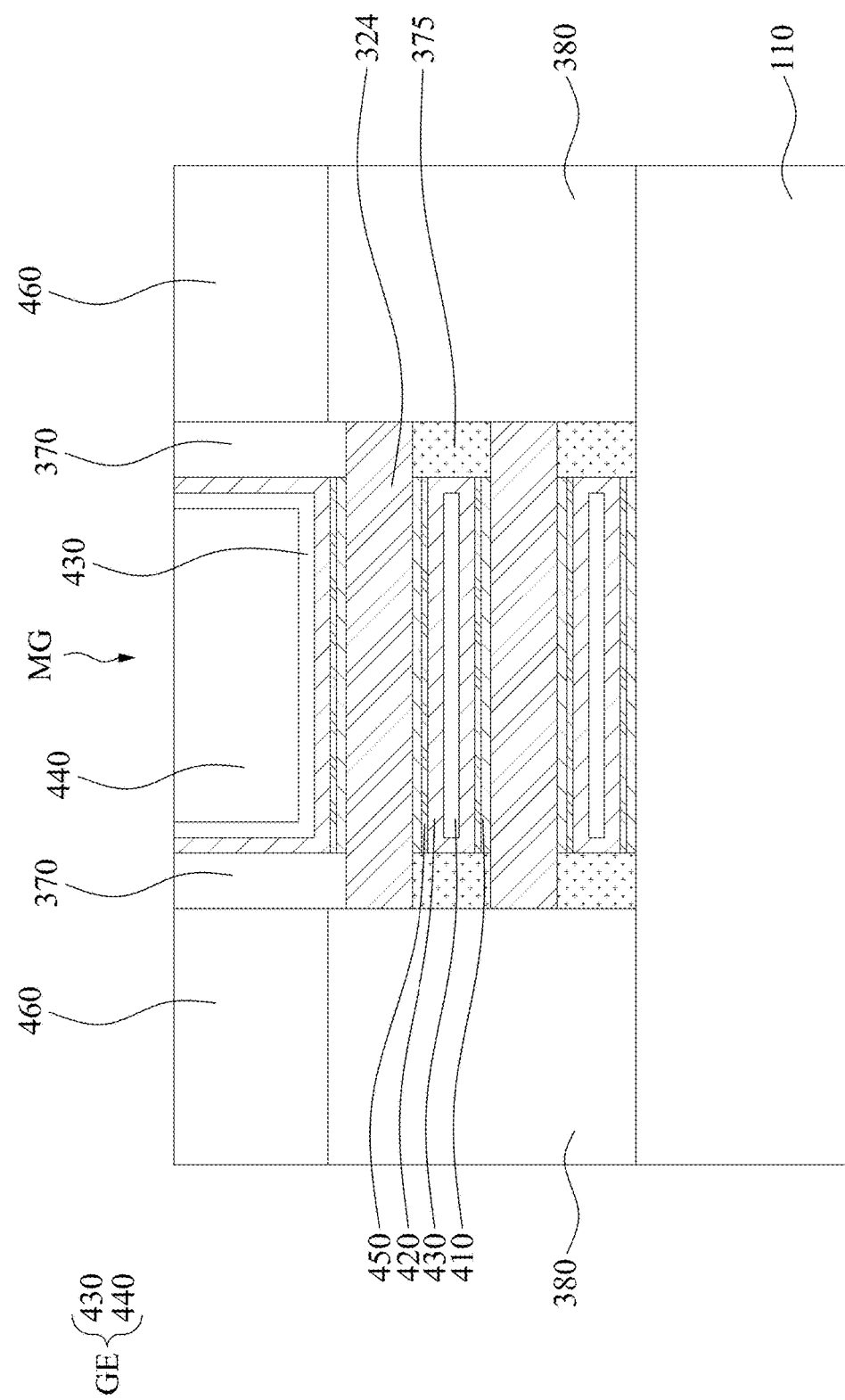

Reference is made to FIGS. 24A-24C, where FIG. 24B is a cross-sectional view taken along line B-B of FIG. 24A, and FIG. 24C is a cross-sectional view taken along line C-C of FIG. 24A. The ILD 395 is patterned to form trenches 397 on opposite sides of the gate structure MG, and then the CESL 390 is patterned to expose the epitaxial structures 380. In some embodiments, multiple etching processes are performed to pattern the ILD 395 and the CESL 390. The etching processes include dry etching process, wet etching process, or combinations thereof.

Contacts 460 are formed in the trenches 397. As such, the contacts 460 are respectively in contact with the epitaxial structures 380. The manufacturing processes and/or materials of the contacts 460 are similar to or the same as the contacts 260 shown in FIGS. 12A-12C, and, therefore, a description in this regard will not be repeated hereinafter.

In FIGS. 24A-24C, the second semiconductor layers 324 and/or the base portions 312 include germanium. The semiconductive protection layer 410 is in direct contact with the second semiconductor layers 324 and the base portions 312. In some embodiments, the semiconductive protection layer 410 is a pure silicon layer or a substantially pure silicon layer. As shown in FIG. 24B, the semiconductive protection layers 410 respectively surround the second semiconductor layers 324 and separated from each other. In FIG. 24C, the sidewalls of the semiconductive protection layer 410 are in direct contact with gate spacers 370 or the inner spacers 375 and thus are spaced apart from the epitaxial structures 380. Further, the semiconductive protection layer 410 extends from an inner sidewall of one of the gate spacers 370 (or the inner spacers 375) to an inner sidewall of another one of the gate spacers 370 (or the inner spacers 375). In some embodiments, the semiconductive protection layer 410 has a thickness T1' in a range of about 1.3125 angstroms to about 26.265 angstroms. That is, the semiconductive protection layer 410 includes one to about 20 monolayers of silicon layers. If thickness T1' of the semiconductive protection layer 410 is greater than about 26.265 angstroms (or greater than about 20 monolayers of silicon layers), the relaxation would occur, and misfit dislocation would result in defect formation in the semiconductive protection layer 410.

The interfacial layer 450 is on and in direct contact with the semiconductive protection layer 410 and the gate dielectric layer 420. Since the interfacial layer 450 is formed by oxidizing a portion of the semiconductive protection layer 410, the interfacial layer 450 and the semiconductive protection layer 410 include the same chemical element(s) (e.g., silicon and/or germanium in this case), and the semiconductive protection layer 410 and the interfacial layer 450 have substantially the same width (as shown in FIG. 24C). The sidewalls of the interfacial layer 450 are in direct contact with the gate spacers 470 or the inner spacers 375. In some embodiments, the thickness T3 (see FIG. 23C) of the interfacial layer 450 is in a range of about 1 angstrom to about 20 angstroms.

The oxygen in the interfacial layer 450 may be diffused from the gate dielectric layer 420. As such, an oxygen concentration of the gate dielectric layer 420 decreases in a direction from the work function metal layer 430 toward the interfacial layer 450. By contrast, a portion of the gate dielectric layer 420 directly above the isolation structure 350 (see FIG. 24B) has a substantially uniform oxygen concentration.

FIGS. 25-34 illustrate a method for manufacturing a semiconductor device at various stages in accordance with some embodiments of the present disclosure. In some embodiments, the semiconductor device shown in FIGS. 25-34 may be intermediate devices fabricated during processing of an integrated circuit (IC), or a portion thereof, that may include static random access memory (SRAM), logic circuits, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 25:
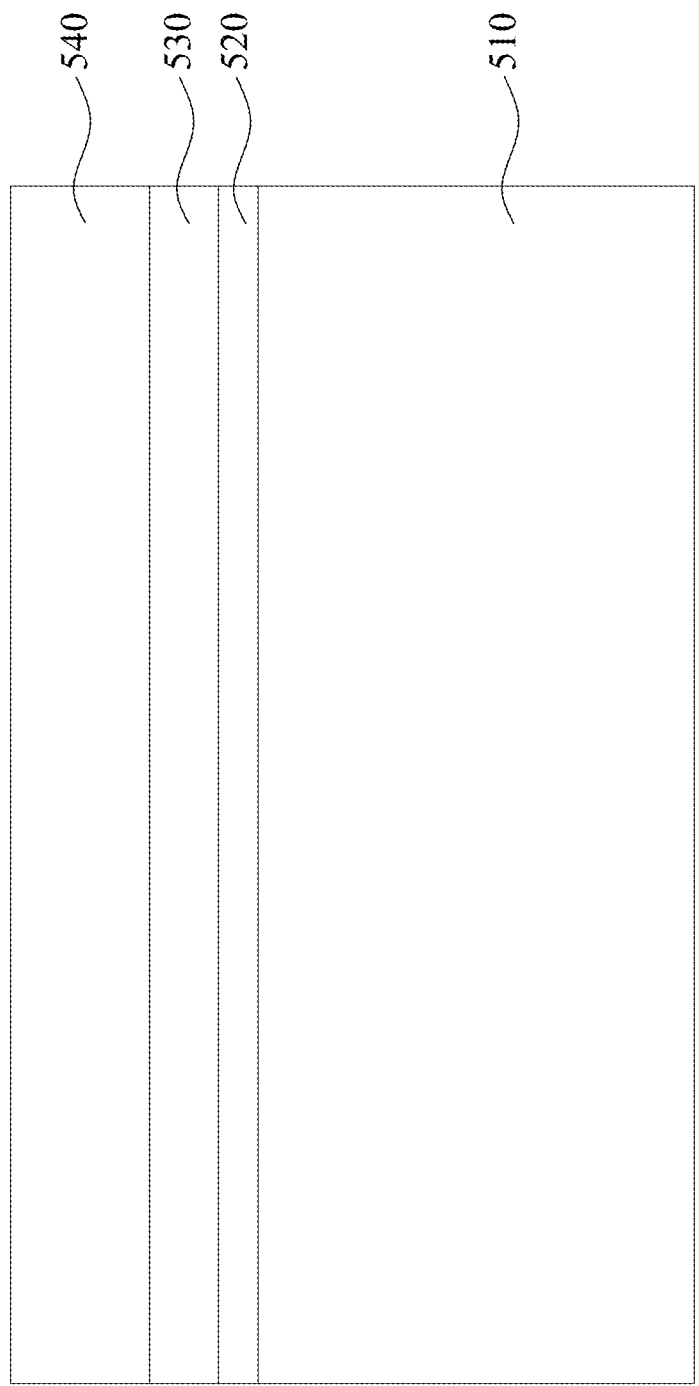
FIGS. 25-34 illustrate a method for manufacturing a semiconductor device at various stages in accordance with some embodiments of the present disclosure.

Reference is made to FIG. 25. A substrate 510 is provided. A pad layer 520 is formed on the substrate 510. A mask layer 530 is then formed on the pad layer 520. A dummy mask layer 540 is then formed on the mask layer 530. The manufacturing processes and/or materials of the substrate 510, the pad layer 520, the mask layer 530, and the dummy mask layer 540 are similar to or the same as the substrate 110, the pad layer 120, the mask layer 130, and the dummy mask layer 140 shown in FIG. 1, respectively. Therefore, a description in this regard will not be repeated hereinafter.

Figure 26:
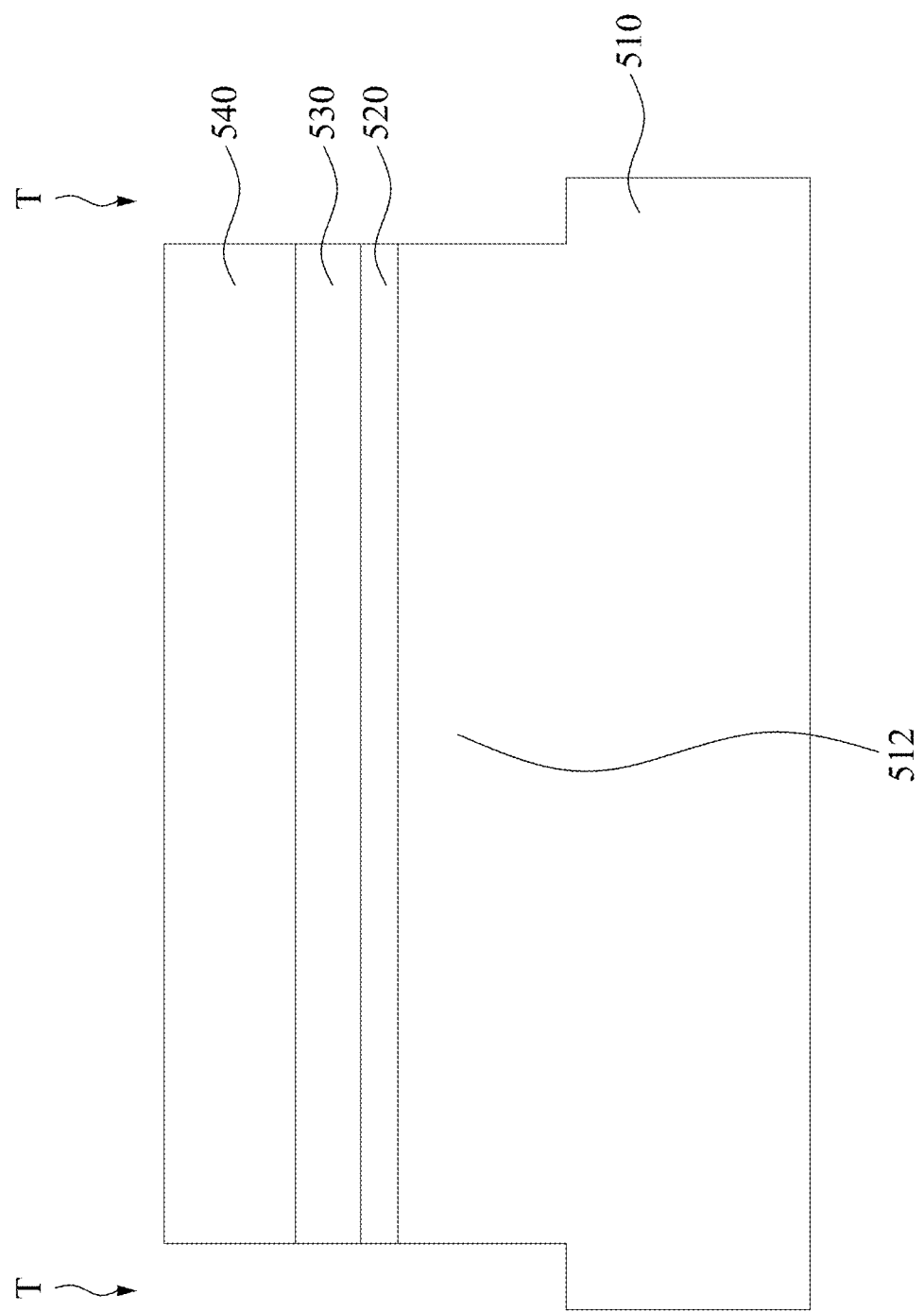

Reference is made to FIG. 26. The dummy mask layer 540 is patterned, and then a plurality of trenches T are formed in the substrate 510 by patterning the mask layer 530, the pad layer 520, and the substrate 510 using the patterned dummy mask layer 540 as a mask. The trenches T define an active region 512 therebetween.

Figure 27:
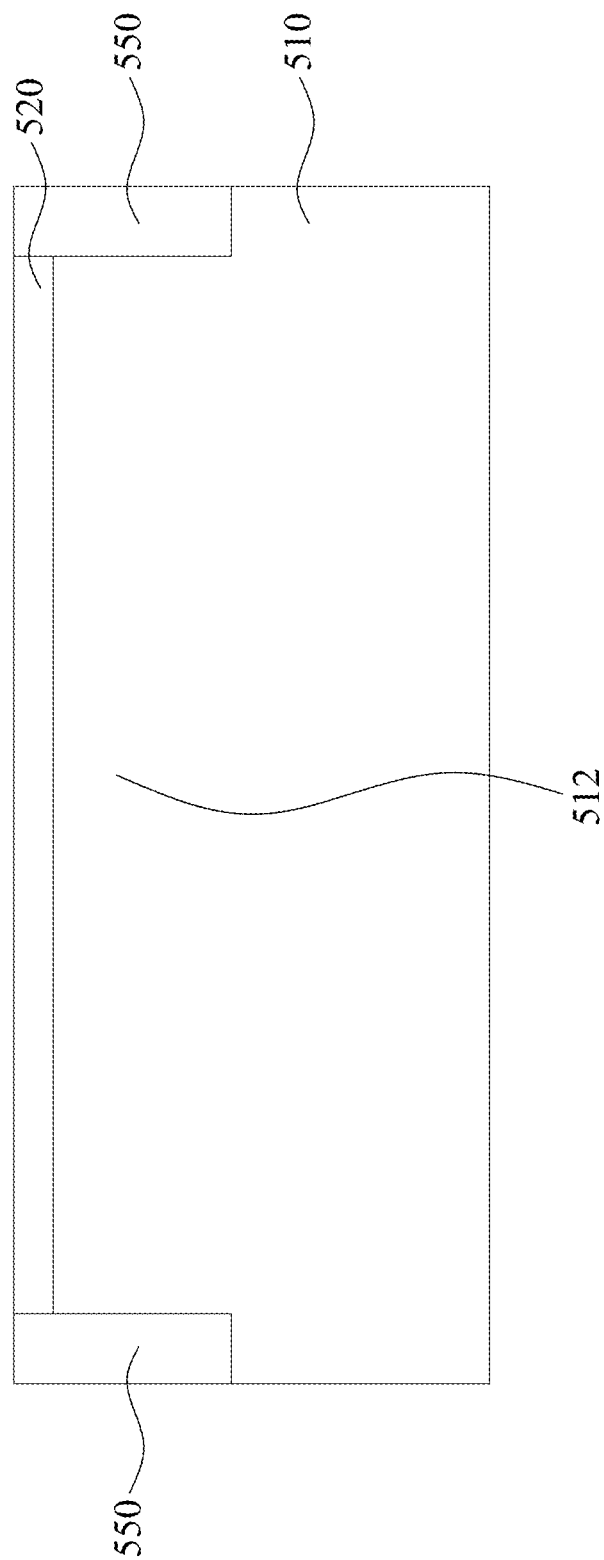

Reference is made to FIG. 27. Isolation structures 550, which may be shallow trench isolation (STI) regions, are formed in the trenches T. The formation may include filling the trenches T with a dielectric layer(s), for example, using flowable chemical vapor deposition (FCVD), and performing an etching process, e.g., a reactive ion etching process, to recess the dielectric material and remove the dummy mask layer 540 and the mask layer 530, such that a top surface of the resulting isolation structures 550 is substantially level with the top surface of the pad layer 520. The isolation structures 550 may be a dielectric material, such as silicon oxide, silicon nitride, silicon oxynitride, SiCN, $SiC_xO_yN_z$, or combinations thereof.

Figure 28:
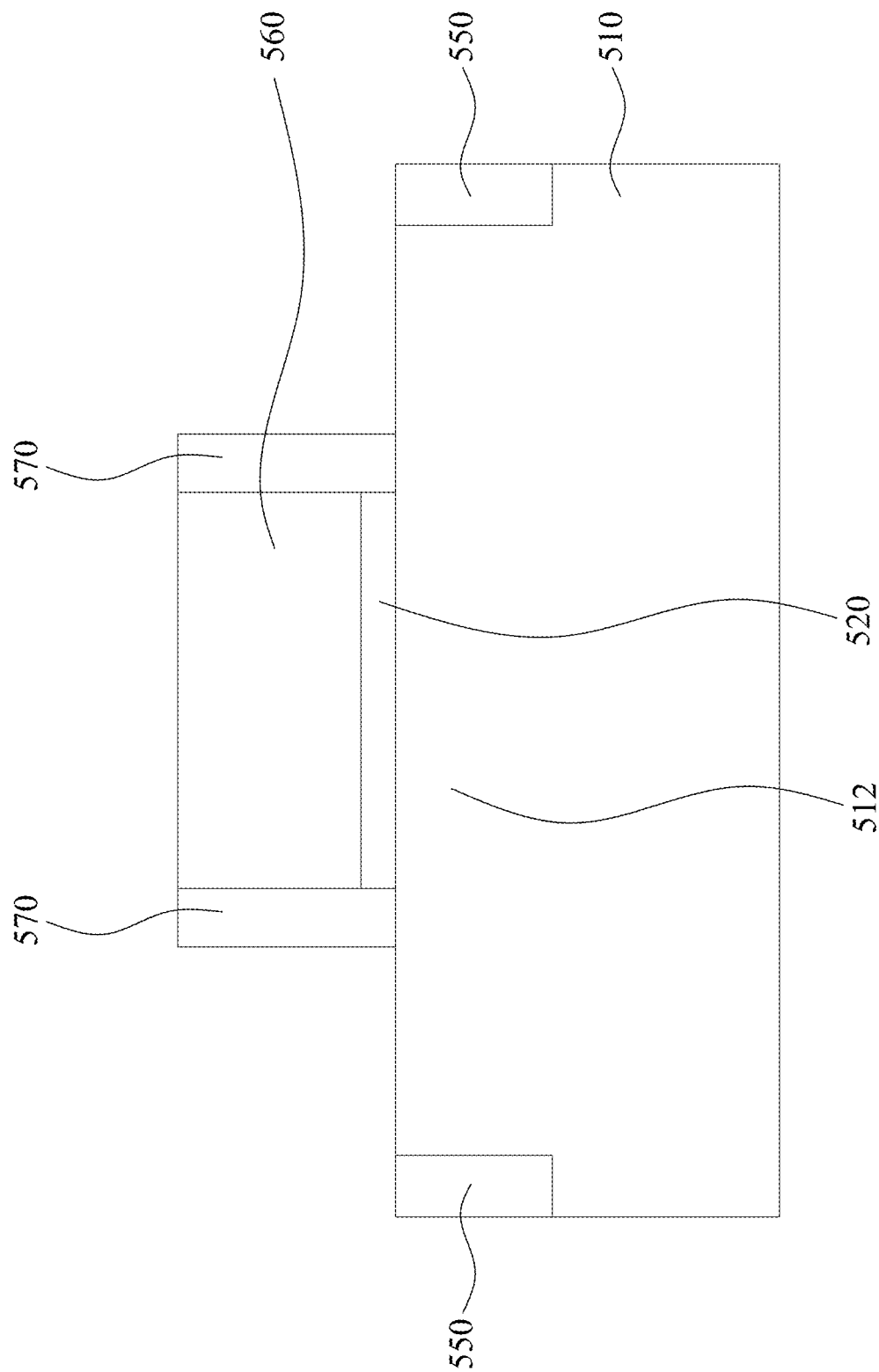

Reference is made to FIG. 28. At least one dummy gate layer 560 is formed above the active region 512. The pad layer 520 is patterned by using the dummy gate layer 560 as an etching mask. Subsequently, gate spacers 570 are respectively formed on sidewalls of the dummy gate layer 560. The manufacturing processes and/or materials of the dummy gate layer 560 and the gate spacers 570 are similar to or the same as the dummy gate layer 164 and the gate spacers 170 shown in FIGS. 4 and 5, respectively. Therefore, a description in this regard will not be repeated hereinafter.

Figure 29:
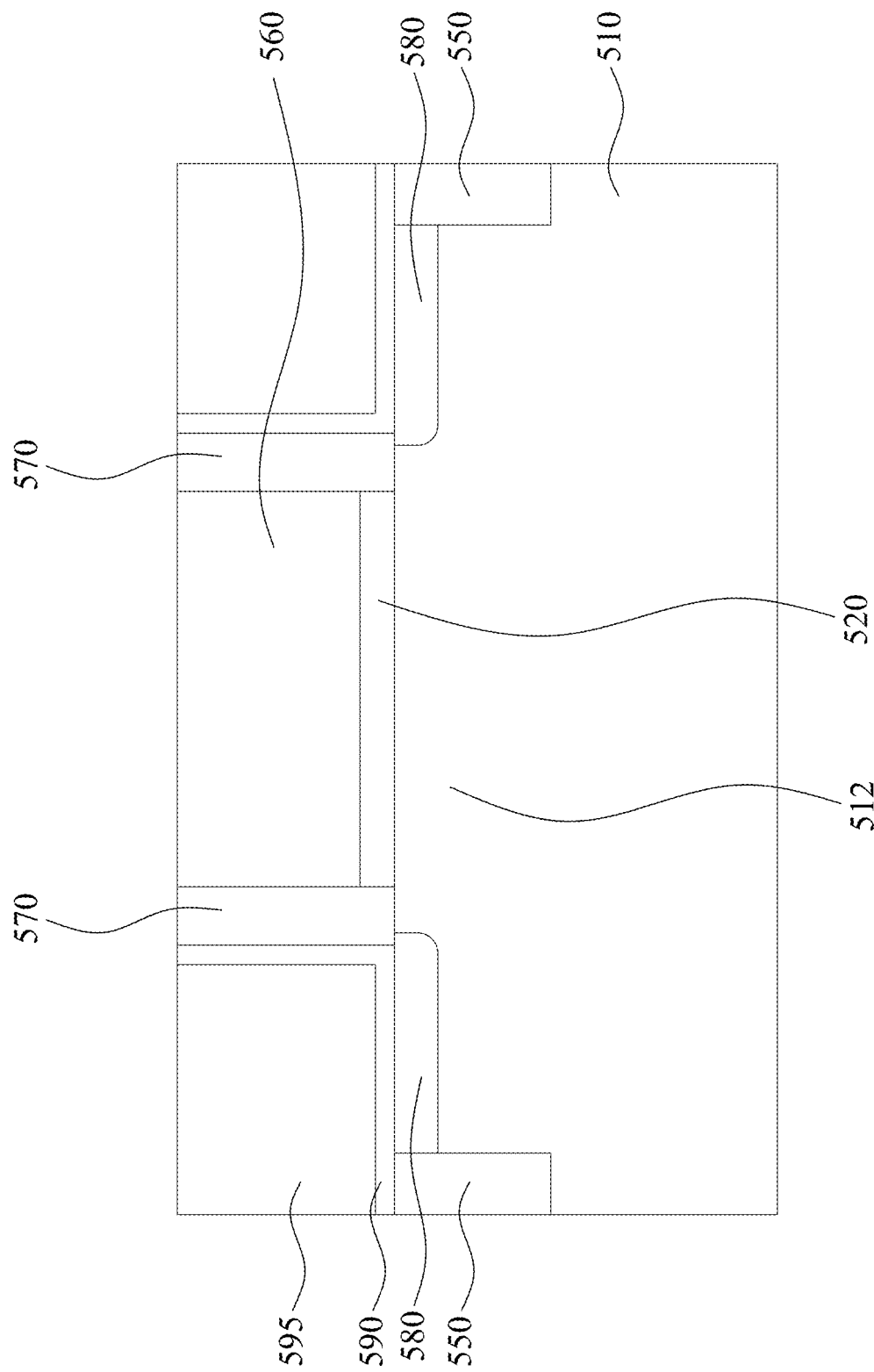

Reference is made to FIG. 29. An implantation process is performed to introduce impurities into the substrate 510 to form source/drain regions 580, and the dummy gate layer 560 and the gate spacers 570 may act as masks to substantially prevent the impurities from being implanted into other regions of the substrate 510. The impurities may be n-type impurities or p-type impurities. The n-type impurities may be phosphorus, arsenic, or the like, and the p-type impurities may be boron, $BF_2$, or the like. In some other embodiments, the source/drain regions 580 may be epitaxial structures, and manufacturing method and/or materials thereof may be the same as or similar to the epitaxial structures 180 shown in FIG. 6.

A contact etch stop layer (CESL) 590 is conformally formed over the source/drain regions 580, and an interlayer dielectric (ILD) 595 is then formed on the CESL 590. The manufacturing processes and/or materials of the CESL 590 and the ILD 595 are similar to or the same as the CESL 190 and the ILD 195 shown in FIG. 7, and, therefore, a description in this regard will not be repeated hereinafter.

Figure 30:
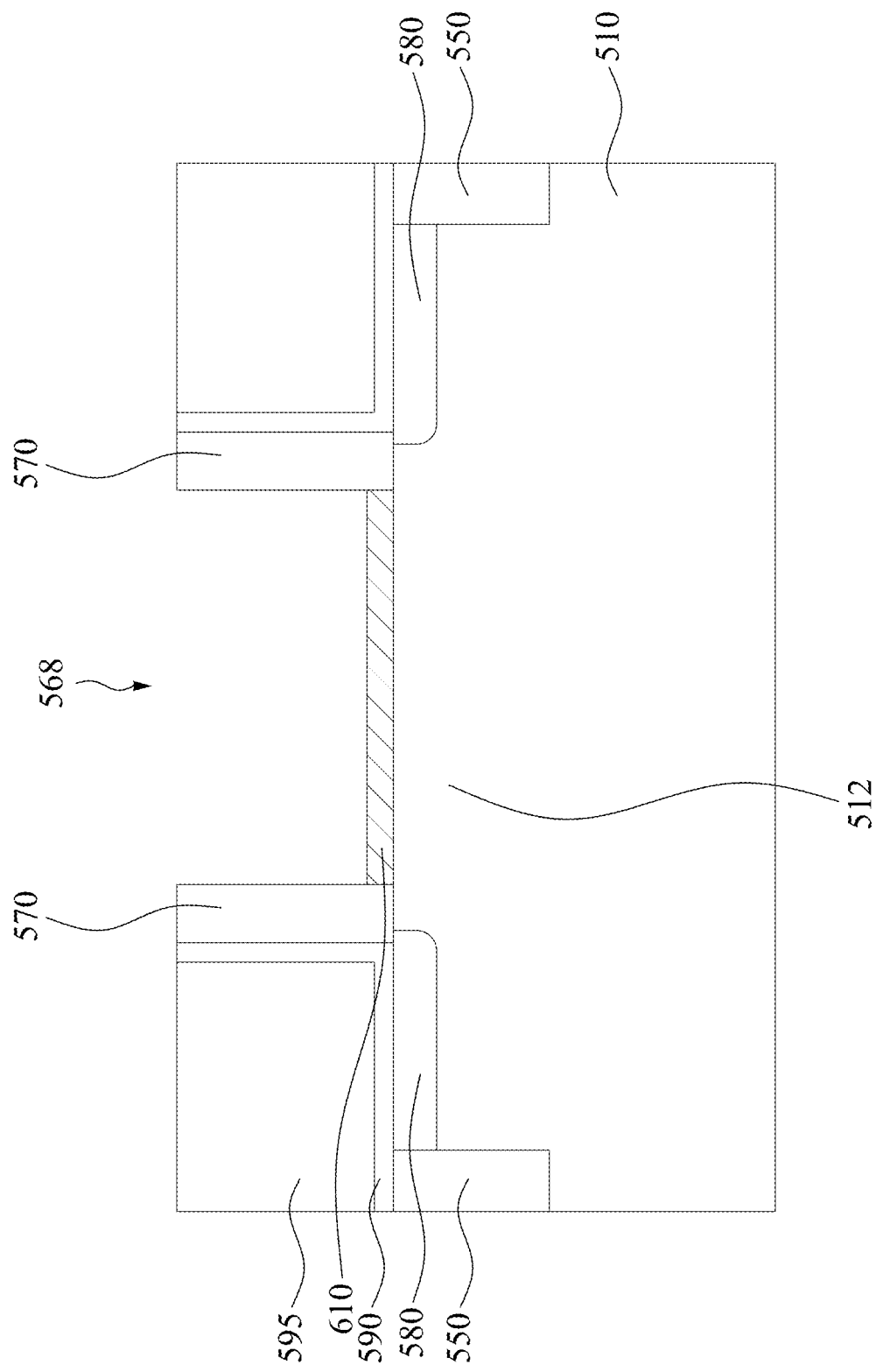

Reference is made to FIG. 30. Subsequently, a replacement gate (RPG) process scheme is employed. The dummy gate layer 560 and the pad layer 520 are replaced with a metal gate structure MG (see FIG. 33). Specifically, the dummy gate layer 560 and the pad layer 520 (see FIG. 29) are removed, thereby forming a gate trench 568 between the gate spacers 570 and exposing a channel portion of the substrate 510 (referred to as a semiconductive channel region).

A semiconductive protection layer (e.g., silicon-containing protection layer) 610 is formed above the channel portion of the substrate 510. The manufacturing processes and/or materials of the semiconductive protection layer 610 are similar to or the same as the semiconductive protection layer 210 shown in FIGS. 8A-8C. Therefore, a description in this regard will not be repeated hereinafter.

Figure 31:
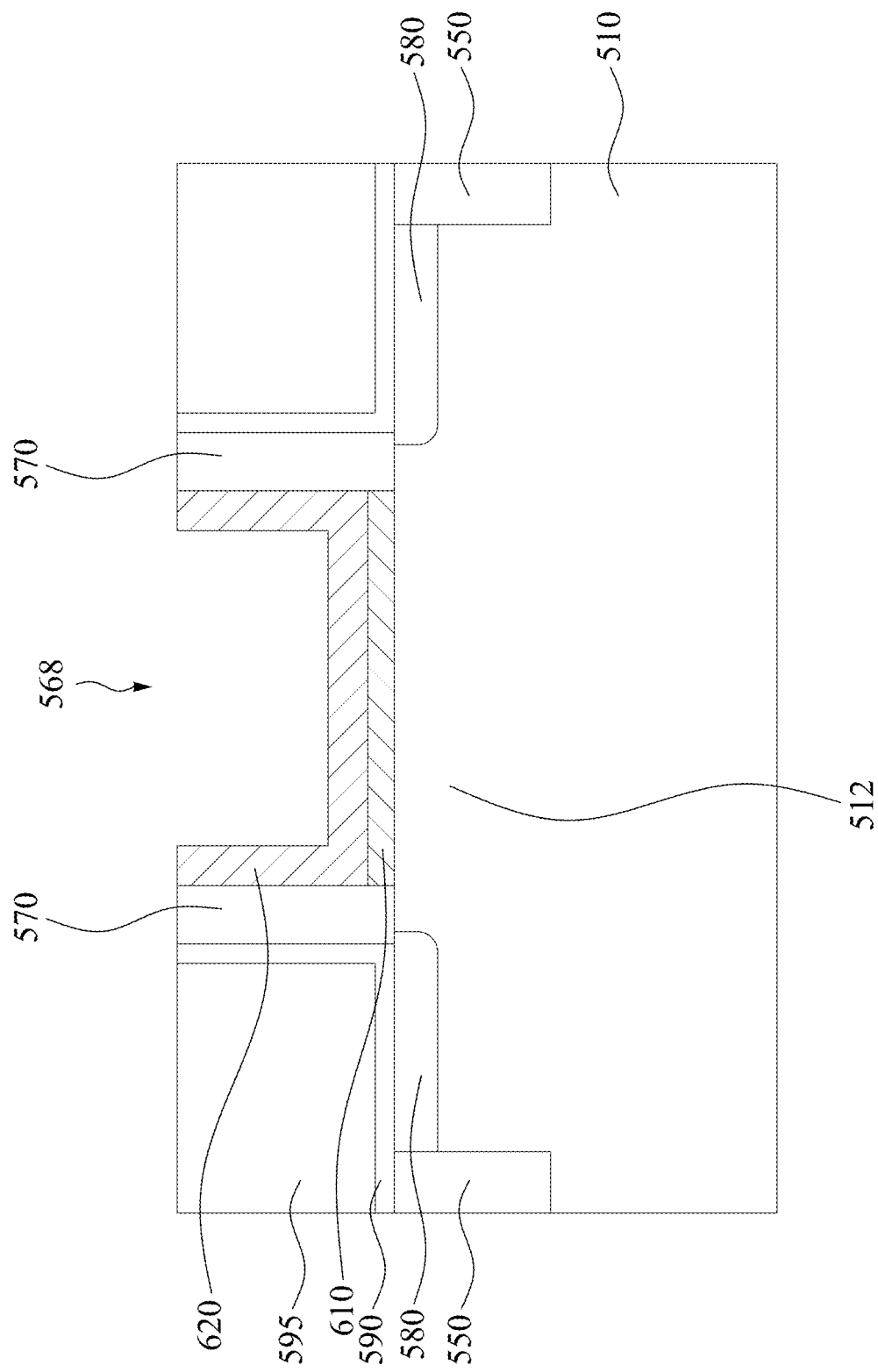

Reference is made to FIG. 31. A gate dielectric layer 620 is conformally formed in the gate trench 568 and above the semiconductive protection layer 610. The manufacturing processes and/or materials of the gate dielectric layer 620 are similar to or the same as the gate dielectric layer 220 shown in FIGS. 9A-9C. Therefore, a description in this regard will not be repeated hereinafter.

Figure 32:
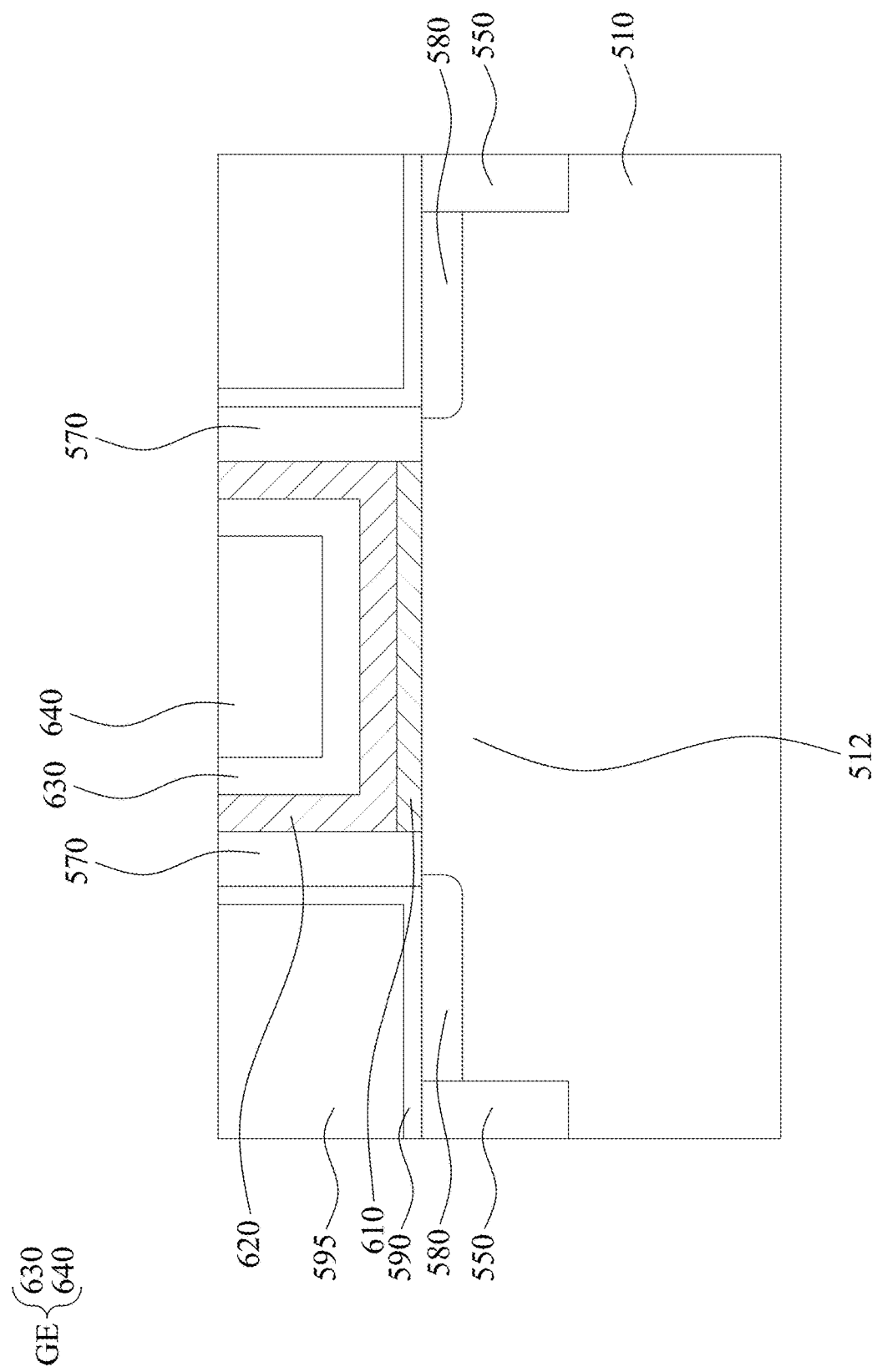

Reference is made to FIG. 32. A gate electrode GE is formed above the gate dielectric layer 620 and fill the gate trench 568 (see FIG. 31). In some embodiments, the gate electrode GE include at least one work function metal layer(s) 630, a fill layer 640, and/or other suitable layers that are desirable in a metal gate stack. The manufacturing processes and/or materials of the gate electrode GE are similar to or the same as the gate electrode GE shown in FIGS. 10A-10C. Therefore, a description in this regard will not be repeated hereinafter.

After the deposition of the gate dielectric layer 620, a post-deposition annealing process may be performed on the gate dielectric layer 620 and the semiconductive protection layer 610. The manufacturing processes of the post-deposition annealing process are similar to or the same as the post-deposition annealing process described in FIGS. 9A-9C. Therefore, a description in this regard will not be repeated hereinafter.

Figure 33:
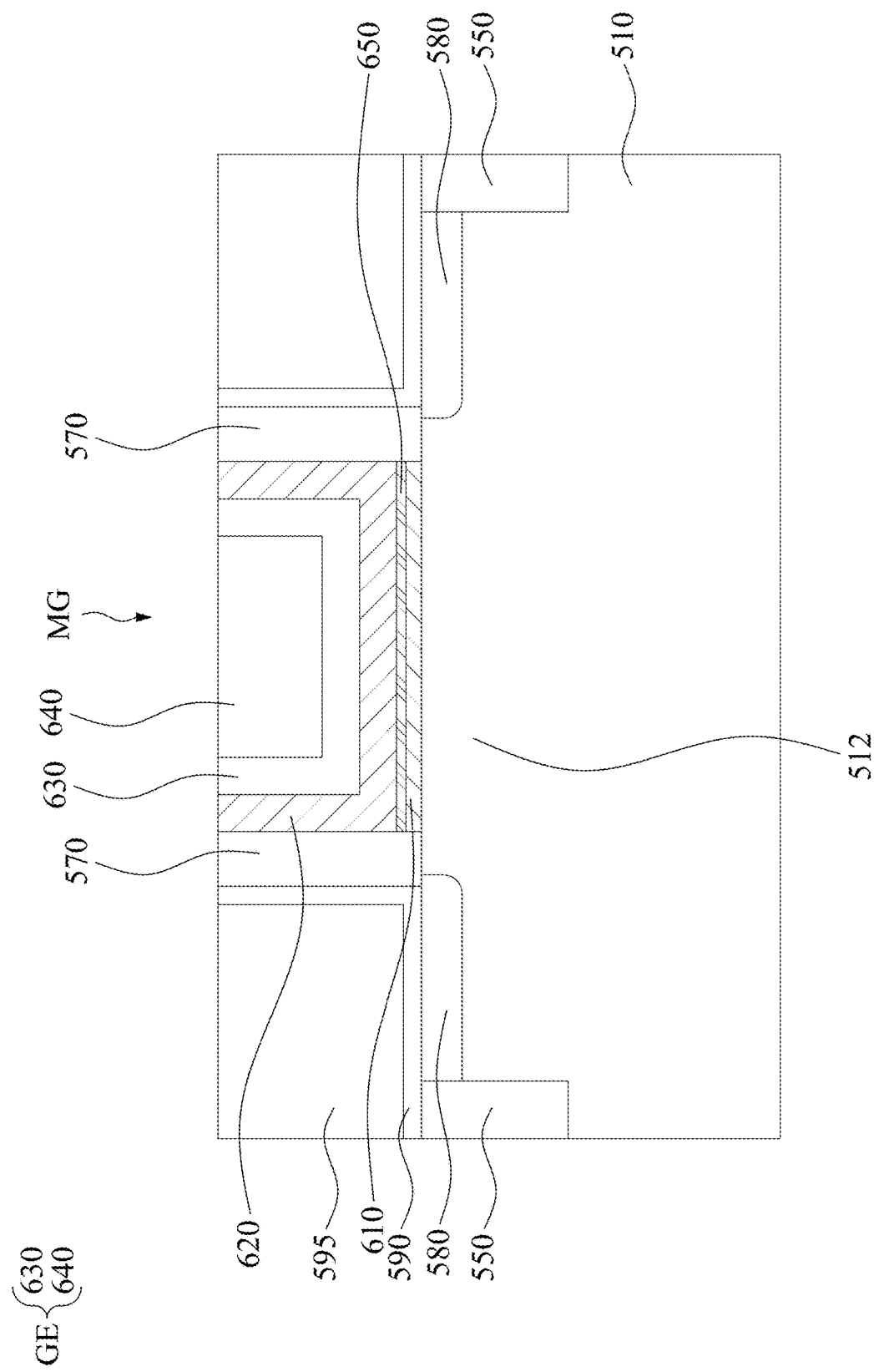

Reference is made to FIG. 33. An interfacial layer 650 is formed between the semiconductive protection layer 610 and the gate dielectric layer 620. As such, the interfacial layer 650, the gate dielectric layer 620, and the gate electrode GE are together referred to as a gate structure MG. The manufacturing processes and/or materials of the interfacial layer 650 are similar to or the same as the interfacial layer 250 shown in FIGS. 11A-11C. Therefore, a description in this regard will not be repeated hereinafter.

Figure 34:
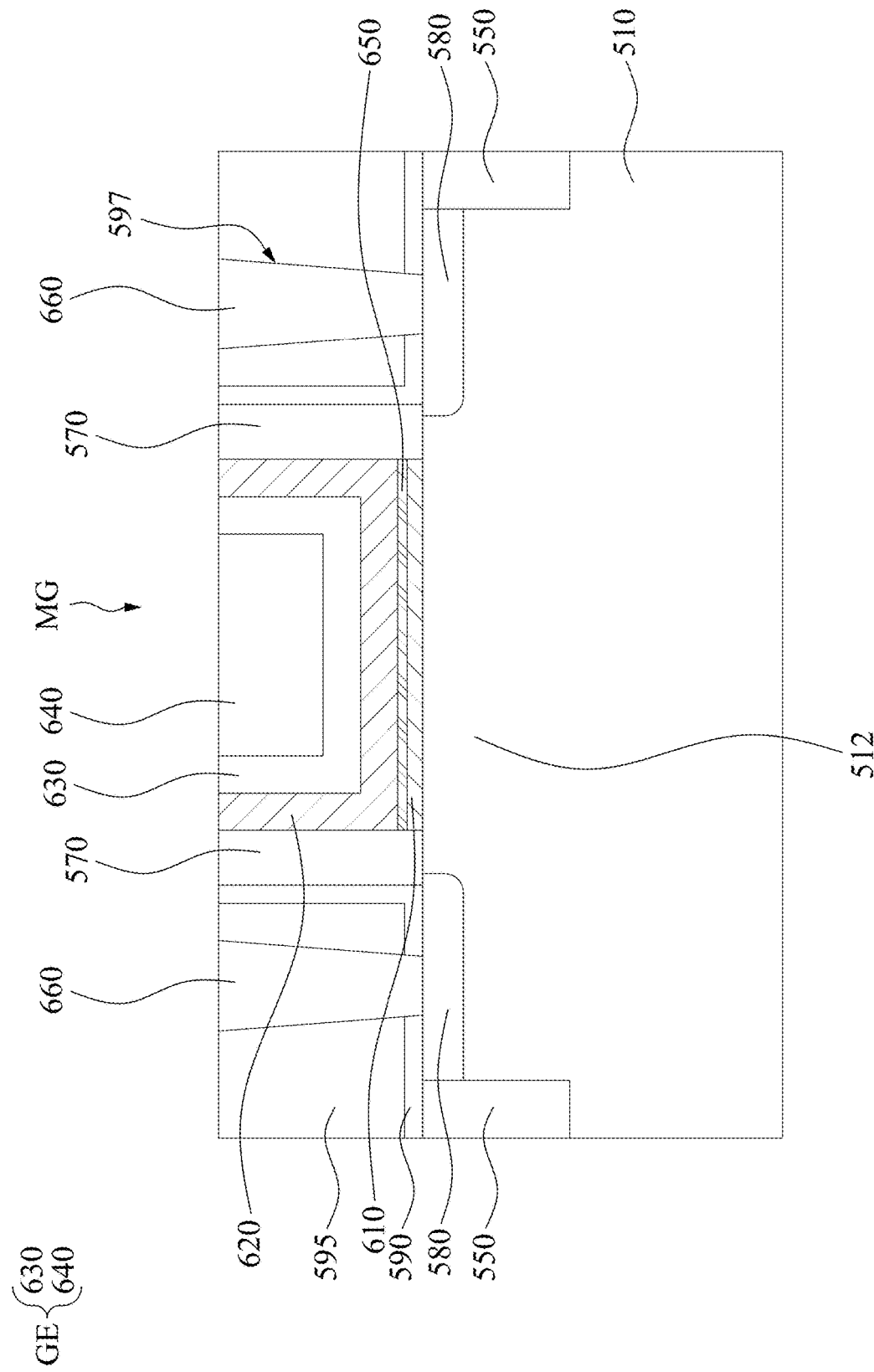

Reference is made to FIG. 34. The ILD 595 is patterned to form trenches 597 on opposite sides of the gate structure 600, and then the CESL 590 is patterned to expose the source/drain regions 580. Contacts 660 are formed in the trenches 597. As such, the contacts 660 are respectively in contact with the source/drain regions 580. The manufacturing processes and/or materials of the contacts 660 are similar to or the same as the contacts 260 shown in FIGS. 12A-12C, and, therefore, a description in this regard will not be repeated hereinafter.

FIGS. 35-40 illustrate a method for manufacturing a semiconductor device at various stages in accordance with some embodiments of the present disclosure. In some embodiments, the semiconductor device shown in FIGS. 35-40 may be intermediate devices fabricated during processing of an integrated circuit (IC), or a portion thereof, that may include static random access memory (SRAM), logic circuits, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 35:
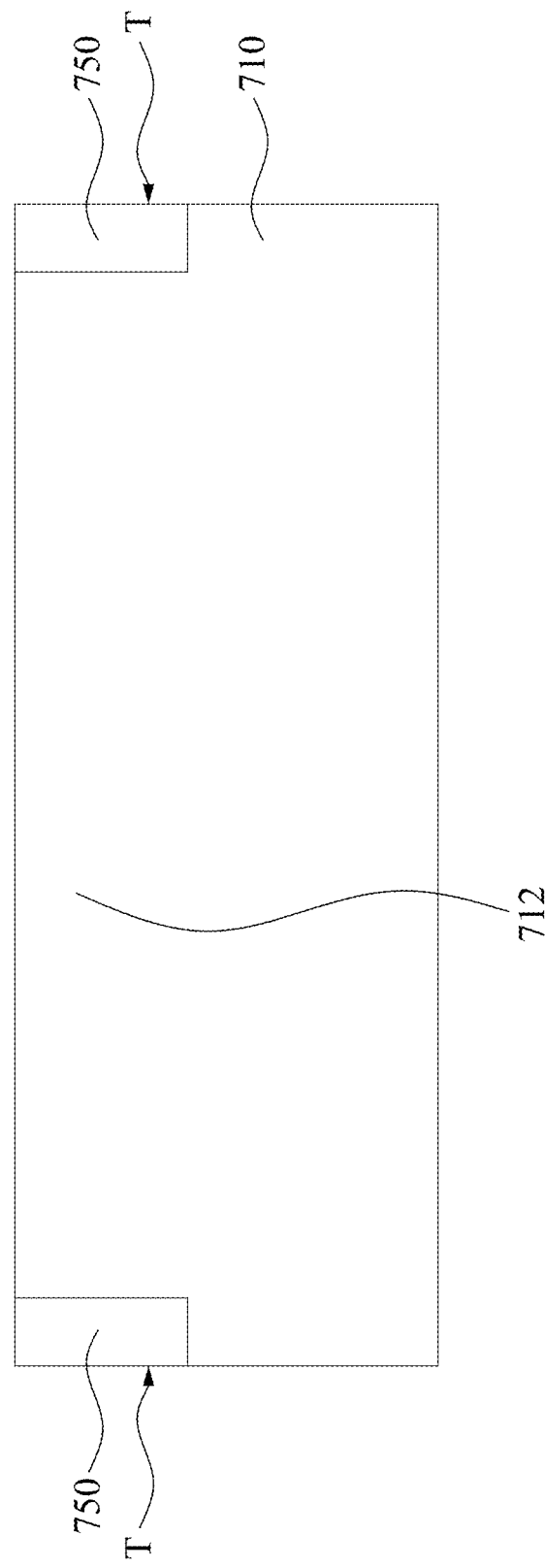
FIGS. 35-40 illustrate a method for manufacturing a semiconductor device at various stages in accordance with some embodiments of the present disclosure.

Reference is made to FIG. 35. A substrate 710 is provided. A plurality of trenches T are formed in the substrate 710 to define an active region 712 therebetween. Isolation structures 750, which may be shallow trench isolation (STI) regions, are formed in the trenches T. The manufacturing processes and/or materials of the substrate 710, the trenches T, and the isolation structures 750 are similar to or the same as the substrate 110, the trenches T, and the isolation structures 150 shown in FIGS. 1 and 3, respectively. Therefore, a description in this regard will not be repeated hereinafter.

Figure 36:
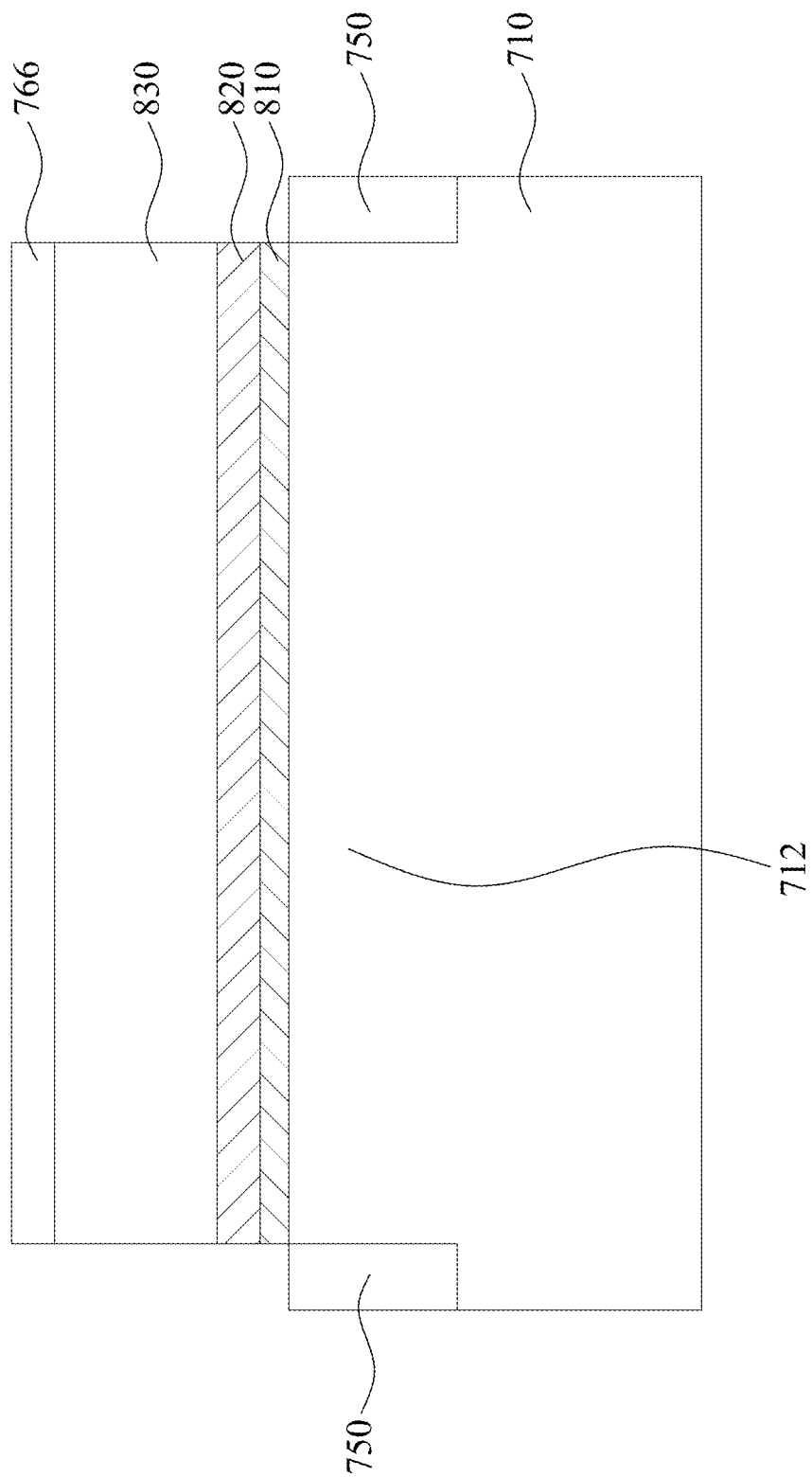

Reference is made to FIG. 36. A semiconductive protection layer 810 is formed above the active region 712 of the substrate 710. The manufacturing processes and/or materials of the semiconductive protection layer 810 are similar to or the same as the semiconductive protection layer 210 shown in FIGS. 8A-8C. Therefore, a description in this regard will not be repeated hereinafter.

A gate dielectric layer 820 is conformally formed above the semiconductive protection layer 810. The manufacturing processes and/or materials of the gate dielectric layer 820 are similar to or the same as the gate dielectric layer 220 shown in FIGS. 9A-9C. Therefore, a description in this regard will not be repeated hereinafter.

After the deposition of the gate dielectric layer 820, a post-deposition annealing process may be performed on the gate dielectric layer 820 and the semiconductive protection layer 810. The manufacturing processes of the post-deposition annealing process are similar to or the same as the post-deposition annealing process described in FIGS. 9A-9C. Therefore, a description in this regard will not be repeated hereinafter.

At least one work function metal layer(s) 830 is formed above the gate dielectric layer 820. The manufacturing processes and/or materials of the work function metal layer 830 are similar to or the same as the work function metal layer 230 shown in FIGS. 10A-10C. Therefore, a description in this regard will not be repeated hereinafter.

A hard mask layer 740 is formed above the work function metal layer 830. The manufacturing processes and/or materials of the hard mask layer 740 are similar to or the same as the dummy mask layer 140 shown in FIG. 1. Therefore, a description in this regard will not be repeated hereinafter.

Figure 37:
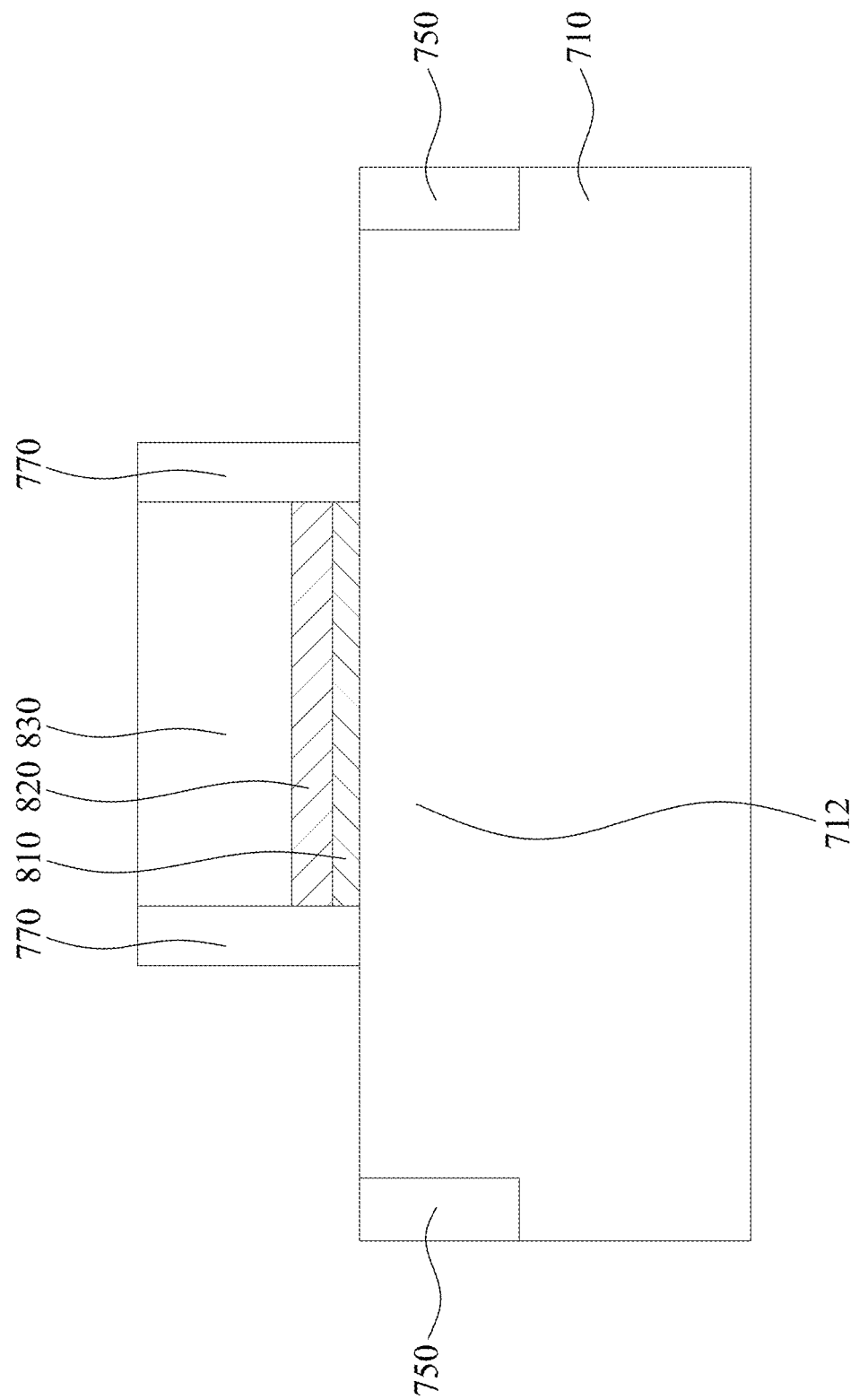

Reference is made to FIG. 37. The hard mask layer 740 (see FIG. 36) is patterned, and the work function metal layer 830, the gate dielectric layer 820, and the semiconductive protection layer 810 are then patterned by using the hard mask layer 740 as an etching mask. The patterned hard mask layer 740 is then removed (or stripped). Subsequently, gate spacers 770 are formed on sidewalls of the patterned work function metal layer 830, the patterned gate dielectric layer 820, and the patterned semiconductive protection layer 810. The manufacturing processes and/or materials of the gate spacers 770 are similar to or the same as the gate spacers 170 shown in FIG. 5, respectively. Therefore, a description in this regard will not be repeated hereinafter.

Figure 38:
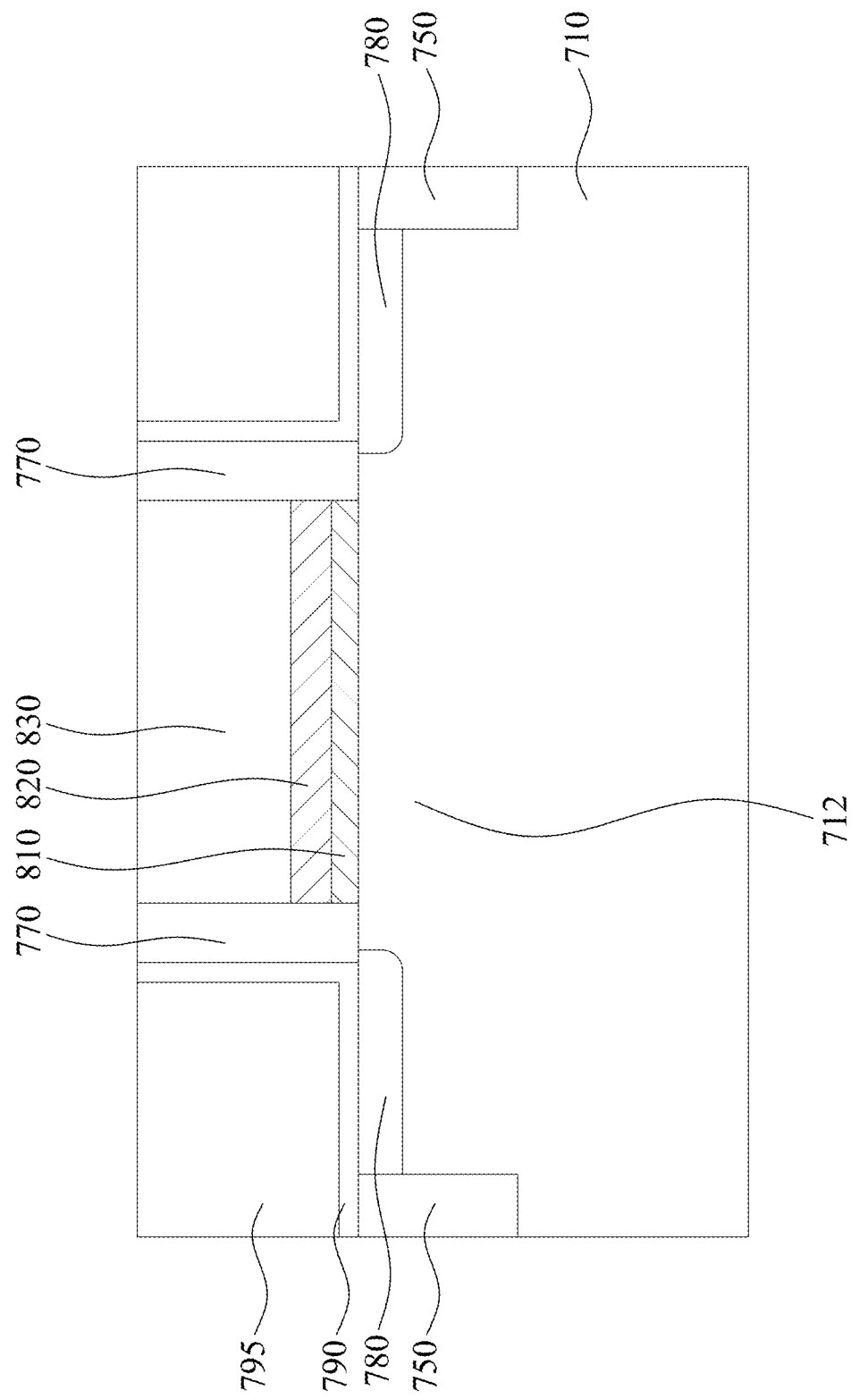

Reference is made to FIG. 38. An implantation process is performed to introduce impurities into the substrate 710 to form source/drain regions 780. During the implantation process, the work function metal layer 830 may be doped as well. That is, the source/drain regions 780 and the work function metal layer 830 may include same dopants. The manufacturing processes and/or materials of the source/drain regions 780 are similar to or the same as the source/drain regions 580 shown in FIG. 29, respectively. Therefore, a description in this regard will not be repeated hereinafter.

A contact etch stop layer (CESL) 790 is conformally formed over the source/drain regions 780, and an interlayer dielectric (ILD) 795 is then formed on the CESL 790. The manufacturing processes and/or materials of the source/drain regions 780, the CESL 790, and the ILD 795 are similar to or the same as the source/drain regions 580, the CESL 190, and the ILD 195 shown in FIG. 7, and, therefore, a description in this regard will not be repeated hereinafter.

Figure 39:
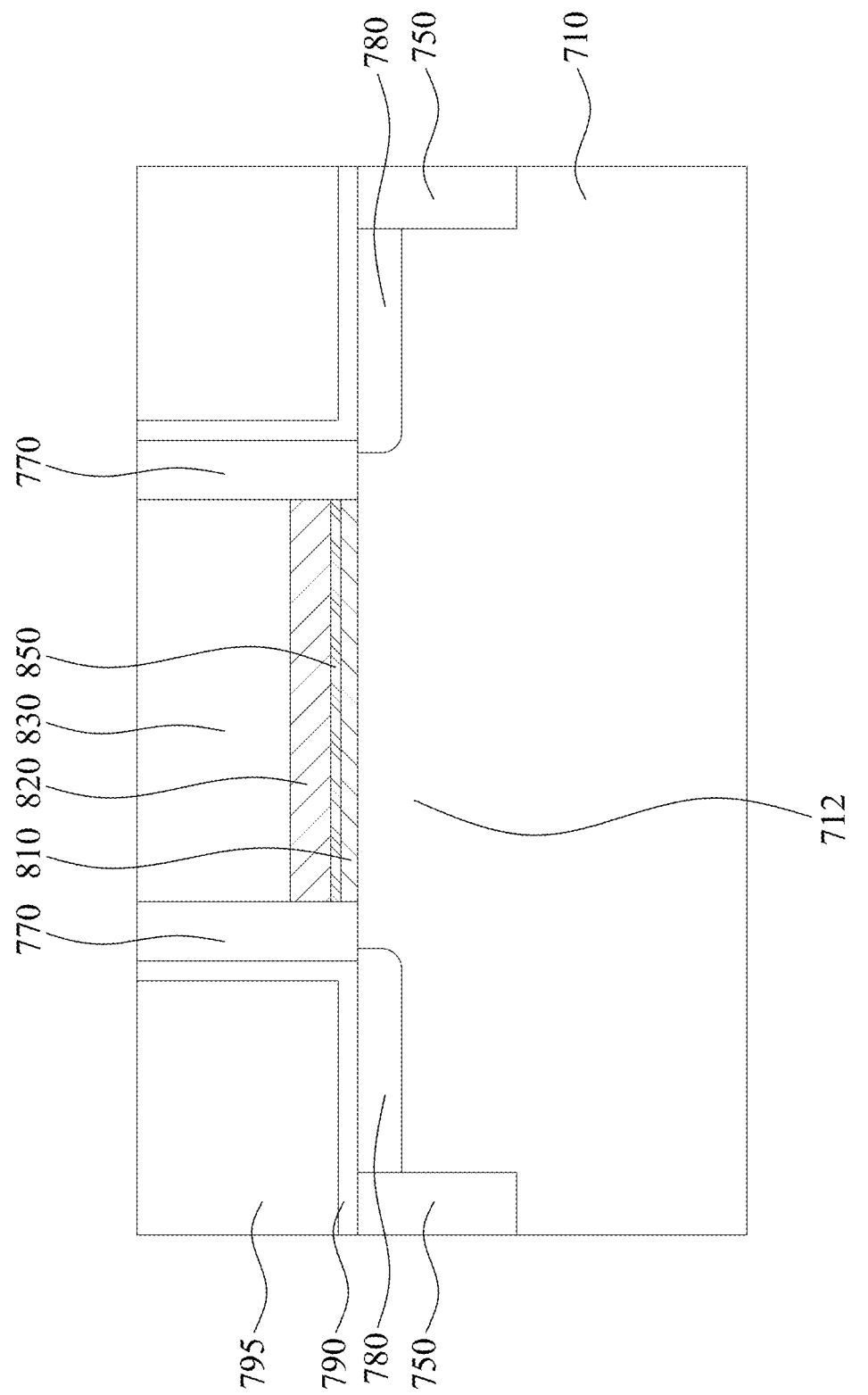

Reference is made to FIG. 39. An interfacial layer 850 is formed between the semiconductive protection layer 810 and the gate dielectric layer 820. The manufacturing processes and/or materials of the interfacial layer 850 are similar to or the same as the interfacial layer 250 shown in FIGS. 11A-11C. Therefore, a description in this regard will not be repeated hereinafter.

Figure 40:
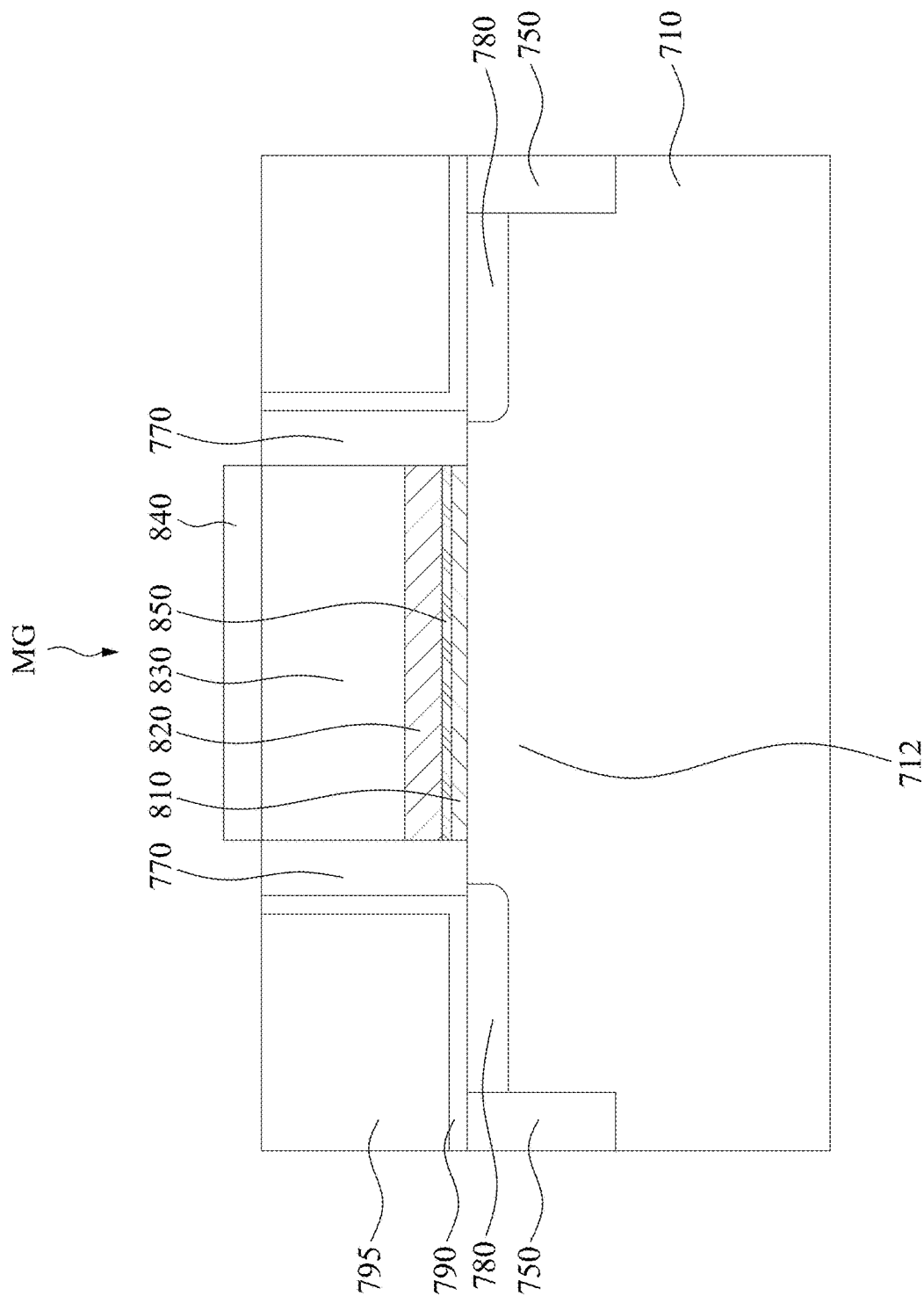

Reference is made to FIG. 40. A metal layer 840 is formed above the work function metal layer 830. For example, a mask layer (not shown) is formed above the structure of FIG. 39, and an opening is formed in the mask layer to expose the work function metal layer 830. A metal material is deposited in the opening, and a CMP process is performed to remove a portion of the metal material outside the opening. The mask layer is then removed, such that the metal layer 840 is formed above the work function metal layer 830. In some embodiments, the metal layer 840 may include tungsten (W) or other suitable conductive materials. The metal layer 840 may be deposited by ALD, PVD, CVD, or other suitable process. As such, the interfacial layer 850, the gate dielectric layer 820, the work function metal layer 830, and the metal layer 840 are together referred to as a gate structure MG.

Figure 41:
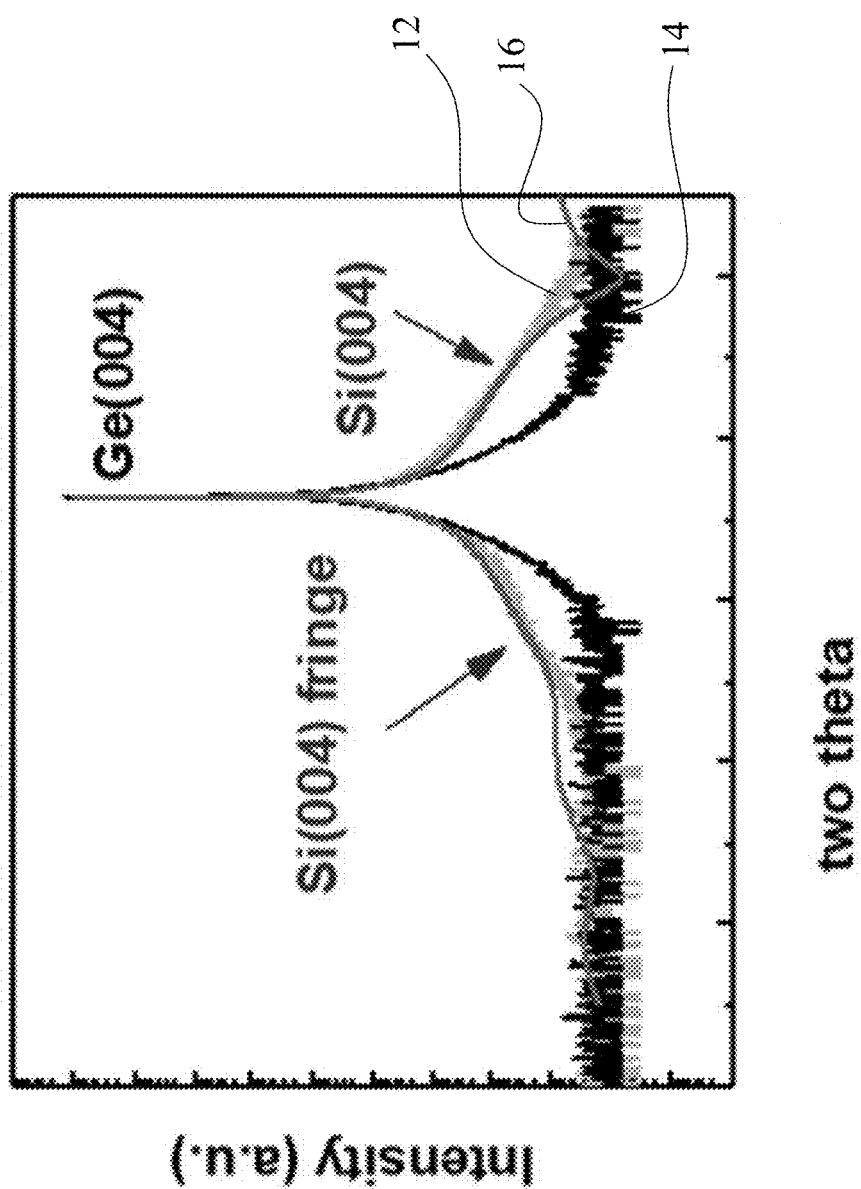
FIG. 41 is a plot of x-ray diffraction spectra (XRD) for as-deposited silicon protection layer on a germanium substrate as a function of two times of incident angles.

FIG. 41 is a plot of x-ray diffraction spectra (XRD) for as-deposited silicon protection layer on a germanium substrate as a function of two times of incident angles. For clarity, positions of Si(004) and Ge(004) are shown in FIG. 41. Line 12 was a signal of as-deposited silicon protection layer, line 14 was a signal of germanium substrate, and line 16 was a fitted curve of line 12. Compared to the blanket Ge substrate (line 14), there are clear features from the silicon protection layer and the fringes indicate well-ordered high-quality Si layers. The thickness of the silicon protection layer was about 1 nm fitted from the fringe signal of line 12.

Figure 42:
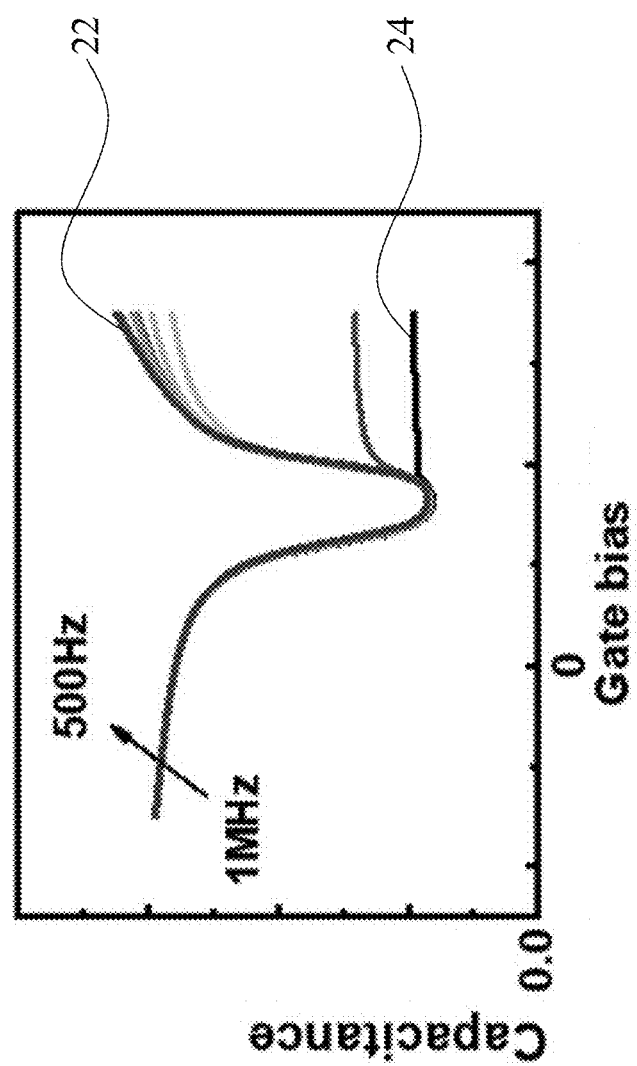
FIG. 42 is a plot of C-V characteristics of semiconductor device with post-gate forming gas annealing (FGA) process at different frequencies.

FIG. 42 is a plot of C-V characteristics of semiconductor device with post-gate forming gas annealing (FGA) process at different frequencies. The curves represent the C-V characteristics at different frequencies. For example, line 22 represents the C-V characteristic at 500 Hz, line 24 represents the C-V characteristic at 1 MHz, and curves between the lines 22 and 24 represent the C-V characteristics at frequencies between 500 Hz and 1 MHz. In FIG. 42, the frequency dispersion was about 2.0% (0.7%/decade).

Figure 43:
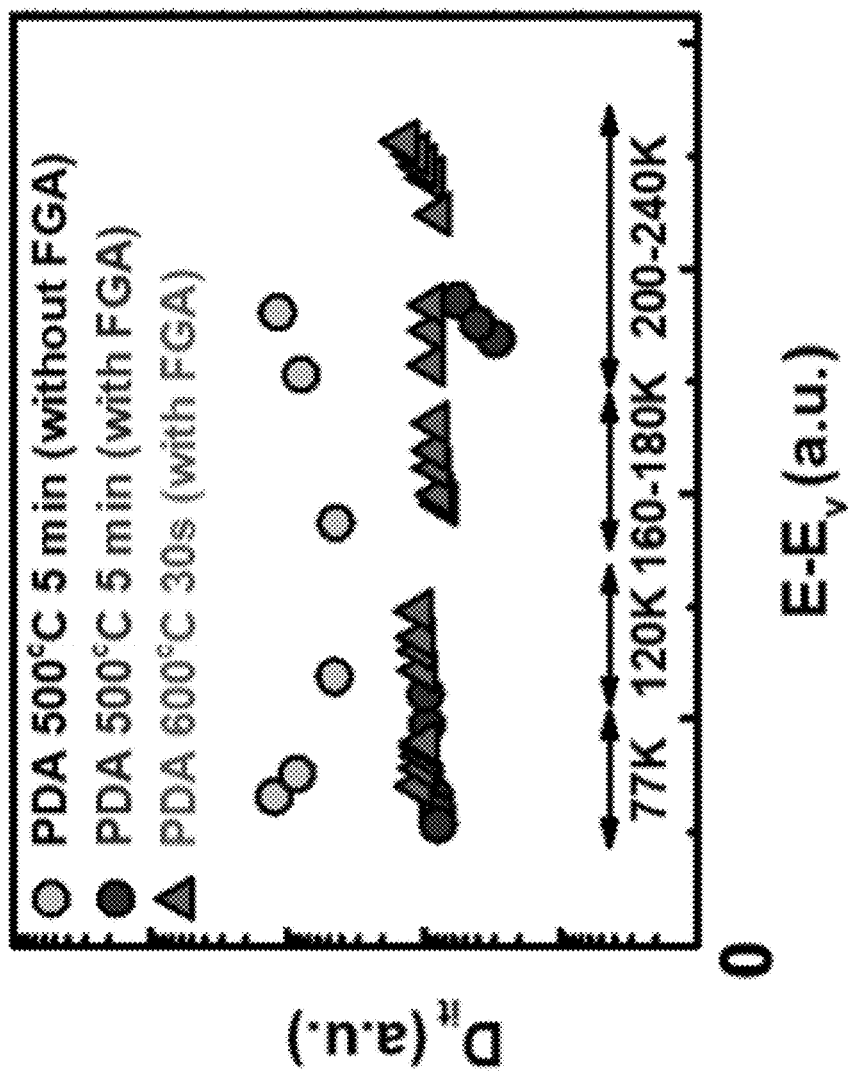
FIG. 43 is a plot of interface state density ($D_{it}$) of semiconductor device with and without post-gate forming gas annealing (FGA) process.

FIG. 43 is a plot of interface state density ($D_{it}$) of semiconductor device with and without post-gate forming gas annealing (FGA) process. As shown in FIG. 43, the interface state density between the silicon protection layer and the interfacial layer is reduced after the FGA process.

Figure 44:
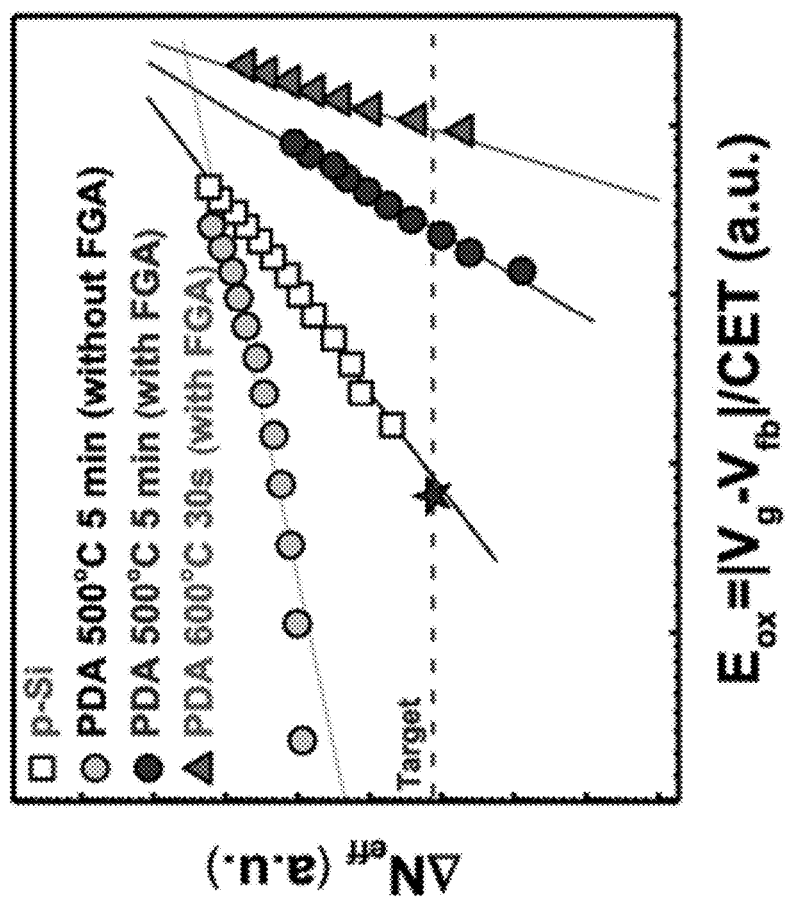
FIG. 44 is a plot of effective oxide trap density ($\Delta N_{eff}$) of semiconductor device with/without post-gate forming gas annealing (FGA) process and/or post-deposition annealing process.

FIG. 44 is a plot of effective oxide trap density ($\Delta N_{eff}$) of semiconductor device with/without post-gate forming gas annealing (FGA) process and/or post-deposition annealing (PDA) process. As shown in FIG. 44, the effective oxide trap density is significantly reduced after the FGA process. The target was at $\Delta N_{eff}$ about 3E10 $cm^{-2}$ and at $E_{ox}$ about 3.5 MV/cm.

According to some embodiments, a semiconductor device includes a substrate, a semiconductor fin, a silicon layer, a gate structure, gate spacers, and source/drain structures. The semiconductor fin is over the substrate. The silicon layer is over the semiconductor fin. The gate structure is over the silicon layer, in which the gate structure includes an interfacial layer over the silicon layer, a gate dielectric layer over the interfacial layer, and a gate electrode over the gate dielectric layer. The gate spacers are on opposite sidewalls of the gate structure and in contact with the interfacial layer of the gate structure, in which a bottom surface of the interfacial layer is higher than bottom surfaces of the gate spacers. The source/drain structures are on opposite sides of the gate structure.

According to some embodiments, a semiconductor device includes a substrate, semiconductor layers, semiconductive protection layers, a gate structure, and source/drain structures. The semiconductor layers are over the substrate. The semiconductive protection layers wrap around the semiconductor layers, respectively. The gate structure is over the semiconductive protection layers and wraps around the semiconductor layers, in which the gate structure includes an interfacial layer, a gate dielectric layer over the interfacial layer; and a gate electrode over the gate dielectric layer, in which the interfacial layer is an oxide of the semiconductive protection layers. The source/drain structures are on opposite sides of the gate structure.

According to some embodiments, a semiconductor device includes a substrate, a semiconductor fin, a shallow trench isolation (STI) structure, a gate structure, and source/drain structures. The semiconductor fin is over the substrate. The STI structure laterally surrounds the semiconductor fin. The gate structure is over the semiconductor fin, in which the gate structure includes an interfacial layer, a gate dielectric layer over the interfacial layer, and a gate electrode over the gate dielectric layer, the gate dielectric layer having a first portion between the interfacial layer and the gate electrode, and a second portion in contact with the STI structure, in which the gate dielectric layer has a greater oxygen concentration gradient in the first portion of the gate dielectric layer than in the second portion of the gate dielectric layer. The source/drain structures are on opposite sides of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a semiconductor fin over the substrate;
   a silicon layer over the semiconductor fin;
   a gate structure over the silicon layer, wherein the gate structure comprises:
      an interfacial layer over the silicon layer;
      a gate dielectric layer over the interfacial layer; and
      a gate electrode over the gate dielectric layer;
   gate spacers on opposite sidewalls of the gate structure and in contact with the interfacial layer of the gate structure, wherein a bottom surface of the interfacial layer is higher than bottom surfaces of the gate spacers; and
   source/drain structures on opposite sides of the gate structure.

2. The semiconductor device of claim 1, wherein an oxygen concentration of the gate dielectric layer decreases in a direction from the gate electrode toward the interfacial layer.

3. The semiconductor device of claim 1, wherein a thickness of the interfacial layer is less than a thickness of the silicon layer.

4. The semiconductor device of claim 1, wherein the interfacial layer has a linear cross-section, while the gate dielectric layer has an U-shape cross-section.

5. The semiconductor device of claim 1, wherein the interfacial layer is separated from the semiconductor fin by the silicon layer.

6. The semiconductor device of claim 1, wherein the interfacial layer is an oxide of the silicon layer.

7. A semiconductor device, comprising:
a substrate;
semiconductor layers over the substrate;
semiconductive protection layers wrapping around the semiconductor layers, respectively;
a gate structure over the semiconductive protection layers and wrapping around the semiconductor layers, wherein the gate structure comprises:
an interfacial layer, wherein the interfacial layer is an oxide of the semiconductive protection layers;
a gate dielectric layer over the interfacial layer; and
a gate electrode over the gate dielectric layer; and
source/drain structures on opposite sides of the gate structure.

8. The semiconductor device of claim 7, wherein an oxygen concentration of the gate dielectric layer decreases in a direction from the gate electrode toward the interfacial layer.

9. The semiconductor device of claim 7, wherein the semiconductive protection layers are silicon layers.

10. The semiconductor device of claim 7, further comprising:
an isolation structure over the substrate, wherein the substrate further comprises a base portion protrudes from a top surface of the substrate, the isolation structure laterally surrounding the base portion of the substrate, and wherein one of the semiconductive protection layers covers a top surface of the base portion of the substrate, and the interfacial layer of the gate structure covers the one of the semiconductive protection layers.

11. The semiconductor device of claim 10, wherein the gate dielectric layer of the gate structure is in contact with the isolation structure.

12. The semiconductor device of claim 7, further comprising inner spacers alternating with the semiconductor layers, wherein the semiconductive protection layers and the interfacial layer of the gate structure are in contact with the inner spacers.

13. The semiconductor device of claim 12, wherein the gate dielectric layer of the gate structure is in contact with the inner spacers.

14. The semiconductor device of claim 7, further comprising gate spacers on opposite sidewalls of the gate structure, wherein the interfacial of the gate structure is in contact with the gate spacers.

15. A semiconductor device, comprising:
a substrate;
a semiconductor fin over the substrate;
a shallow trench isolation (STI) structure laterally surrounding the semiconductor fin;
a gate structure over the semiconductor fin, wherein the gate structure comprises:
an interfacial layer;
a gate dielectric layer over the interfacial layer; and
a gate electrode over the gate dielectric layer, the gate dielectric layer having a first portion between the interfacial layer and the gate electrode, and a second portion in contact with the STI structure, wherein the gate dielectric layer has a greater oxygen concentration gradient in the first portion of the gate dielectric layer than in the second portion of the gate dielectric layer; and
source/drain structures on opposite sides of the gate structure.

16. The semiconductor device of claim 15, further comprising a semiconductor layer between the interfacial layer of the gate structure and the semiconductor fin.

17. The semiconductor device of claim 16, wherein the interfacial layer of the gate structure is an oxide of the semiconductor layer.

18. The semiconductor device of claim 15, wherein the silicon layer and the interfacial layer of the gate structure are in contact with the STI structure.

19. The semiconductor device of claim 15, wherein an oxygen concentration of the gate dielectric layer decreases in a direction from the gate electrode toward the interfacial layer.

20. The semiconductor device of claim 15, further comprising gate spacers on opposite sidewalls of the gate structure, wherein a bottom surface of the interfacial layer is higher than bottom surfaces of the gate spacers.

* * * * *